(12) United States Patent
Adamovich et al.

(10) Patent No.: US 9,040,962 B2
(45) Date of Patent: May 26, 2015

(54) DEPOSITING PREMIXED MATERIALS

(75) Inventors: Vadim Adamovich, Yardley, PA (US);
Michael Weaver, Princeton, NJ (US);
Raymond Kwong, Plainsboro, NJ (US);
Chuanjun Xia, Lawrenceville, NJ (US);
Bert Alleyne, Ewing, NJ (US); Takahiro Kai, Chiyoda-ku (JP); Masaki Komori, Chiyoda-ku (JP); Toshihiro Yamamoto, Chiyoda-ku (JP)

(73) Assignees: Universal Display Corporation, Ewing, NJ (US); Nippon Steel & Sumikin Chemical Co., Ltd., Tokyo (JP)

( * ) Notice: Subject to any disclaimer, the term of this patent is extended or adjusted under 35 U.S.C. 154(b) by 218 days.

(21) Appl. No.: 13/640,000

(22) PCT Filed: Apr. 28, 2010

(86) PCT No.: PCT/US2010/001249
§ 371 (c)(1),
(2), (4) Date: Jan. 9, 2013

(87) PCT Pub. No.: WO2011/136755
PCT Pub. Date: Nov. 3, 2011

(65) Prior Publication Data
US 2013/0112952 A1    May 9, 2013

(51) Int. Cl.
*H01L 35/24* (2006.01)
*H01L 51/00* (2006.01)
*C09B 57/00* (2006.01)
*H01L 51/50* (2006.01)

(52) U.S. Cl.
CPC ........ *H01L 51/0071* (2013.01); *H01L 51/0054* (2013.01); *H01L 51/0072* (2013.01); *H01L 51/0073* (2013.01); *H01L 51/0074* (2013.01); *C09B 57/00* (2013.01); *H01L 51/002* (2013.01); *H01L 51/0081* (2013.01); *H01L 51/0085* (2013.01); *H01L 51/5012* (2013.01); *H01L 2251/308* (2013.01)

(58) Field of Classification Search
USPC ............................................ 257/40, E51.001
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 5,247,190 A | 9/1993 | Friend et al. | |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

(Continued)

*Primary Examiner* — Anthony Ho
(74) *Attorney, Agent, or Firm* — Duane Morris LLP

(57) ABSTRACT

A combination of host materials suitable for co-evaporation or premix evaporation, and devices containing the combination of host materials are provided. The combination of host materials provides improved lifetime and efficiency. A method for fabricating devices containing the host material combination is also provided.

20 Claims, 2 Drawing Sheets

(56) References Cited

U.S. PATENT DOCUMENTS

| | | |
|---|---|---|
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,528,187 B1 | 3/2003 | Okada |
| 6,687,266 B1 | 2/2004 | Ma et al. |
| 6,835,469 B2 | 12/2004 | Kwong et al. |
| 6,921,915 B2 | 7/2005 | Takiguchi et al. |
| 7,087,321 B2 | 8/2006 | Kwong et al. |
| 7,090,928 B2 | 8/2006 | Thompson et al. |
| 7,154,114 B2 | 12/2006 | Brooks et al. |
| 7,250,226 B2 | 7/2007 | Tokito et al. |
| 7,279,704 B2 | 10/2007 | Walters et al. |
| 7,332,232 B2 | 2/2008 | Ma et al. |
| 7,338,722 B2 | 3/2008 | Thompson et al. |
| 7,393,599 B2 | 7/2008 | Thompson et al. |
| 7,396,598 B2 | 7/2008 | Takeuchi et al. |
| 7,431,968 B1 | 10/2008 | Shtein et al. |
| 7,445,855 B2 | 11/2008 | Mackenzie et al. |
| 7,534,505 B2 | 5/2009 | Lin et al. |
| 2002/0034656 A1 | 3/2002 | Thompson et al. |
| 2002/0134984 A1 | 9/2002 | Igarashi |
| 2002/0158242 A1 | 10/2002 | Son et al. |
| 2003/0138657 A1 | 7/2003 | Li et al. |
| 2003/0151042 A1 | 8/2003 | Hueschen |
| 2003/0152802 A1 | 8/2003 | Tsuboyama et al. |
| 2003/0175553 A1 | 9/2003 | Thompson et al. |
| 2003/0230980 A1 | 12/2003 | Forrest et al. |
| 2004/0036077 A1 | 2/2004 | Ise |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2005/0025993 A1 | 2/2005 | Thompson et al. |
| 2005/0112407 A1 | 5/2005 | Ogasawara et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0202194 A1 | 9/2006 | Jeong et al. |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0190359 A1 | 8/2007 | Knowles et al. |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0101870 A1 | 4/2009 | Prakash et al. |
| 2009/0108737 A1 | 4/2009 | Kwong et al. |
| 2009/0115316 A1 | 5/2009 | Zheng et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |
| 2010/0072887 A1 | 3/2010 | Kwong et al. |
| 2011/0062862 A1 | 3/2011 | Yamamoto et al. |

FOREIGN PATENT DOCUMENTS

| | | |
|---|---|---|
| EP | 2034538 | 3/2009 |
| JP | 200511610 | 1/2005 |
| JP | 2007123392 | 5/2007 |
| JP | 2007254297 | 10/2007 |
| JP | 2008074939 | 4/2008 |
| WO | 0139234 | 5/2001 |
| WO | 2001039234 | 5/2001 |
| WO | 0202714 | 1/2002 |
| WO | 0215645 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009050290 | 4/2009 |
| WO | 2009021126 | 5/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90:183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 3, 4-6 (1999).

Gao, Zhiciiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 115-20 (2000).

Hamada, Yuji et al., "High Luminance in Organic Electroluminescent Devices with Bis(10-hydroxybenzo[h]quinolinato) beryllium as an Emitter, " Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

(56) References Cited

OTHER PUBLICATIONS

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivates," Adv. Mater, 19:739-743 (2007).

Huang, Wei-Sheng et al., "Highly Phosphorescent Bis-Cyclometalated Iridium Complexes Containing Benzoimidazole-Based Ligands," Chem. Mater, 16(12):2480-2488 (2004).

Hung, L.S. et al., "Anode Modification in Organic Light-Emitting Diodes by Low-Frequency Plasma Polymerization of CHF3," Appl. Phys. Lett, 78(5):673-675 (2001).

Ikai, Masamichi and Tokito, Shizuo, "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1) 162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15)2280-2282 (2000).

Lo, Shih-Chun et al., "Blue Phosphorescence from Iridium(III) Complexes at Room Temperature," Chem. Mater., 18 (21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota,Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based on Silole Derivatives and Their Exciplexes," Organic Electronics, 4:113-121 (2003).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Ranjan, Sudhir et al., "Realizing Green Phosphorescent Light-Emitting Materials from Rhenium(I) Pyrazolato Diimine Complexes," Inorg. Chem., 42(4):1248-1255 (2003).

Sakamoto,Youichi et al., "Synthesis, Characterization, and Electron-Transport Property of Perfluorinated Phenylene Dendrimers," J. Am. Chem. Soc., 122(8):1832-1833 (2000).

Salbeck, J. et al., "Low Molecular Organic Glasses for Blue Electroluminescence," Synthetic Metals, 91209-215 (1997).

Shirota, Yasuhiko et al., "Starburst Molecules Based on p-Electron Systems as Materials for Organic Electroluminescent Devices," Journal of Luminescence, 72-74:985-991 (1997).

Sotoyama, Wataru et al., "Efficient Organic Light-Emitting Diodes with Phosphorescent Platinum Complexes Containing N^C^N-Coordinating Tridentate Ligand," Appl. Phys. Lett., 86:153505-1-153505-3 (2005).

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).

T. Östergård et al., "Langmuir-Blodgett Light-Emitting Diodes of Poly(3-Hexylthiophene) Electro-Optical Characteristics Related to Structure," Synthetic Metals, 87:171-177 (1997).

Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).

Tang, C.W. and VanSlyke, S.A., "Organic Electroluminescent Diodes," Appl. Phys. Lett., 51(12):913-915 (1987).

Tung, Yung-Liang et al., "Organic Light-Emitting Diodes Based on Charge-Neutral Ru II PHosphorescent Emitters," Adv. Mater., 17(8)1059-1064 (2005).

Van Slyke, S. A. et al., "Organic Electroluminescent Devices with Improved Stability," Appl. Phys. Lett, 69 (15):2160-2162 (1996).

Wang, Y. et al., "Highly Efficient Electroluminescent Materials Based on Fluorinated Organometallic Iridium Compounds," Appl. Phys. Lett., 79(4):449-451 (2001).

Wong, Keith Man-Chung et al., A Novel Class of Phosphorescent Gold(III) Alkynyl-Based Organic Light-Emitting Devices with Tunable Colour, Chem. Commun., 2906-2908 (2005).

Wong, Wai-Yeung, "Multifunctional Iridium Complexes Based on Carbazole Modules as Highly Efficient Electrophosphors," Angew. Chem. Int. Ed., 45:7800-7803 (2006).

International Search Report and Written Opinion issued on Jan. 24, 2011 for corresponding PCT Application No. PCT/US2010/001249.

DEPOSITING PREMIXED MATERIALS

This application is a national stage application of, and claims priority to, International Application No. PCT/US2010/001249 filed Apr. 28, 2010, the disclosure of which is hereby expressly incorporated herein by reference in its entirety.

FIELD OF THE INVENTION

The present invention relates to a combination of host materials that may be advantageously used in organic light emitting devices, and methods for fabricating organic light emitting devices that contain the host material combination. More particularly, the combination of host materials may be co-evaporated or premix evaporated to provide devices with improved lifetime and efficiency.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the structure:

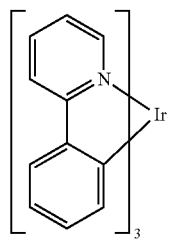

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

An organic composition useful in an organic light emitting device, the composition comprising a mixture of a first compound and a second compound. The first compound has the formula:

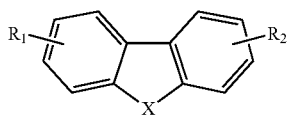

wherein X is Se, S or O, $R_1$ and $R_2$ are substituents independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C\equiv CHC_nH_{2n+1}$, $Ar_1$, $Ar_1-Ar_2$, $C_nH_{2n}-Ar_1$, or no substitution. Each of $R_1$ and $R_2$ may represent mono, di, tri, or tetra substitutions. n is 1, 2, 3, 4, 5, 6, 7, 8, 9, or 10. An and $Ar_2$ are independently selected from the group consisting of benzene, biphenyl, naphthalene, triphenylene, carbazole, and heteroaromatic analogs thereof. At least one of $R_1$ and $R_2$ includes a triphenylene group. The second compound has the formula

wherein Y is an m-valent aromatic hydrocarbon group of 6 to 50 carbon atoms or an m-valent aromatic heterocyclic group of 3 to 50 carbon atoms excluding a group having more than 5 condensed rings. m denotes an integer of 1 to 3. When m is 2 or greater, each Z may be the same or different. Z is represented by formula

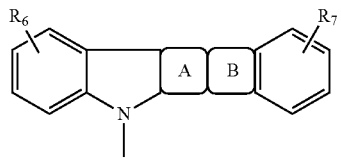

wherein ring A is an aromatic hydrocarbon ring represented by formula

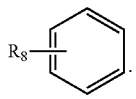

Ring B is a heterocyclic ring represented by formula

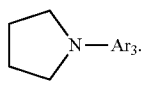

Ring A and B are respectively condensed with the adjacent rings. $R_6$-$R_8$ are each independently selected from hydrogen, an aliphatic hydrocarbon group of 1 to 10 carbon atoms, an aromatic hydrocarbon group of 6 to 18 carbon atoms, or an aromatic heterocyclic group of 3 to 17 carbon atoms. Ara is an aromatic hydrocarbon group of 6 to 50 carbon atoms, or an aromatic heterocyclic group of 3 to 50 carbon atoms excluding a group having more than 5 condensed rings. Also disclosed are organic light emitting devices using the organic composition and a method of making such devices.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
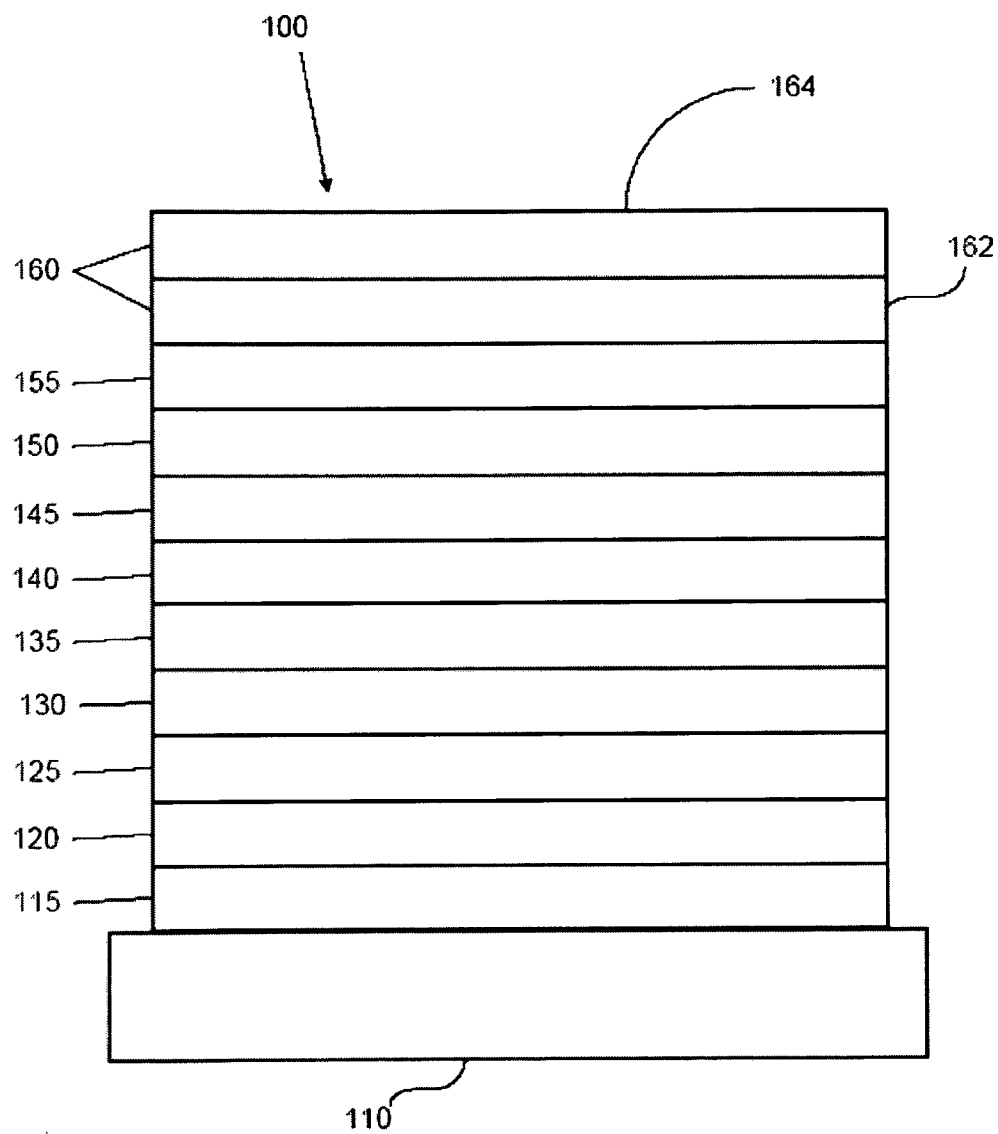
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
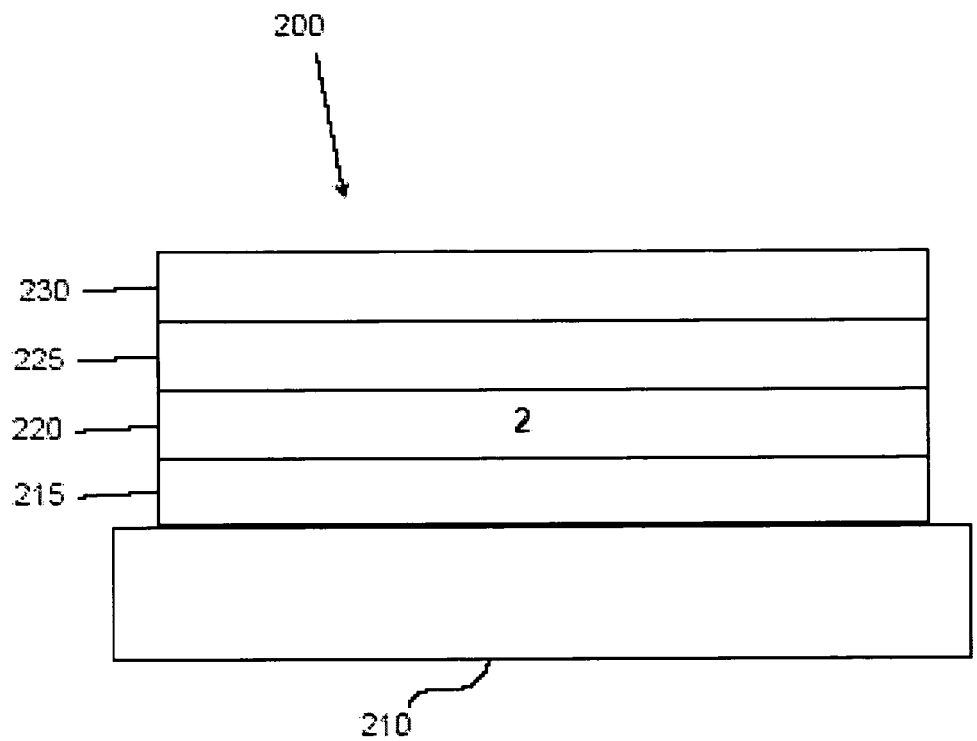
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Here, combining an indolocarbazole derivative with a triphenylene-dibenzoselenophene-containing material, a triphenylene-dibenzothiophene-containing material and/or a triphenylene-dibenzofuran-containing material may be advantageous for use in organic light emitting devices to provide improved performance and improved device fabrication. In particular, the devices containing this combination of materials may demonstrate higher luminous efficiency, lower voltage and longer lifetime, i.e., higher stability. These devices may be fabricated by co-evaporation. Additionally, these device may be fabricated by premix-evaporation with high consistency.

Premixing a host material and an emissive dopant material and evaporating them from a single source has been previously reported in the literature. See, EP1156536. It is also known to select two or more materials that have similar thermal evaporation properties for premix-evaporation. See, e.g., U.S. Pat. No. 5,981,092 and PCT/US2004/002710. However, a novel combination of materials is provided herein that may be suitable for premix-evaporation or co-evaporation. Further, the particular combination of materials disclosed herein may demonstrate improved results by providing a device with lower voltage, higher efficiency, and higher stability compared to a device with either compound alone. Without being bound by theory, it is believed that combining a triphenylene-dibenzoselenophene-containing material, a triphenylene-dibenzothiophene-containing material and/or a triphenylene-dibenzofuran-containing material, i.e., the first compound, with an indolocarbazole derivative, i.e., the second compound, may provide improved charge balance and shift the recombination zone to the middle of the EML, which may improve device lifetime and efficiency. Therefore, it is thought that a combination of the first compound and the second compound may synergistically improve the stability and efficiency of a device containing the combination.

It is desirable to have a convenient and consistent way to evaporate two or more host materials simultaneously. In phosphorescent OLEDs, the emissive layer is often a host:dopant layer. The host significantly impacts the device voltage, efficiency and lifetime. For example, in the same device structure, Host-A:dopant may lead to an undesired higher device voltage and a desired longer lifetime whereas Host-B:dopant may lead to a desired lower device voltage and an undesired shorter lifetime. A device using a doped Host-A:Host-B mixture may typically be expected to result in a voltage and a lifetime that are between the voltages and lifetimes, respectively, of the separate devices containing HostA:dopant and HostB:dopant. It would be desirable if a device using a mixture could have a lower voltage than a device with HostB:dopant and a longer lifetime than a device with HostA:Dopant. In addition, it would be desirable if such a device could also have an improved efficiency compared to devices using only the individual hosts.

When depositing two or more materials, simultaneous evaporation of the individual materials from their own sources is the most commonly used method, which is called co-evaporation hereafter. Co-evaporation control can be difficult and the deposition equipment needs to have more individually controlled and monitored sources. Therefore, it is desirable to evaporate a mixture of materials from a single source by a method known as premix-evaporation.

It is desirable for the mixture to uniformly and consistently evaporate and form a deposited film consisting of the two or more materials in a similar ratio as the mixing ratio in the source. Under high vacuum, where fluids are in the free molecular flow regime, i.e. the mean free path of molecules is much larger than the size of the equipment. The rate of evaporation no longer depends on pressure. That is, because the continuum assumptions of fluid dynamics no longer apply, mass transport is governed by molecular dynamics rather than fluid dynamics. For materials that do not melt during evaporation, direct transition from solid phase to gas phase occurs. When mixing two or more materials and evaporating them from the same source under high vacuum, a number of factors may contribute to the evaporation, such as evaporation temperature of individual materials, miscibility of different materials, and different phase transition. Without being bound by theory, it is believed that the similar evaporation temperature of first material and the second material contribute to the evaporation consistency. For the purposes herein, evaporation temperature is defined as the temperature at which a material can be deposited at a given rate on a substrate under high vacuum. For example, as used herein, the evaporation temperature is the temperature of the organic material source as measured during thermal evaporation with a rate suitable for device fabrication (in the present case ~2-3 Å/s for the host at a pressure~$10^{-7}$-$10^{-8}$ torr). Since the evaporation temperature depends on the molecular weight and intermolecular interactions of the material, derivatives with the same molecular modification will have the same molecular weight difference, and may have similar intermolecular interactions. For example, where a first compound and a second compound can be premixed and evaporated with good consistency, if the first compound is substituted with a phenyl group and the second compound is also substituted with a phenyl group, the molecular weight added to the first compound and the second compound is 77 atomic mass units (amu). In addition, if the phenyl group induces similar molecular interactions for the first compound and the second compound, the evaporation temperatures of the first compound with phenyl substitution and the second compound with phenyl substitution may be similar and their mixture may also be suitable for premix-evaporation. Additionally, the first compound and the second compound may behave similarly even if the conditions in the evaporation chamber are different.

It is also desirable that premix-evaporation results in similar device performance and lifetime compared to co-evaporation of the materials. Therefore, premixing two or more host materials in one evaporation source can provide uniform and consistent evaporation of the two or more materials to form a deposited layer consisting of the 2 or more materials in a ratio similar to the premixing ratio.

A first device comprising an organic light emitting device is provided. The organic light emitting device further comprises a first electrode, a second electrode, and a first organic layer, disposed between the first electrode and the second electrode, wherein the first organic layer comprises an organic composition. The organic composition comprises a first compound and a second compound.

The first compound has the formula:

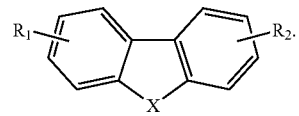

X is Se, S or O. $R_1$ and $R_2$ are substituents independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C\equiv CHC_nH_{2n+1}$, $Ar_1$, $Ar_1$-$Ar_2$, $C_nH_{2n}-Ar_1$, or no substitution. Each of $R_1$ and $R_2$ may represent mono, di, tri, or tetra substitutions. n is 1, 2, 3, 4, 5, 6, 7, 8, 9, or 10. $Ar_1$ and $Ar_2$ are independently selected from the group consisting of benzene, biphenyl, naphthalene, triphenylene, carbazole, and heteroaromatic analogs thereof. At least one of $R_1$ and $R_2$ includes a triphenylene group.

The second compound is represented by the following general formula (1)

(1)

wherein
Y is an m-valent aromatic hydrocarbon group of 6 to 50 carbon atoms or an m-valent aromatic heterocyclic group of 3 to 50 carbon atoms excluding a group having more than 5 condensed rings.
m denotes an integer of 1 to 3, such that when m is greater than 2, each Z may be the same or different
Z is represented by formula (1a):

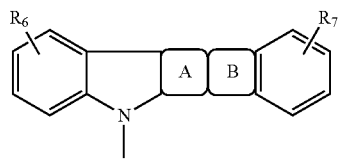
(1a)

wherein
ring A is an aromatic hydrocarbon ring represented by formula (1b)

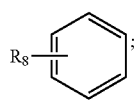
(1b)

ring B is a heterocyclic ring represented by formula (1c)

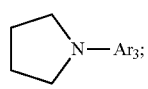
(1c)

ring A and B are respectively condensed with the adjacent rings;
$R_6$-$R_8$ are each independently selected from hydrogen, an aliphatic hydrocarbon group of 1 to 10 carbon atoms, an aromatic hydrocarbon group of 6 to 18 carbon atoms, or an aromatic heterocyclic group of 3 to 17 carbon atoms; and,
$Ar_3$ is an aromatic hydrocarbon group of 6 to 50 carbon atoms, or an aromatic heterocyclic group of 3 to 50 carbon atoms excluding a group having more than 5 condensed rings.
In Formula 1, examples of Y and $Ar_3$ include benzene, naphthalene, anthracene, pyridine, pyrazine, pyrimidine, pyridajine, triazine, isoindole, indazole, purine, isoquinoline, imidazole, naphthyridine, Phthalazine, quinazoline, quinoxaline, cinnoline, quinoline, pteridine, phenanthridine, acridine, perimidine, phenanthroline, phenazine, carboline, indole, benzoxazole, benzothiazole, carbazole, dibenzofuran, dibenzothiophene, and may arbitrarily connect two or more these groups. Further, in Formula 1, Y is an m-valent group and $Ar_3$ is a monovalent group.

In one aspect, the first compound has the formula:

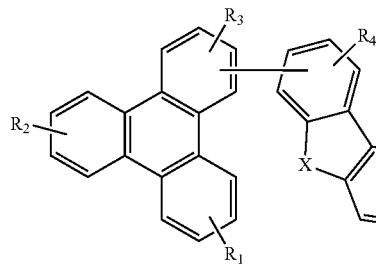

X is Se, S or O. Each of $R_1$, $R_2$, $R_3$, $R_4$, and $R_5$ may represent mono, di, tri, or tetra substitutions. $R_1$, $R_2$, $R_3$, $R_4$, and $R_5$ are independently selected from the group consisting of hydrogen, halogen, alkyl, alkoxy, amino, alkenyl, alkynyl, aryl and heteroaryl. The second compound is represented by the following general formula (2)

(2)

wherein
Y' is an m-valent aromatic hydrocarbon group of 6 to 40 carbon atoms or an m-valent aromatic heterocyclic group of 3 to 40 carbon atoms excluding a group having more than 5 condensed rings;
m denotes an integer of 1 or 2, and when m=2, each Z may be the same or different;
Z is represented by formula (2a):

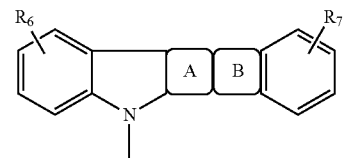
(2a)

wherein
ring A is an aromatic hydrocarbon ring represented by formula (2b):

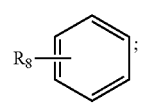
(2b)

ring B is an heterocyclic ring represented by formula (2c),

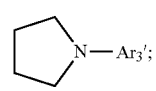
(2c)

ring A and B are respectively condensed with the adjacent rings;
$R_6$-$R_8$ are each independently selected from hydrogen, an aliphatic hydrocarbon group of 1 to 10 carbon atoms, an aromatic hydrocarbon group of 6 to 18 carbon atoms, or an aromatic heterocyclic group of 3 to 17 carbon atoms;

Ar$_3$' is an aromatic hydrocarbon group of 6 to 40 carbon atoms, or an aromatic heterocyclic group of 3 to 40 carbon atoms excluding a group having more than 5 condensed rings.

Examples of Y' or Ar$_3$' in Formula 2 include benzene, naphthalene, anthracene, pyridine, pyrazine, pyrimidine, pyridajine, triazine, isoindole, indazole, purine, isoquinoline, imidazole, naphthyridine, phthalazine, quinazoline, quinoxaline, cinnoline, quinoline, pteridine, phenanthridine, acridine, perimidine, phenanthroline, phenazine, carboline, indole, benzoxazole, benzothiazole, carbazole, dibenzofuran, dibenzothiophene, and may arbitrarily connect two or more these groups. Further, in formula 2, Y' is an m-valent group and Ar$_3$ is a monovalent group.

Preferably, the first compound has the formula:

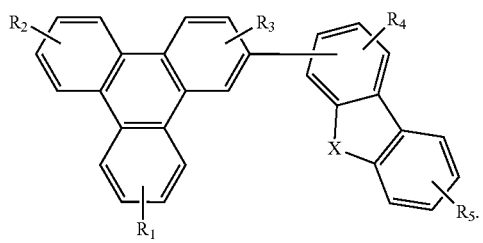

X is Se, S or O. Each of R$_1$, R$_2$, R$_3$, R$_4$, and R$_5$ may represent mono, di, tri, or tetra substitutions. R$_1$, R$_2$, R$_3$, R$_4$, and R$_5$ are independently selected from the group consisting of hydrogen, halogen, alkyl, alkoxy, amino, alkenyl, alkynyl, aryl and heteroaryl. The second compound is represented by the following general formula (3)

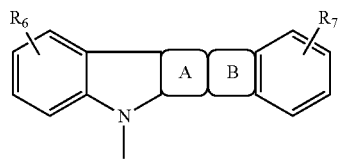

(3a)

wherein
ring A is an aromatic hydrocarbon ring represented by formula (3 b),

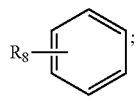

(3b)

ring B is an heterocyclic ring represented by formula (3 c),

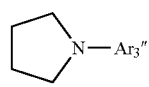

(3c)

ring A and B are respectively condensed with the adjacent rings;

R$_6$, R$_7$, R$_8$ are each independently selected from hydrogen, an aliphatic hydrocarbon group of 1 to 10 carbon atoms, an aromatic hydrocarbon group of 6 to 18 carbon atoms, or an aromatic heterocyclic group of 3 to 17 carbon atoms; and, Ar$_3$" is an aromatic hydrocarbon group of 6 to 30 carbon atoms, or an aromatic heterocyclic group of 3 to 30 carbon atoms excluding a group having more than 5 condensed rings.

In Formula 3, examples of Y" include pyridine, pyrazine, pyrimidine, pyridajine, triazine, isoindole, indazole, purine, isoquinoline, imidazole, naphthyridine, Phthalazine, quinazoline, quinoxaline, cinnoline, quinoline, pteridine, phenanthridine, acridine, perimidine, phenanthroline, phenazine, carboline, indole, benzoxazole, benzothiazole, carbazole, dibenzofuran, dibenzothiophene, and may arbitrarily connect two or more these groups. Further, in Formula 3, examples of Ar$_3$" include benzene, naphthalene, anthracene, pyridine, pyrazine, pyrimidine, pyridajine, triazine, isoindole, indazole, purine, isoquinoline, imidazole, naphthyridine, Phthalazine, quinazoline, quinoxaline, cinnoline, quinoline, pteridine, phenanthridine, acridine, perimidine, phenanthroline, phenazine, carboline, indole, benzoxazole, benzothiazole, carbazole, dibenzofuran, dibenzothiophene, and may arbitrarily connect two or more these groups. Further, Y" is an m-valent group, Ar$_3$" is a monovalent group.

More preferably, the first compound is selected from the group consisting of

H1

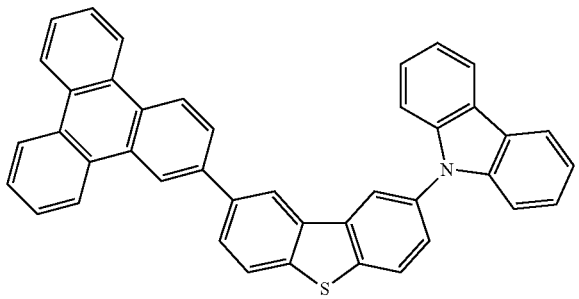

H2

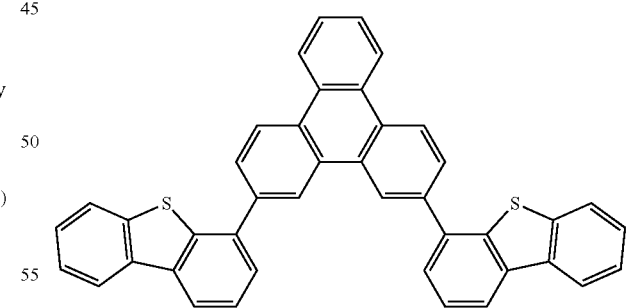

H4

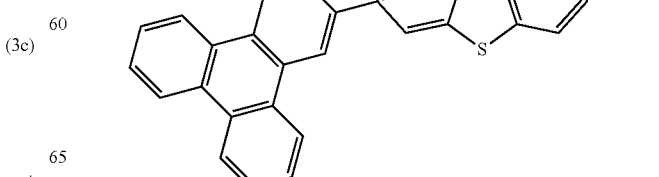

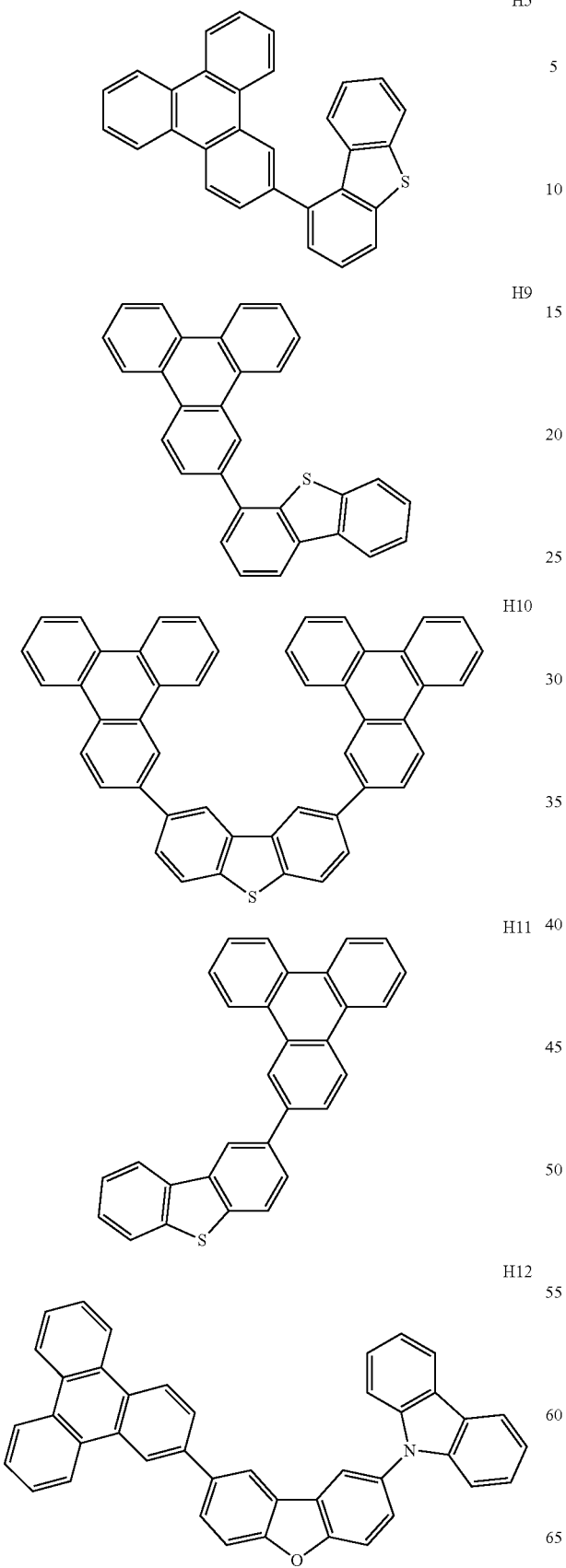
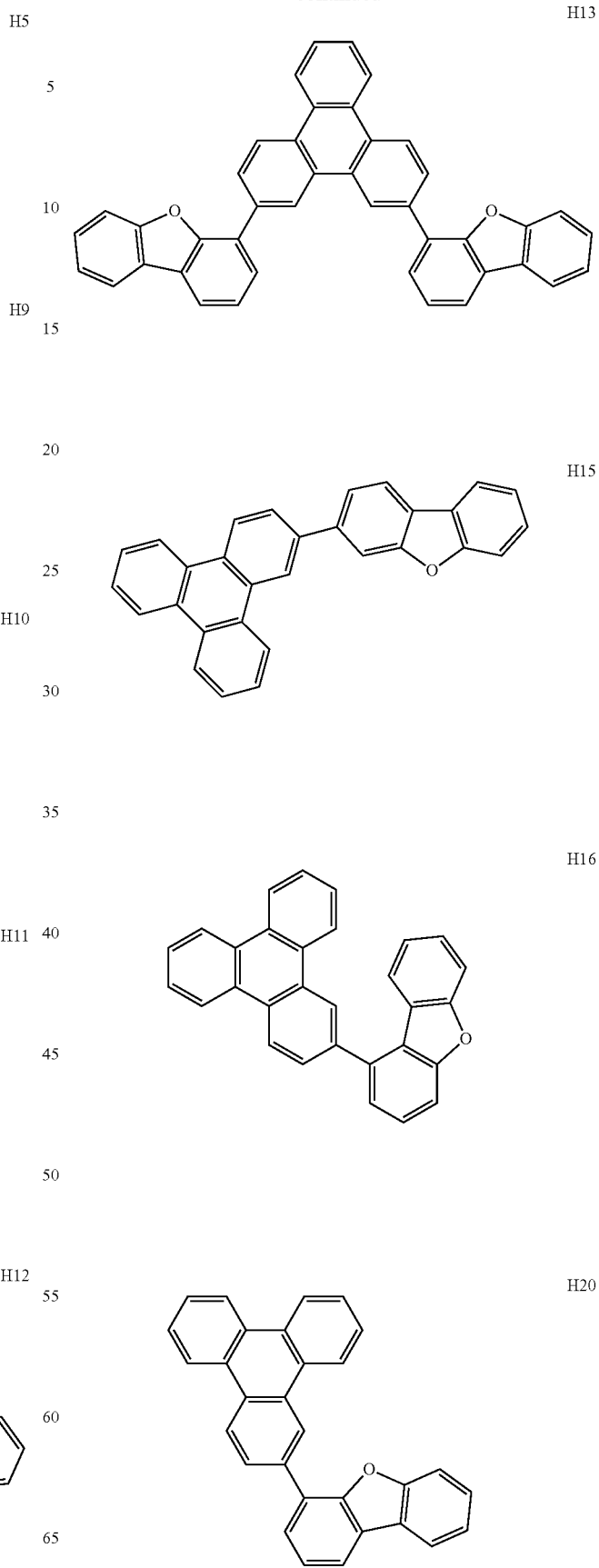

-continued
H21
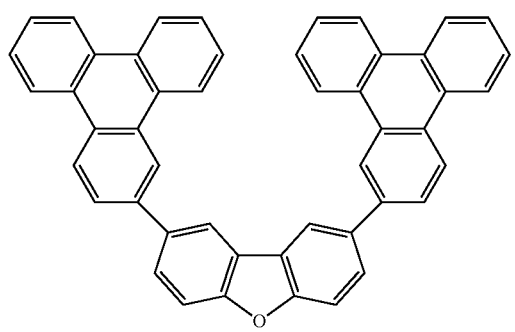
H22
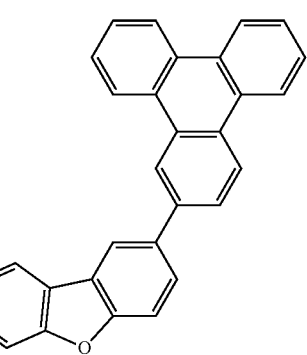
H23
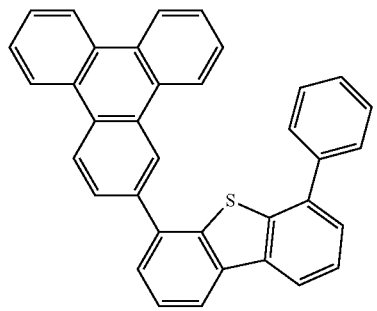
-continued
H25
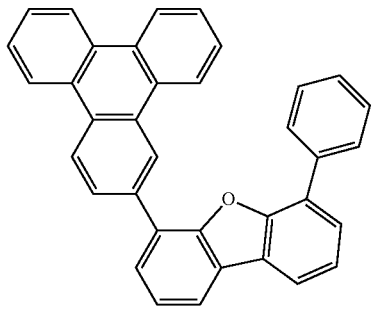
H30
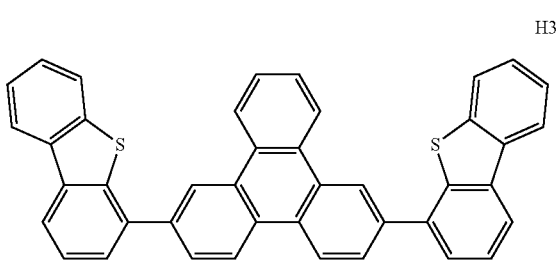
H35
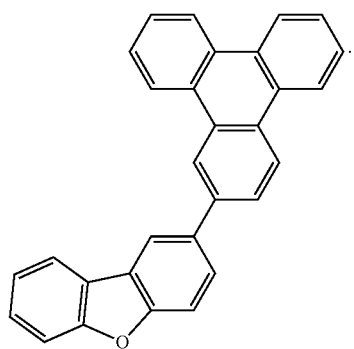
More preferably, the second compound is selected from the group consisting of:
H201
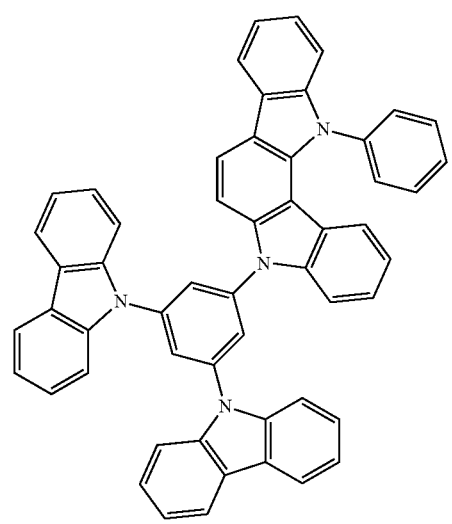
H202
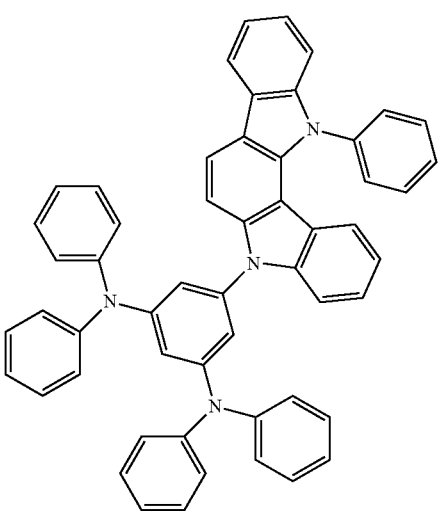

-continued
H203
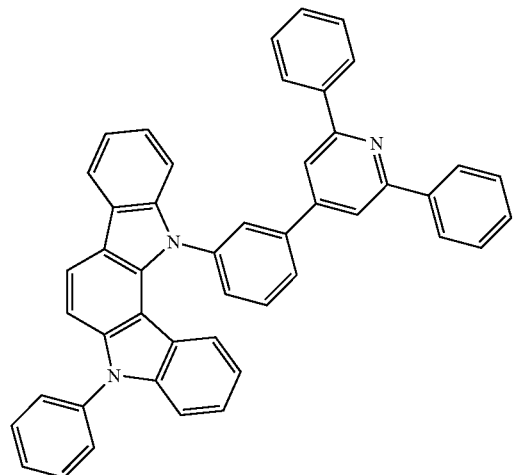
H204
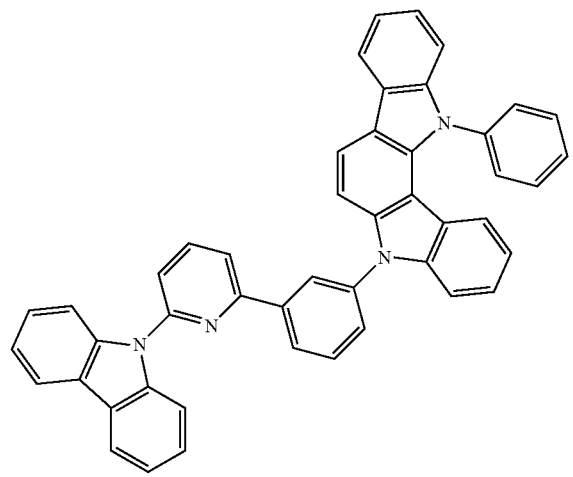
H205
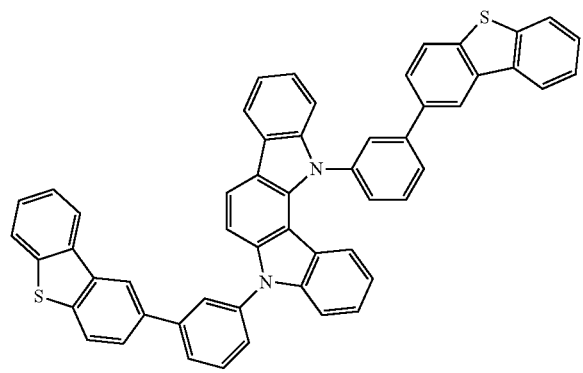
H206
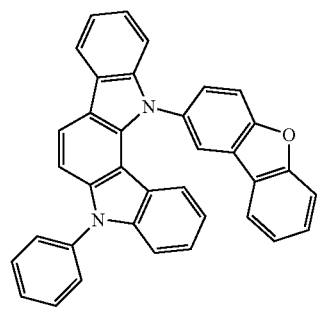
H207
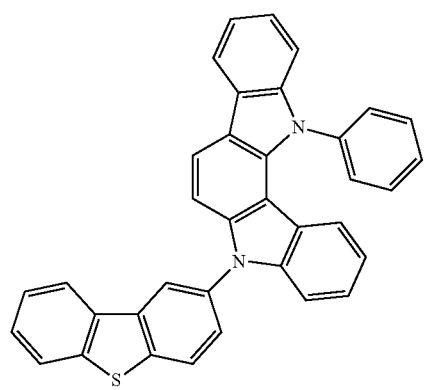
H208
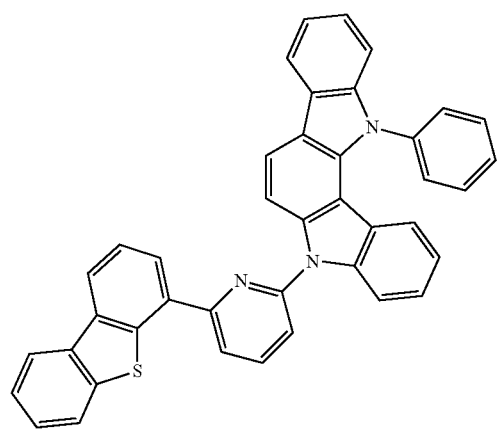

-continued
H209
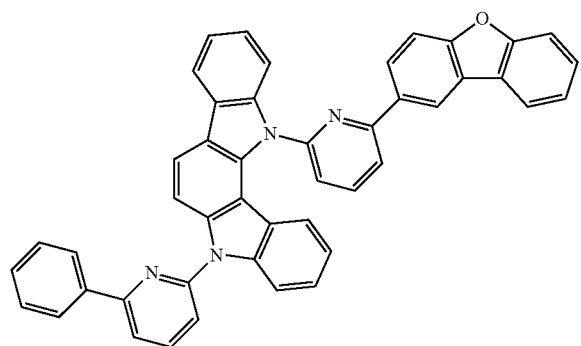
H210
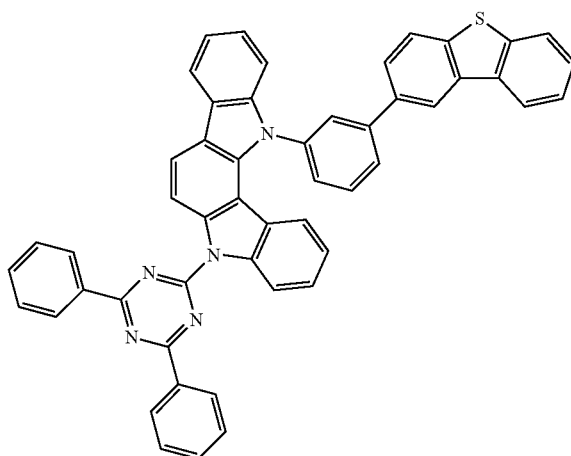
H211
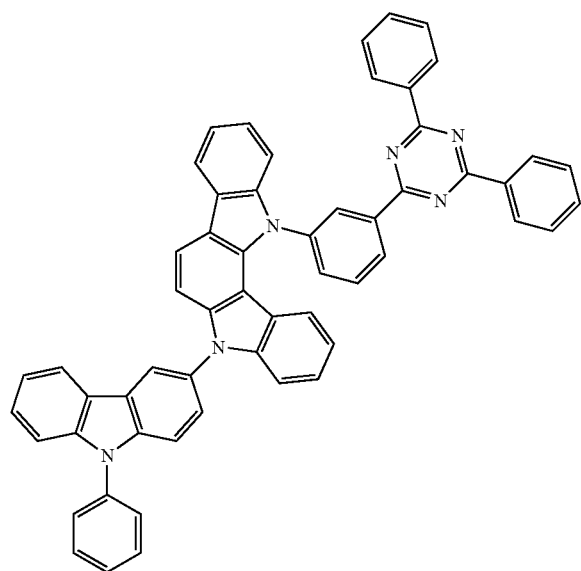
H212
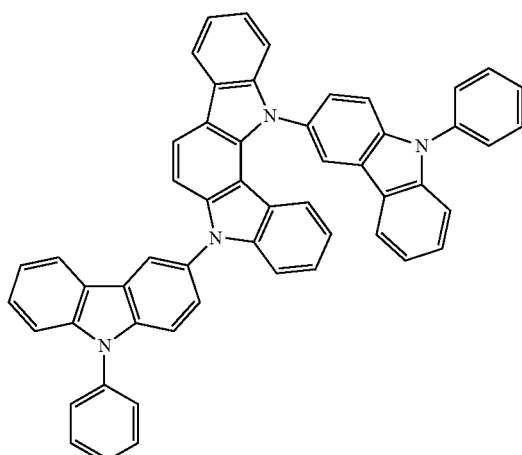
H213
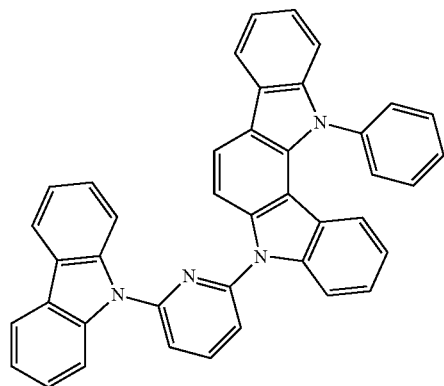
H214
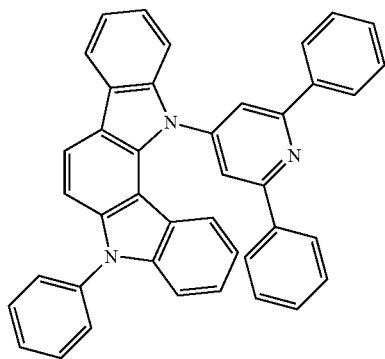

-continued
H215
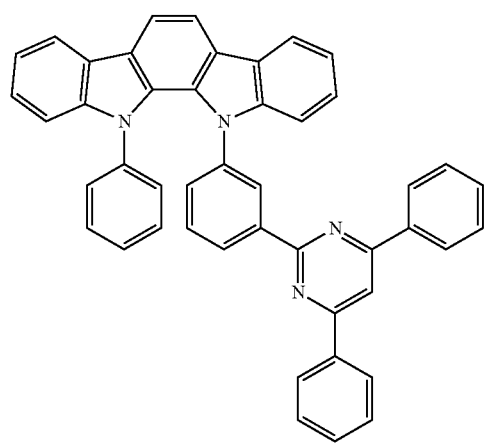
H216
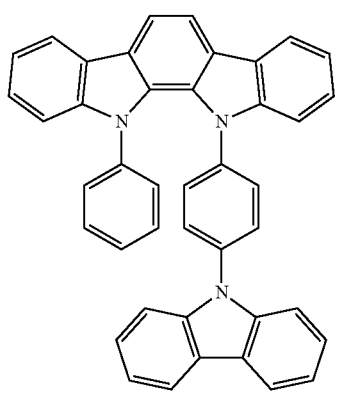
H217
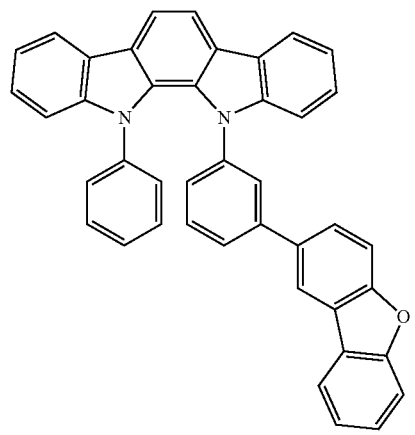
H218
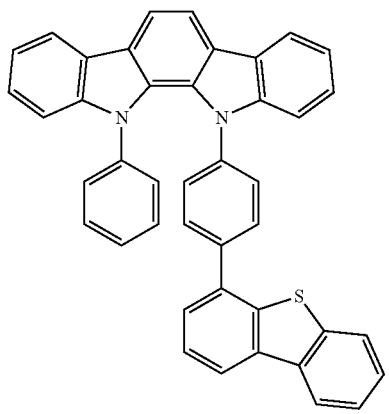
H219
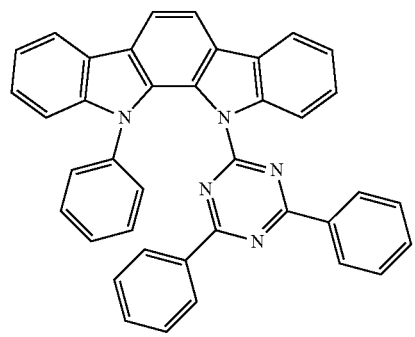
H220
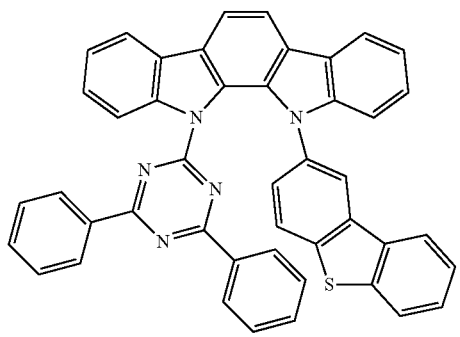
H221
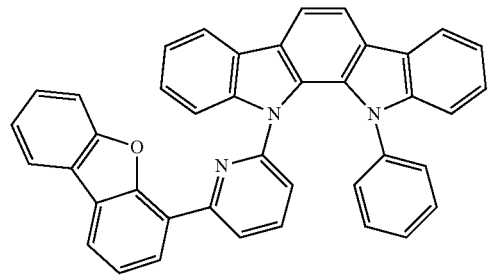
H222
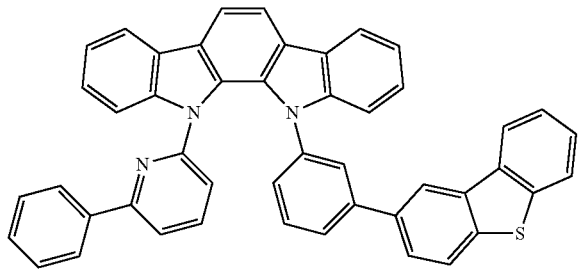

-continued
H223
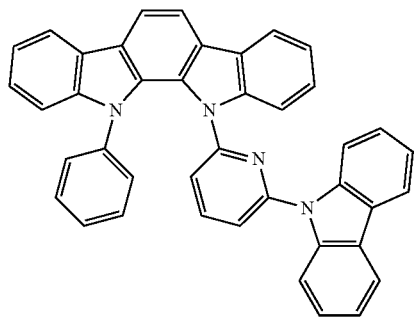
H224
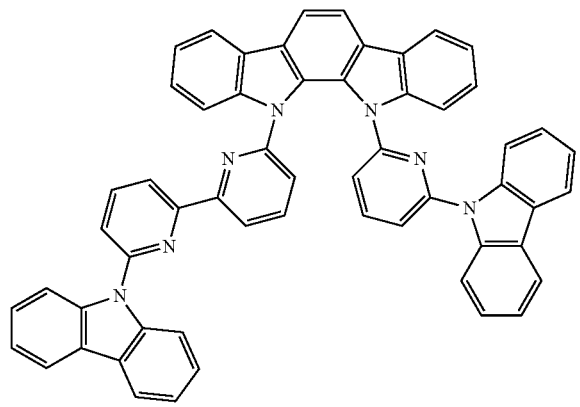
H225
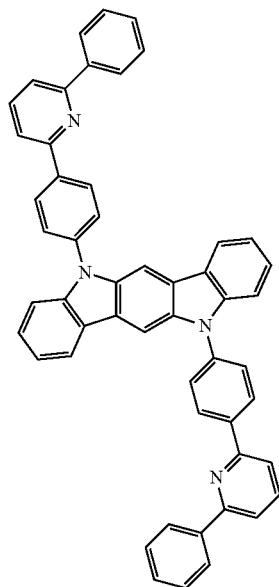
H226
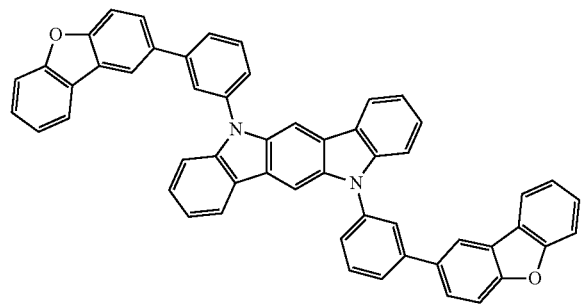
H227
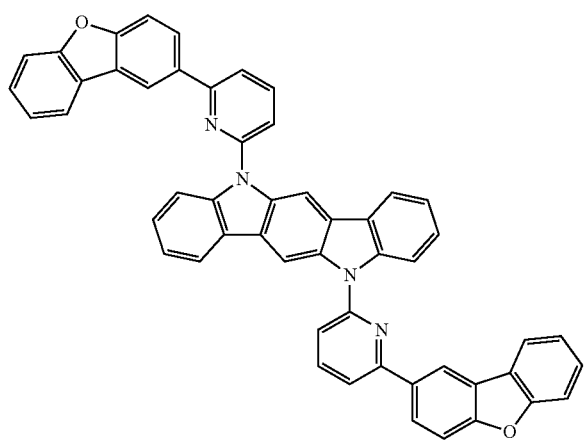
H228
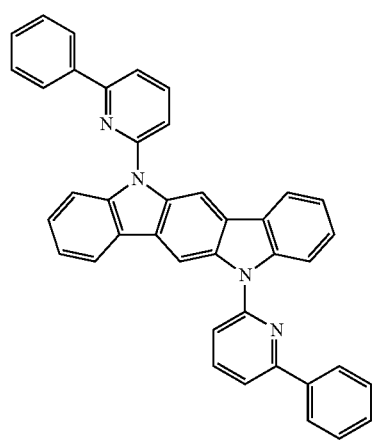

H229
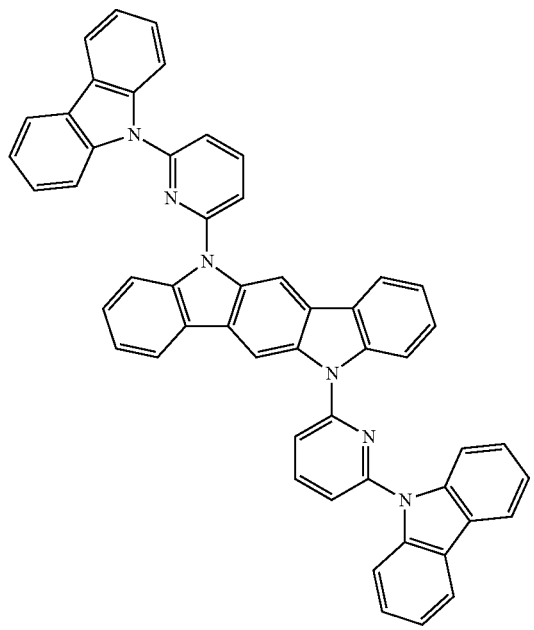
H230
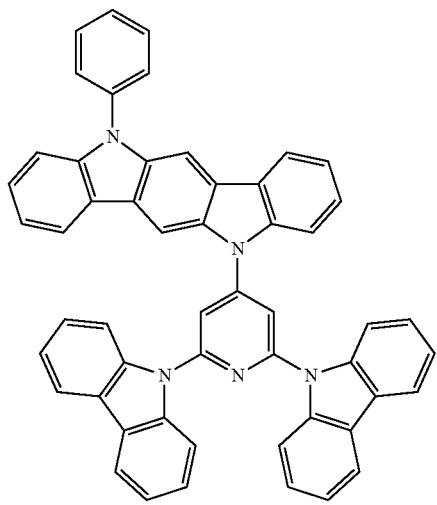
H231
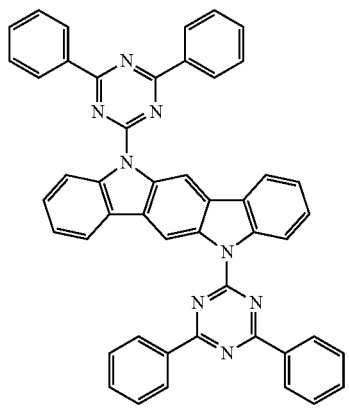
H232
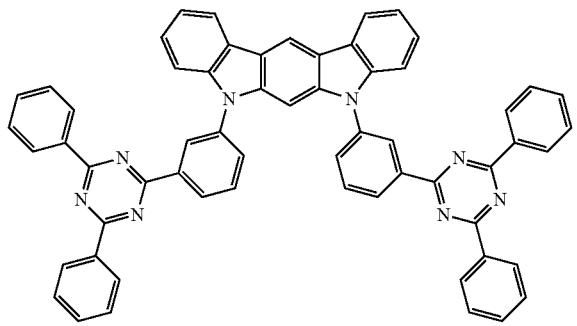
H233
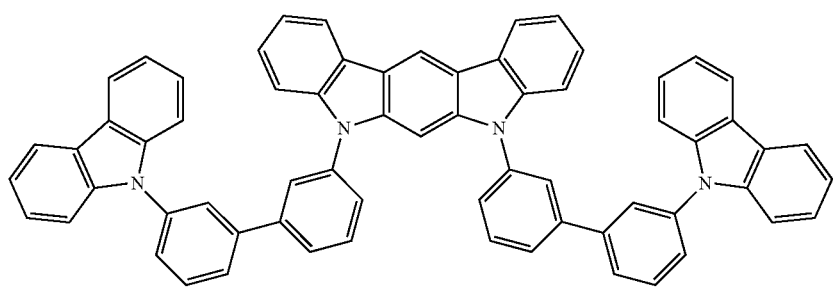

-continued
H234
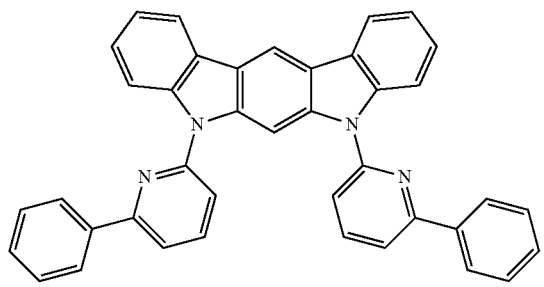
H235
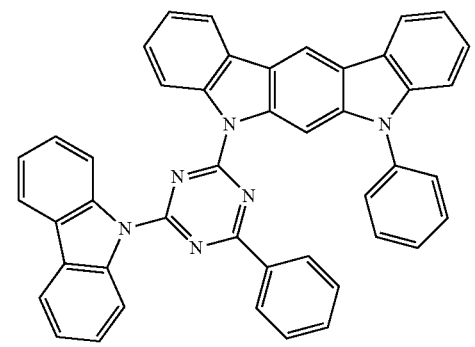
H236
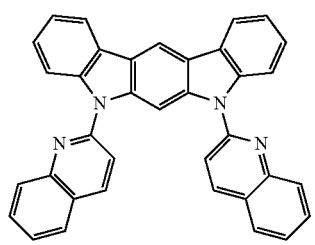
H237
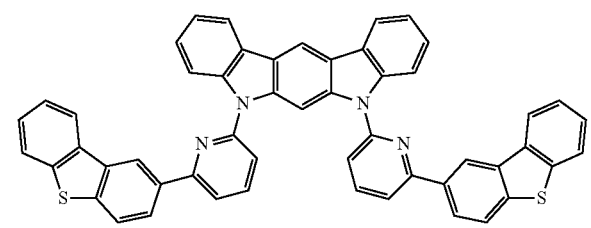
H238
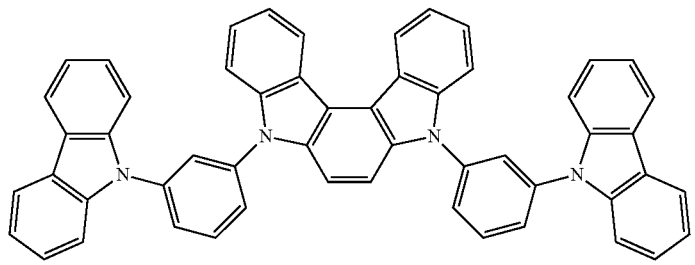
H239
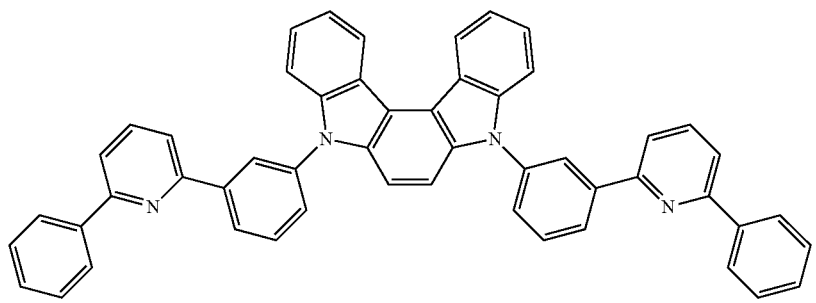
H240
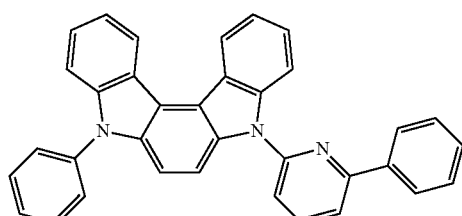
H241
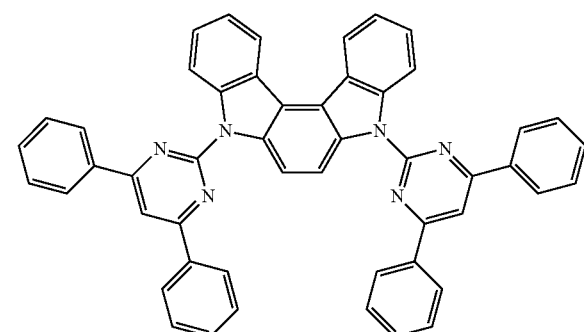

H242
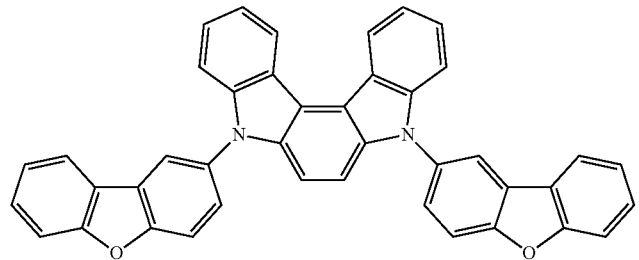
H243
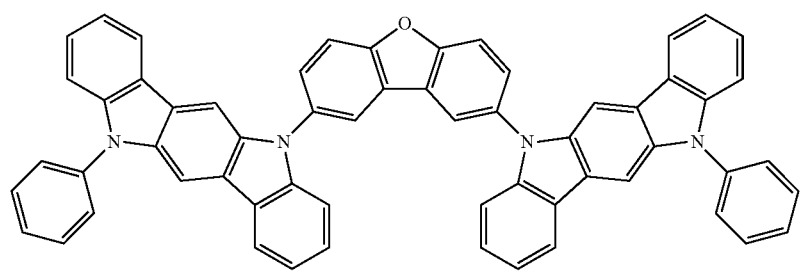
H244
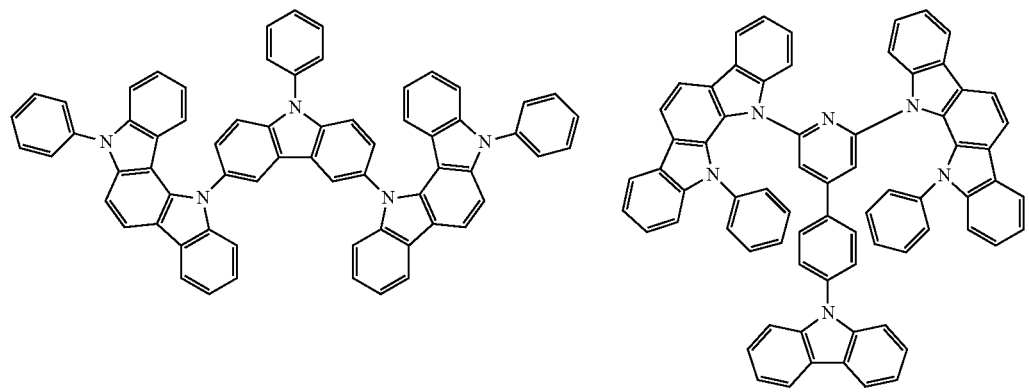
H245
H246
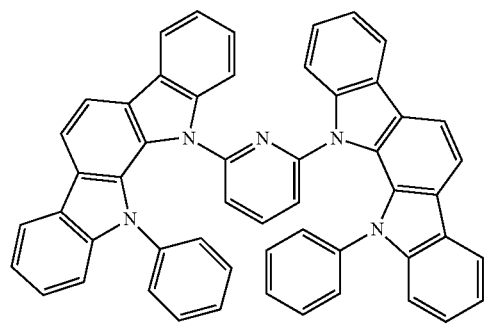
H247
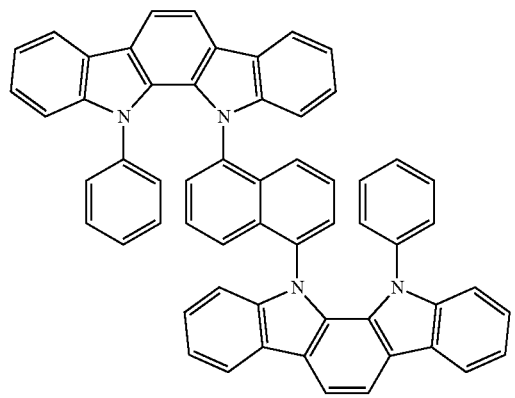

-continued
H248
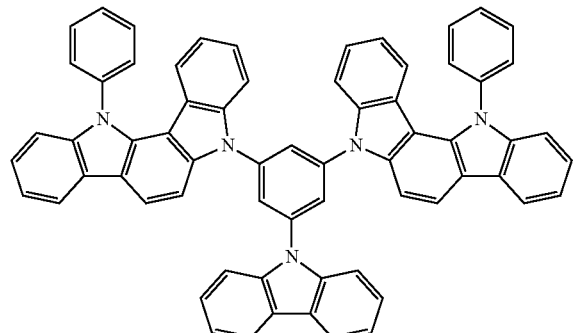
H249
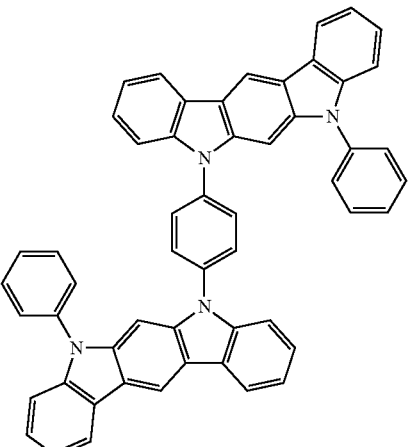
H250
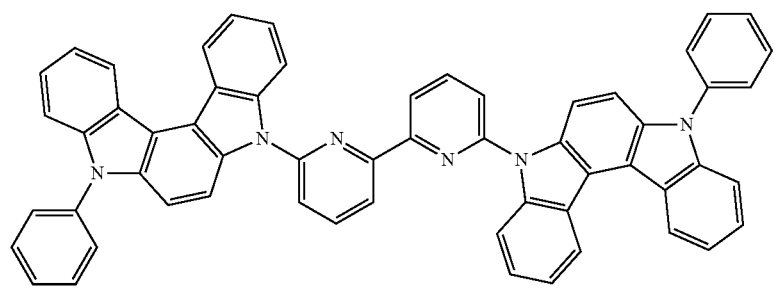
H251
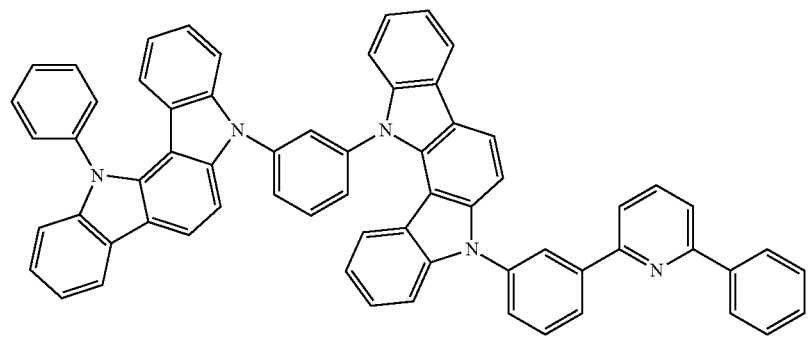
H252
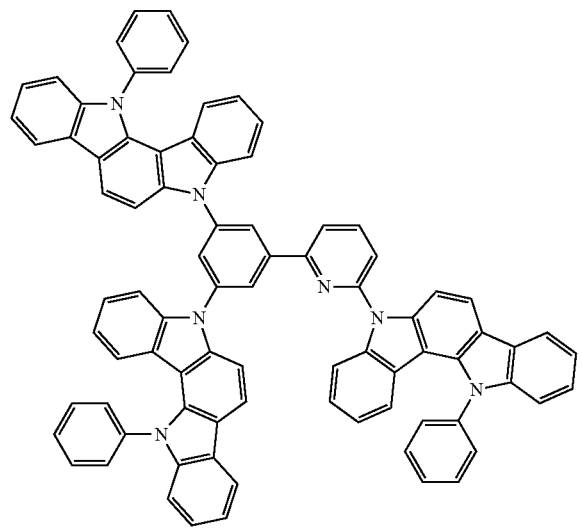
H253
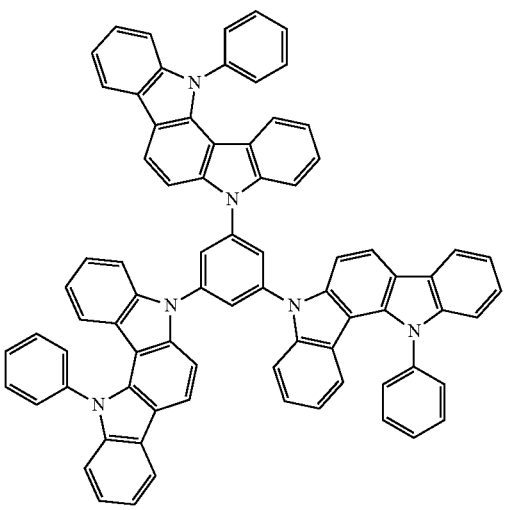

In a particular aspect, the set of non-hydrogen substituents selected for $R_1$, $R_2$, $R_3$, $R_4$, and $R_5$, and the set of non-hydrogen substituents selected for $R_6$, $R_7$, $R_8$ are the same. As discussed above, derivatives of the first compound and the second compound with the same molecular modification will have the same molecular weight difference, and may have similar intermolecular interactions. Therefore, the first compound and the second compound having the same substituents may be suitable for premixing.

In another aspect, the first compound has the formula:

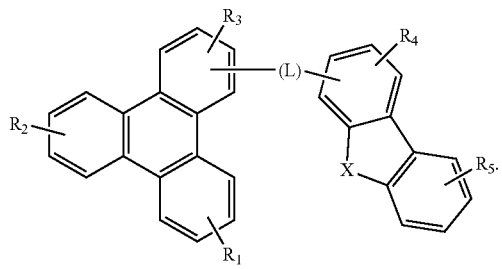

X is Se, S or O. Each of $R_1$, $R_2$, $R_3$, $R_4$, and $R_5$ may represent mono, di, tri, or tetra substitutions. $R_1$, $R_2$, $R_3$, $R_4$, and $R_5$ are independently selected from the group consisting of hydrogen, halogen, alkyl, alkoxy, amino, alkenyl, alkynyl, aryl and heteroaryl. L is selected from the group consisting of benzene, biphenyl, naphthalene, triphenylene, carbazole, and heteroaromatic analogs thereof. The second compound has the formula (2):

 (2)

wherein
Y' is an m-valent aromatic hydrocarbon group of 6 to 40 carbon atoms or an m-valent aromatic heterocyclic group of 3 to 40 carbon atoms excluding a group having more than 5 condensed rings;
m denotes an integer of 1 or 2, and when m=2, each Z may be the same or different;
Z is represented by formula (2a):

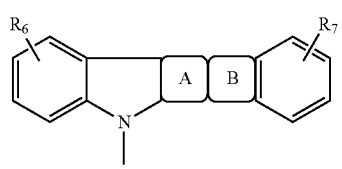 (2a)

wherein ring A is an aromatic hydrocarbon ring represented by formula (2b),

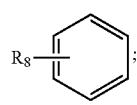 (2b)

ring B is an heterocyclic ring represented by formula (2c),

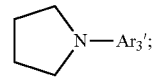 (2c)

ring A and B are respectively condensed with the adjacent rings;
$R_6$-$R_8$ are each independently selected from hydrogen, an aliphatic hydrocarbon group of 1 to 10 carbon atoms, an aromatic hydrocarbon group of 6 to 18 carbon atoms, or an aromatic heterocyclic group of 3 to 17 carbon atoms; and,
$Ar_3'$ is an aromatic hydrocarbon group of 6 to 40 carbon atoms, or an aromatic heterocyclic group of 3 to 40 carbon atoms excluding a group having more than 5 condensed rings.

In Formula 2, examples of Y' and $Ar_3'$ include benzene, naphthalene, anthracene, pyridine, pyrazine, pyrimidine, pyridajine, triazine, isoindole, indazole, purine, isoquinoline, imidazole, naphthyridine, Phthalazine, quinazoline, quinoxaline, cinnoline, quinoline, pteridine, phenanthridine, acridine, perimidine, phenanthroline, phenazine, carboline, indole, benzoxazole, benzothiazole, carbazole, dibenzofuran, dibenzothiophene, and may arbitrarily connect two or more these groups. Further, Y' is an m-valent group, $Ar_3'$ is a monovalent group.

Preferably, the first compound has the formula:

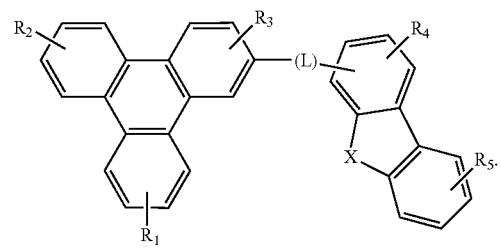

X is Se, S or O. Each of $R_1$, $R_2$, $R_3$, $R_4$ and $R_5$ may represent mono, di, tri, or tetra substitutions. $R_1$, $R_2$, $R_3$, $R_4$ and $R_5$ are independently selected from the group consisting of hydrogen, halogen, alkyl, alkoxy, amino, alkenyl, alkynyl, aryl and heteroaryl. The second compound has the formula (3):

 (3)

wherein
Y" is an aromatic heterocyclic group of 3 to 30 carbon atoms excluding a group having more than 5=condensed rings;
m denote an integer of 1.
Z is a represented by formula (3a)

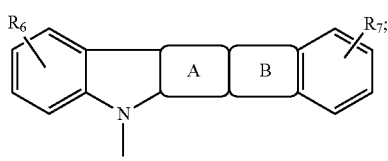 (3a)

ring A is an aromatic hydrocarbon ring represented by formula (3b)

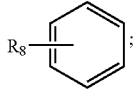
(3b)

ring B is an heterocyclic ring represented by formula (3c)

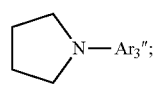
(3c)

ring A and ring B are respectively condensed with the adjacent rings;

$R_6$, $R_7$, $R_8$ are each independently selected from hydrogen, an aliphatic hydrocarbon group of 1 to 10 carbon atoms, an aromatic hydrocarbon group of 6 to 18 carbon atoms, or an aromatic heterocyclic group of 3 to 17 carbon atoms;

$Ar_3''$ is an aromatic hydrocarbon group of 6 to 30 carbon atoms, or an aromatic heterocyclic group of 3 to 30 carbon atoms excluding a group having more than 5 condensed rings.

In Formula 3, examples of Y" include pyridine, pyrazine, pyrimidine, pyridajine, triazine, isoindole, indazole, purine, isoquinoline, imidazole, naphthyridine, Phthalazine, quinazoline, quinoxaline, cinnoline, quinoline, pteridine, phenanthridine, acridine, perimidine, phenanthroline, phenazine, carboline, indole, benzoxazole, benzothiazole, carbazole, dibenzofuran, dibenzothiophene, and may arbitrarily connect two or more these groups. Further, in Formula 3, examples of $Ar_3''$ include benzene, naphthalene, anthracene, pyridine, pyrazine, pyrimidine, pyridajine, triazine, isoindole, indazole, purine, isoquinoline, imidazole, naphthyridine, Phthalazine, quinazoline, quinoxaline, cinnoline, quinoline, pteridine, phenanthridine, acridine, perimidine, phenanthroline, phenazine, carboline, indole, benzoxazole, benzothiazole, carbazole, dibenzofuran, dibenzothiophene, and may arbitrarily connect two or more these groups. Further in Formula 3, Y" is an m-valent group, $Ar_3''$ is a monovalent group.

More preferably, the first compound is selected from the group consisting of

H3
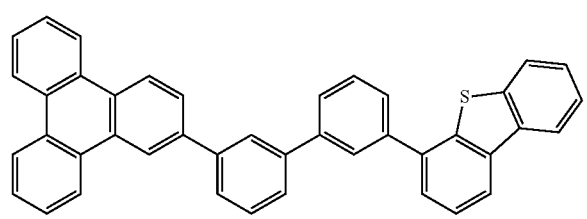

H6
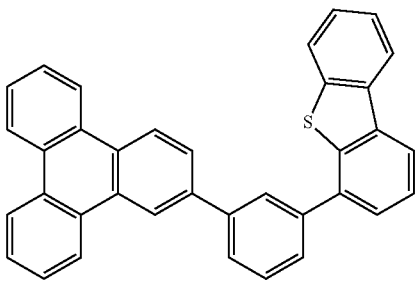

H7
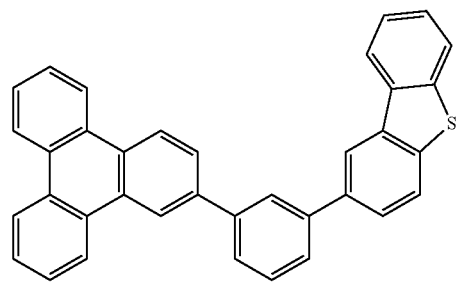

H8
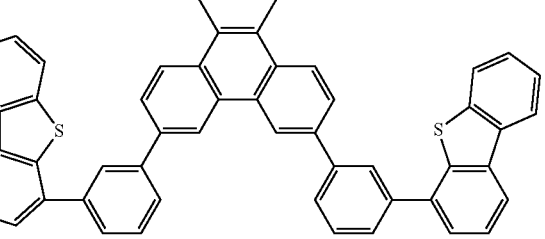

H14
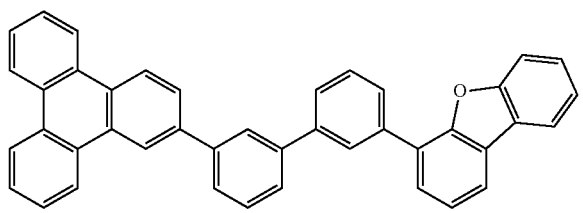

H17
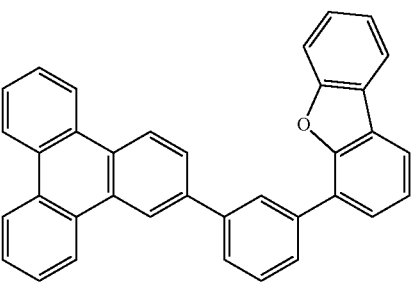

H18
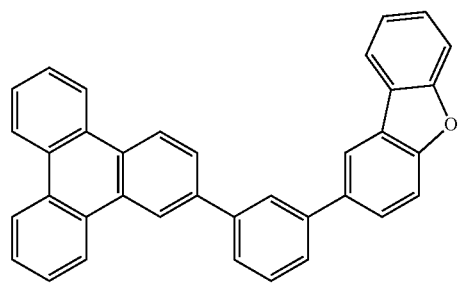
H19
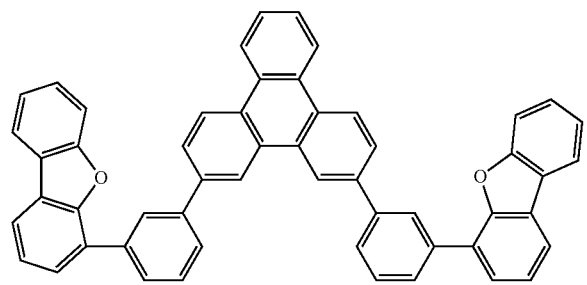
H24
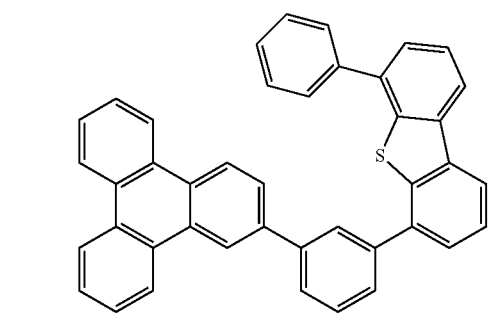
H26
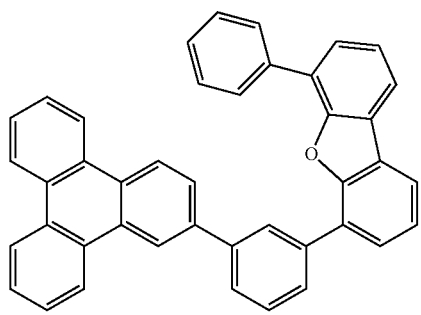
H27
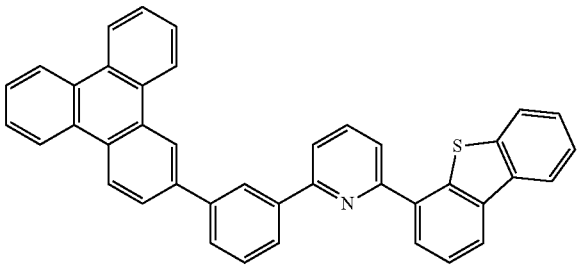
H28
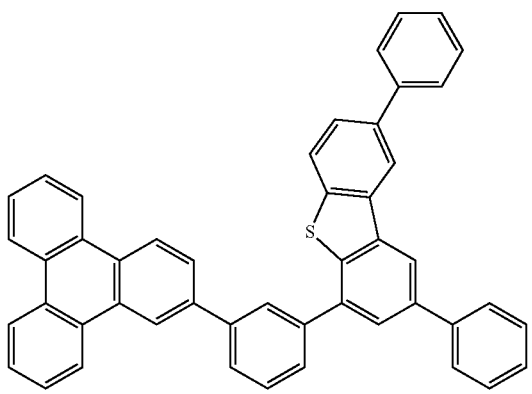
H29
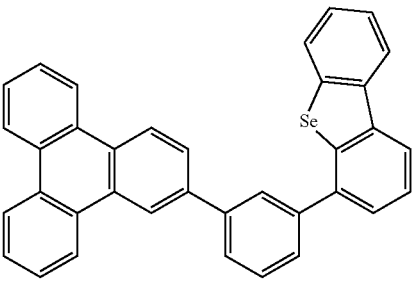
H31
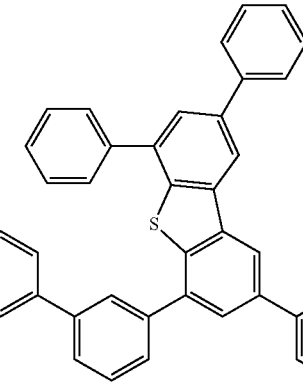

H32
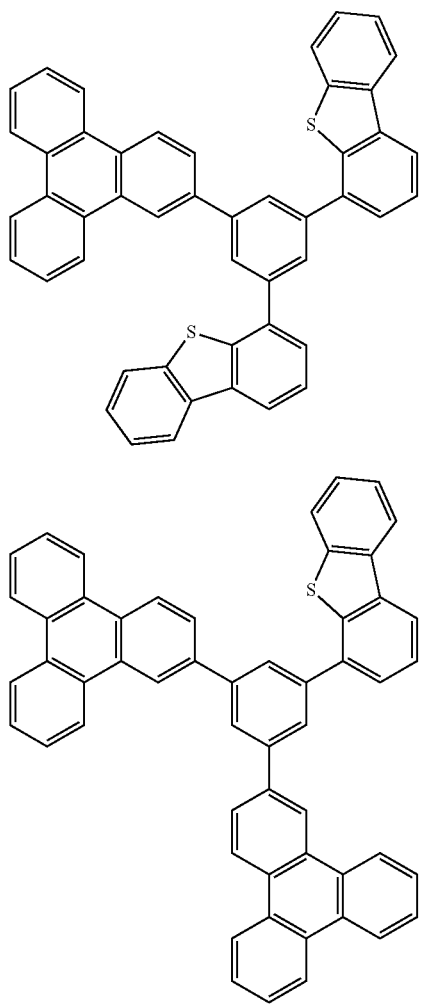
H33
H34
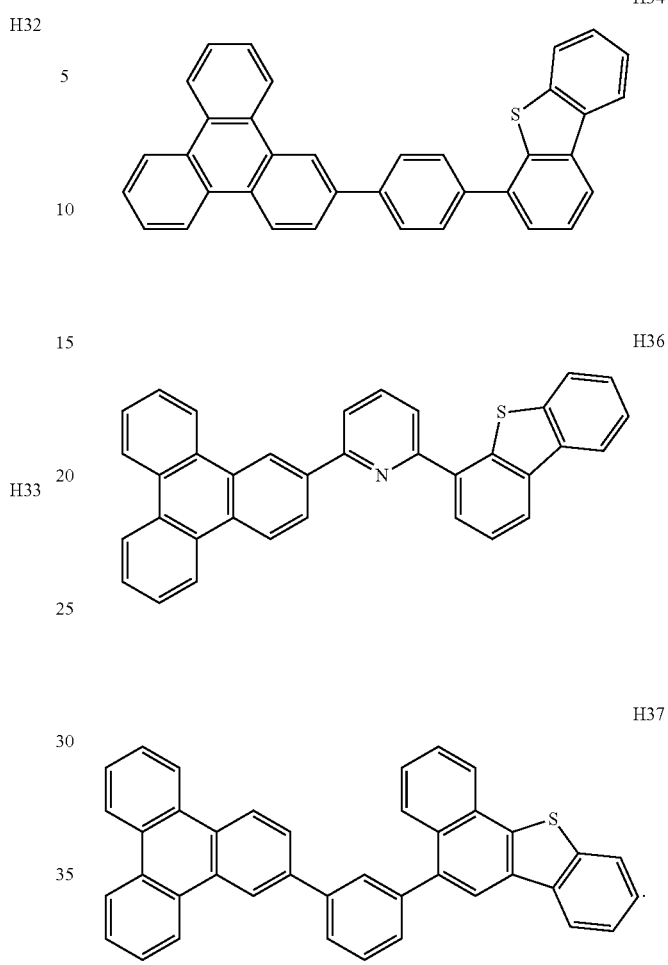
H36
H37
More preferably, the second compound is selected from the group consisting of
H201
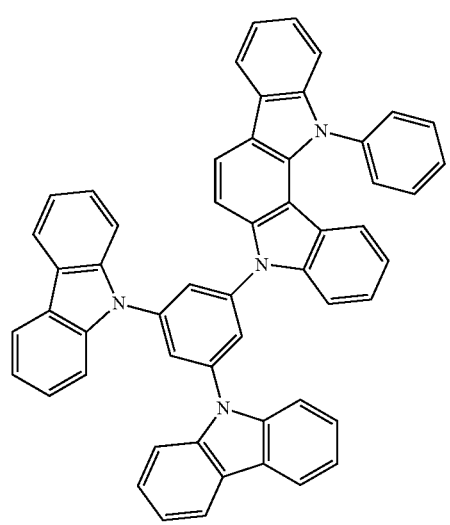
H202
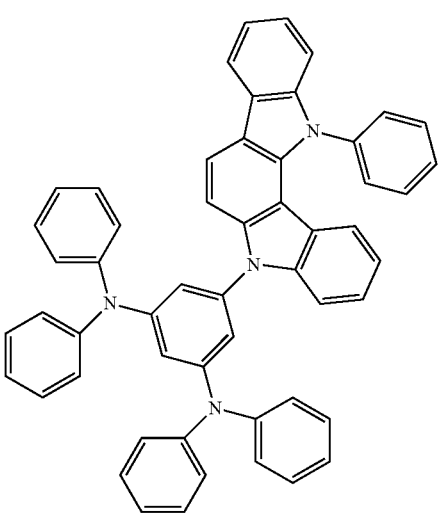

-continued
H203
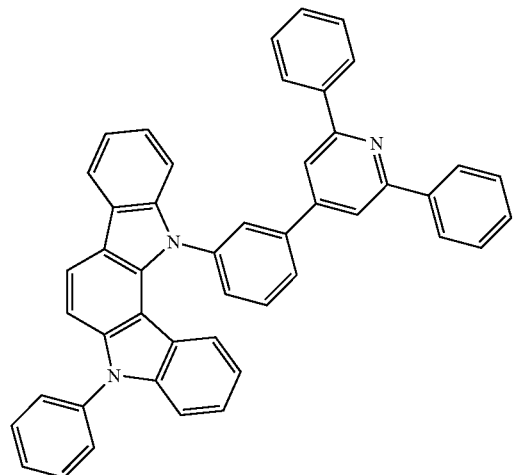
H204
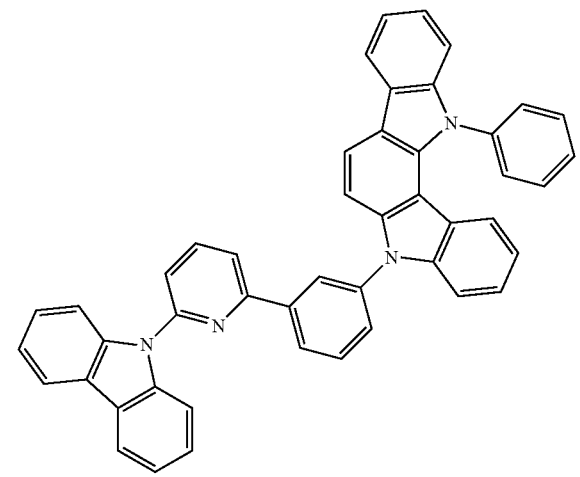
H205
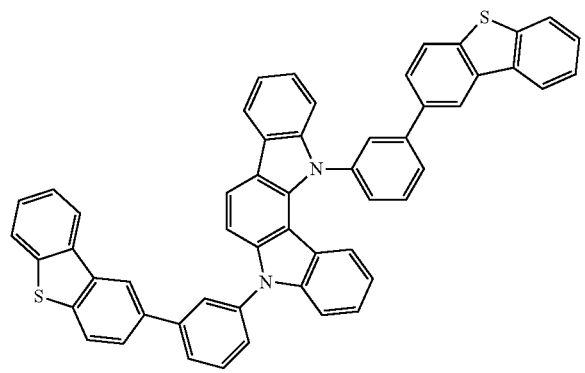
H206
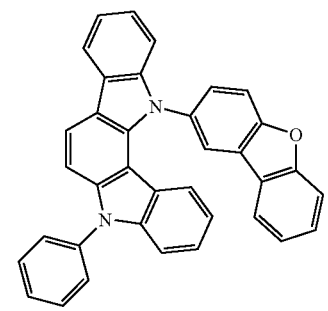
H207
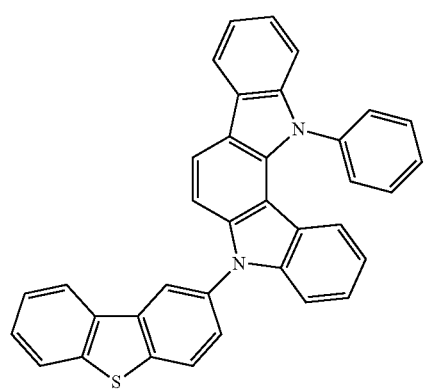
H208
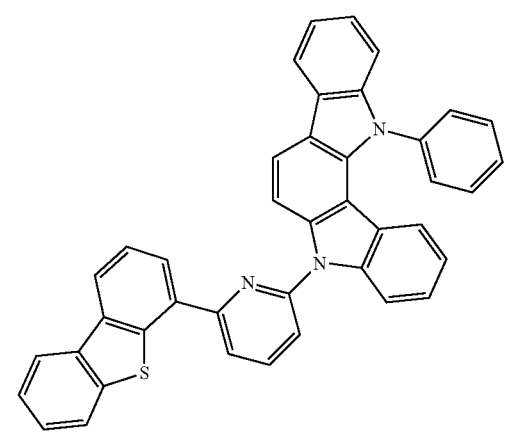

-continued
H209
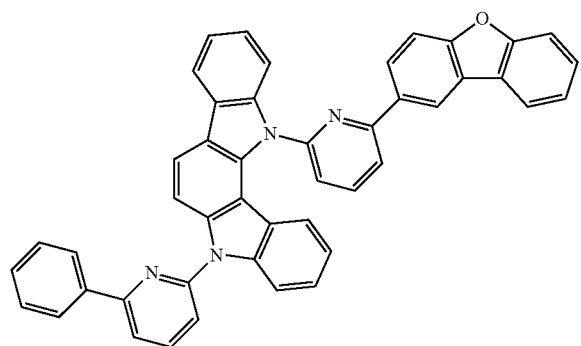
H210
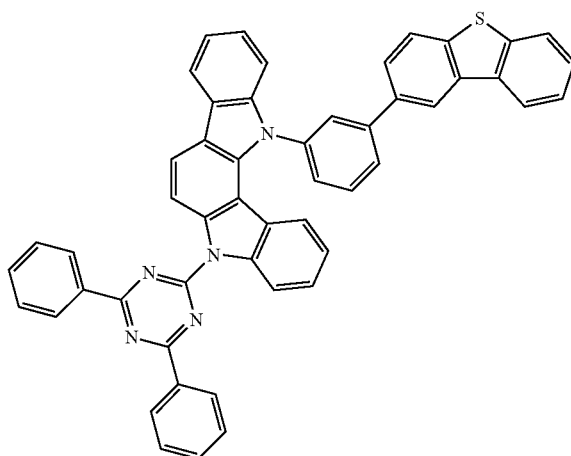
H211
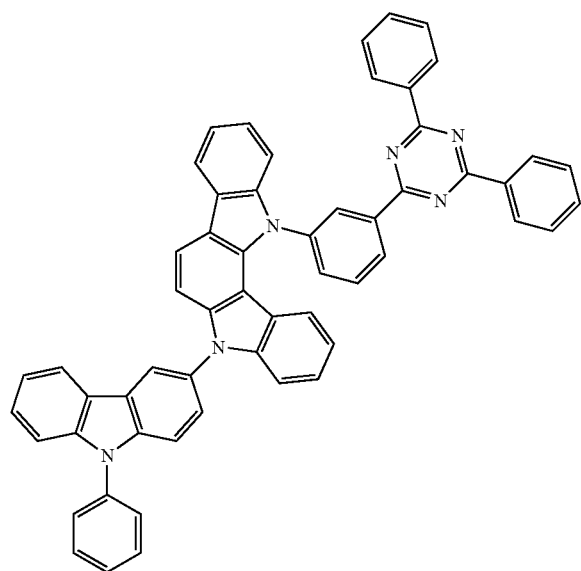
H212
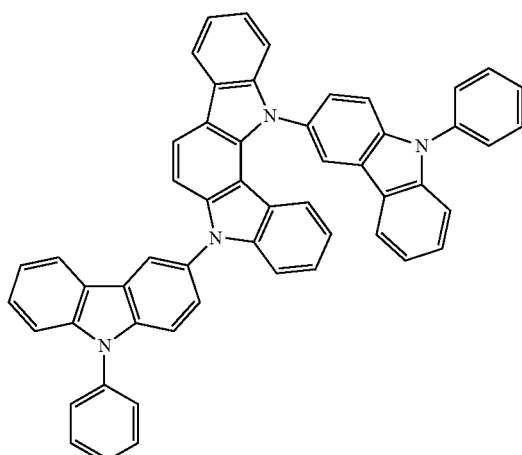
H213
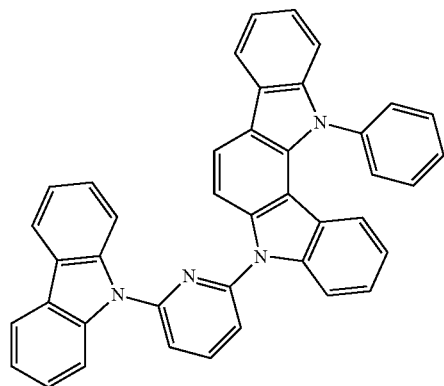
H214
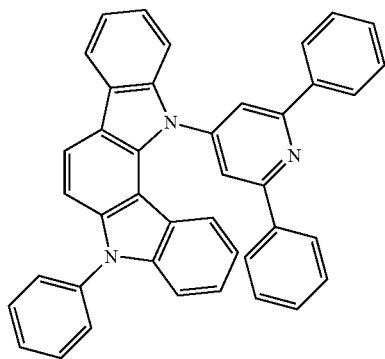

-continued
H215
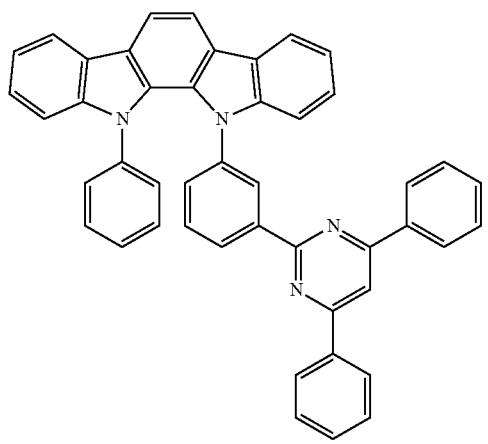
H216
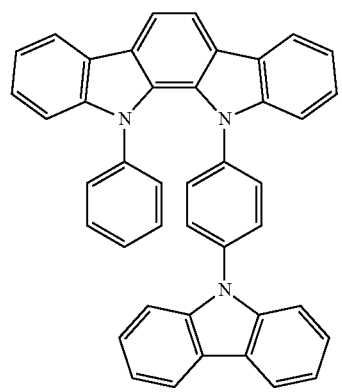
H217
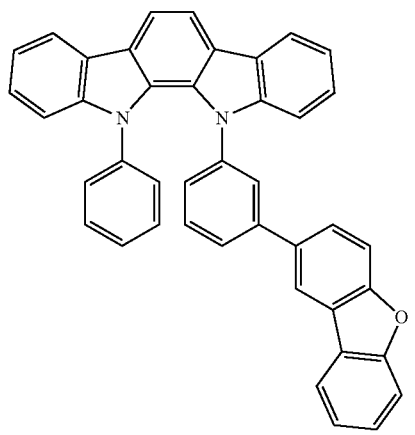
H218
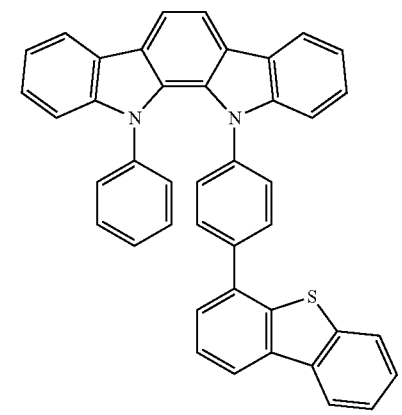
H219
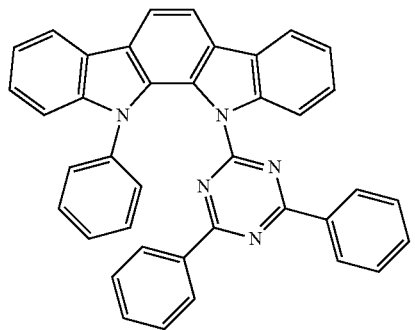
H220
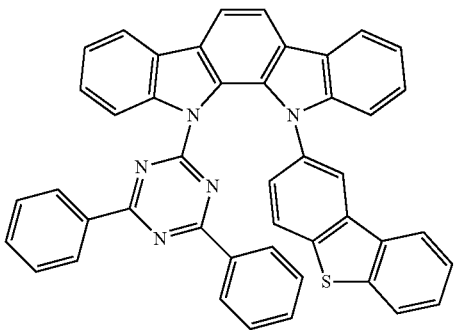
H221
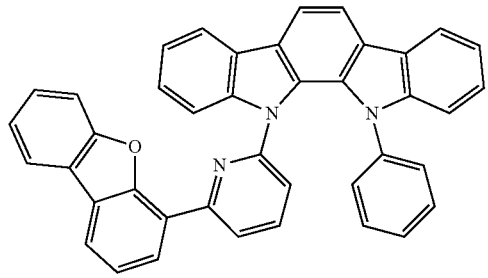
H222
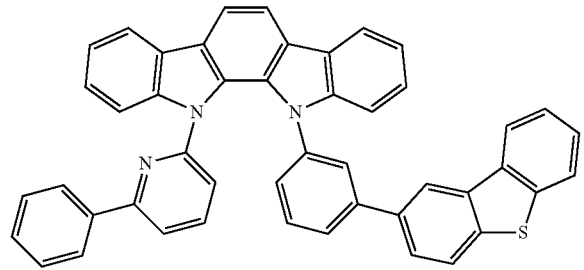

-continued
H223
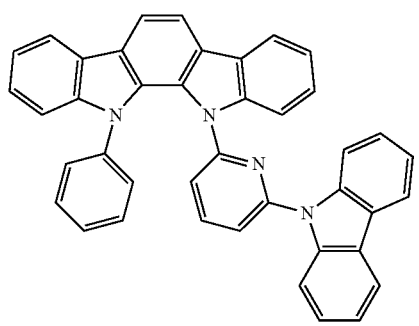
H224
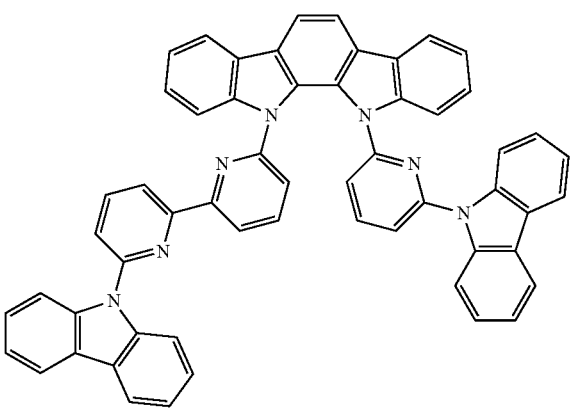
H225
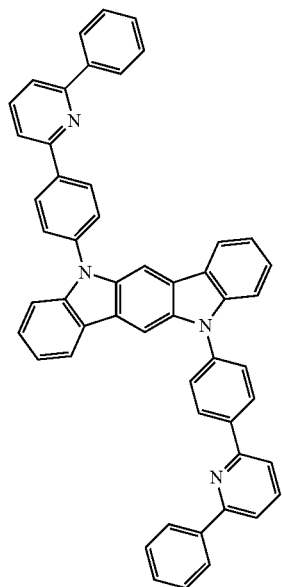
H226
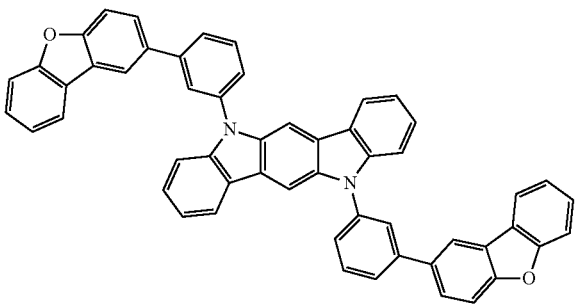
H227
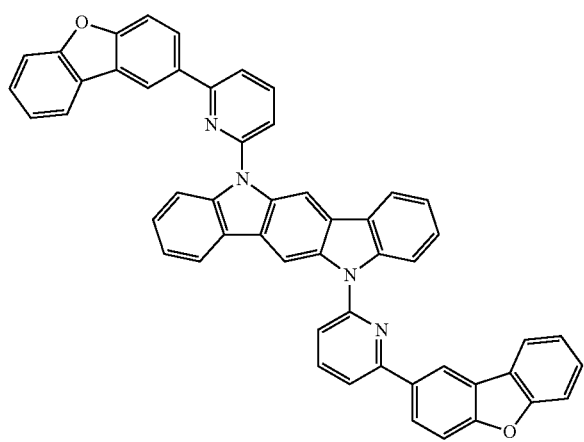
H228
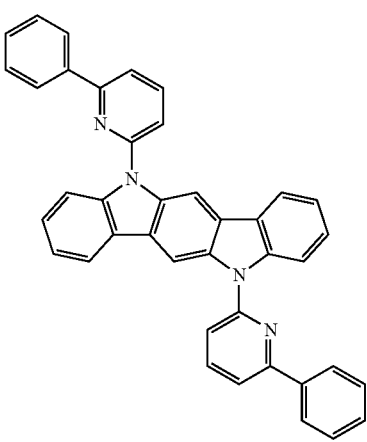

-continued
H229
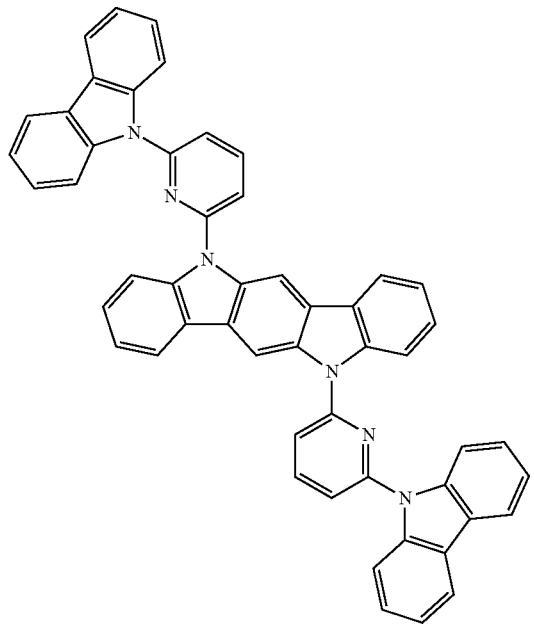
H230
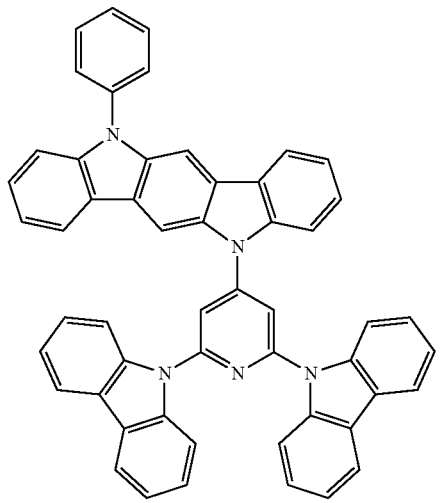
H231
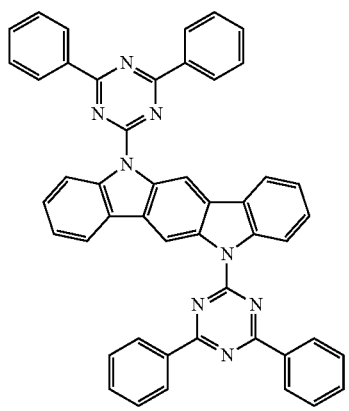
H232
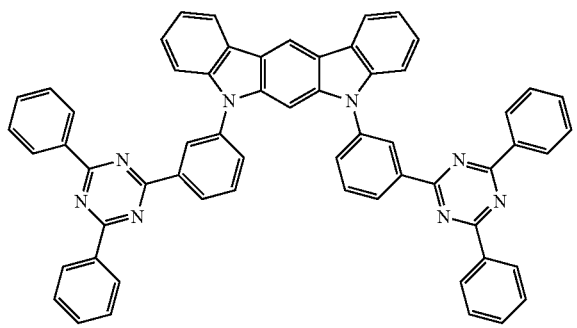
H233
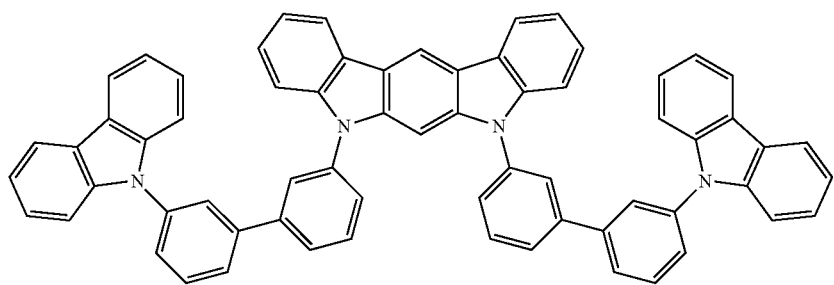

-continued
H234
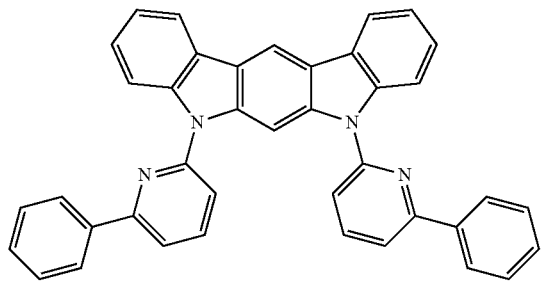
H235
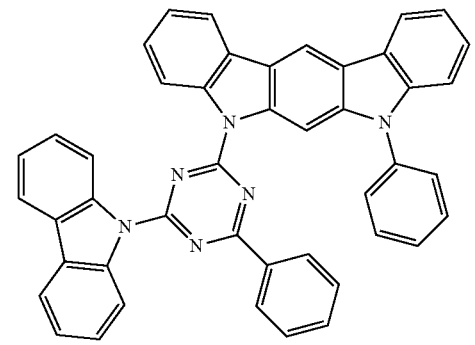
H236
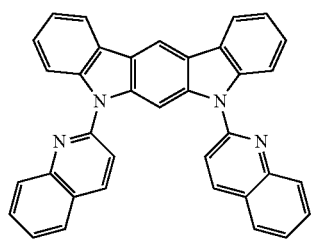
H237
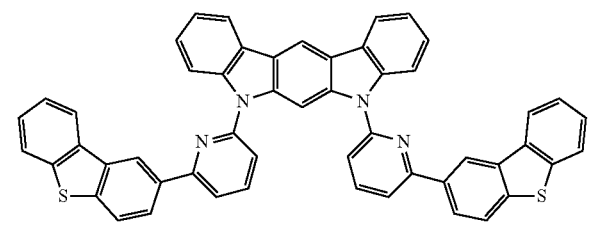
H238
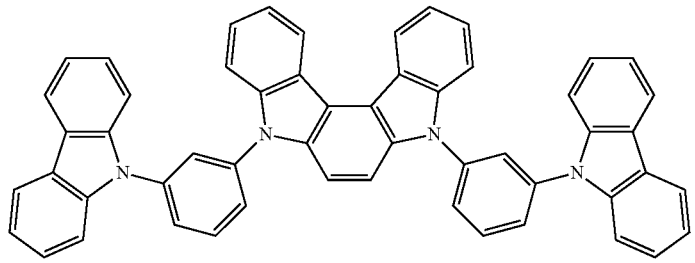
H239
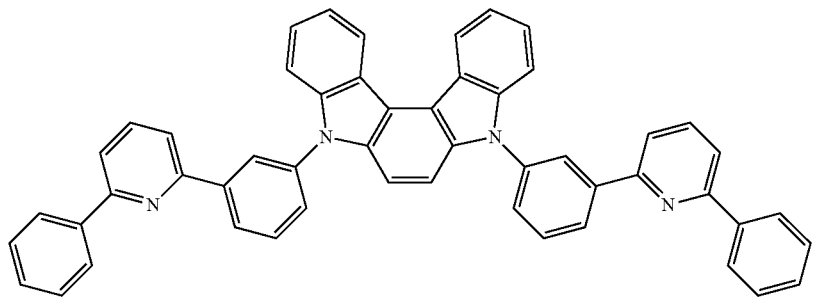
H240
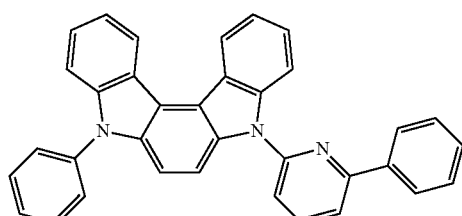
H241
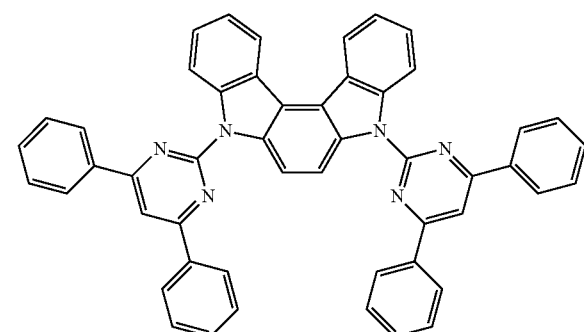

-continued
H242
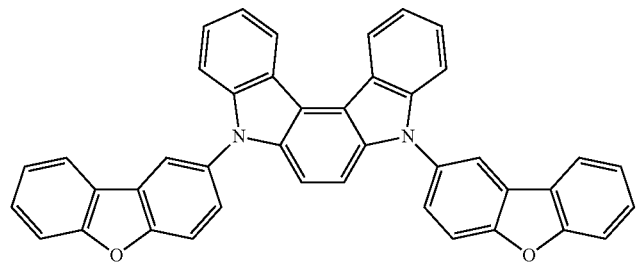
H243
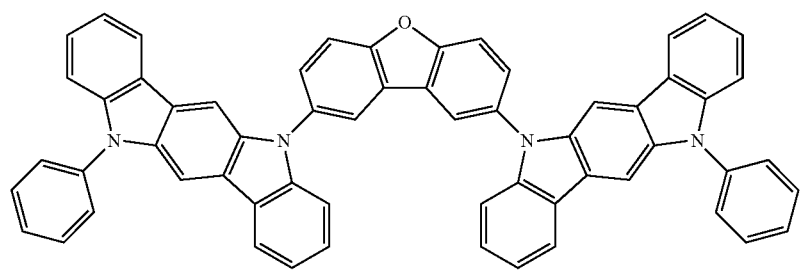
H244
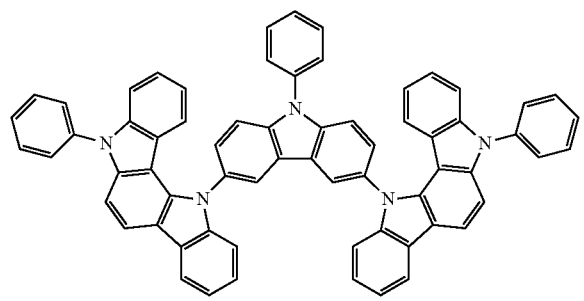
H245
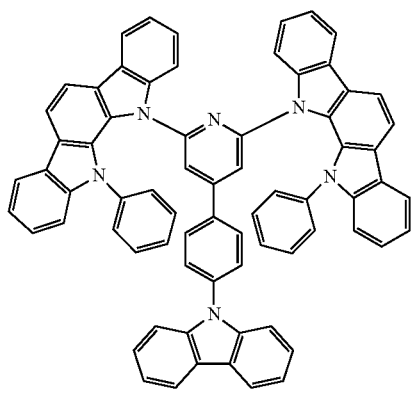
H246
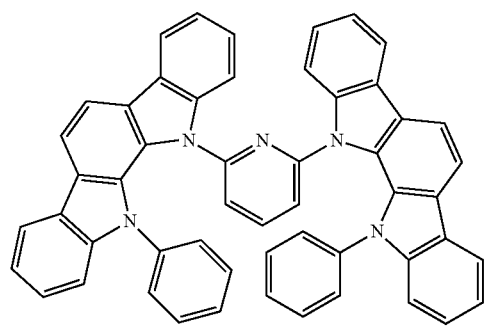
H247
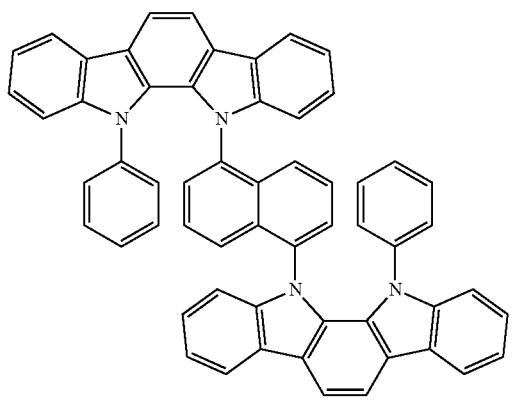

-continued
H248
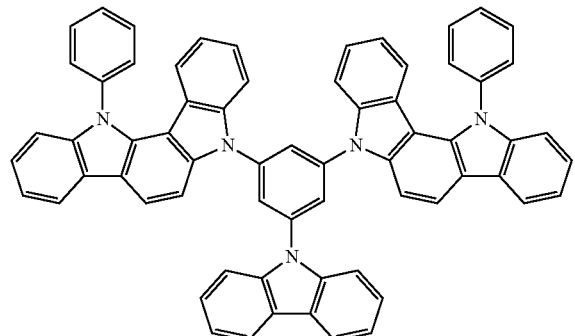
H249
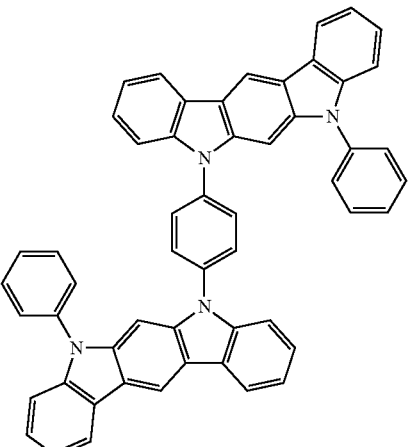
H250
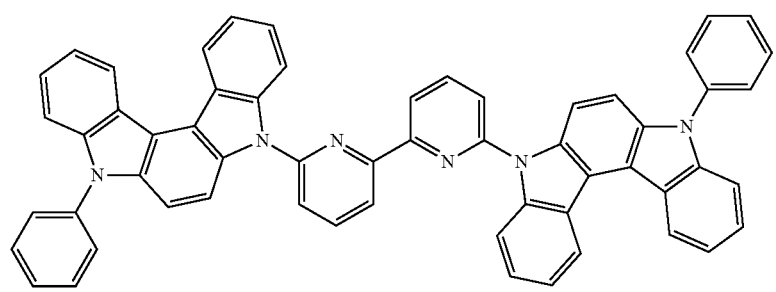
H251
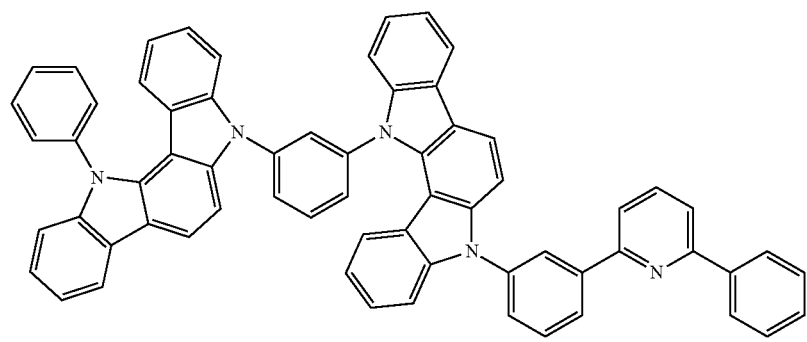
H252
H253
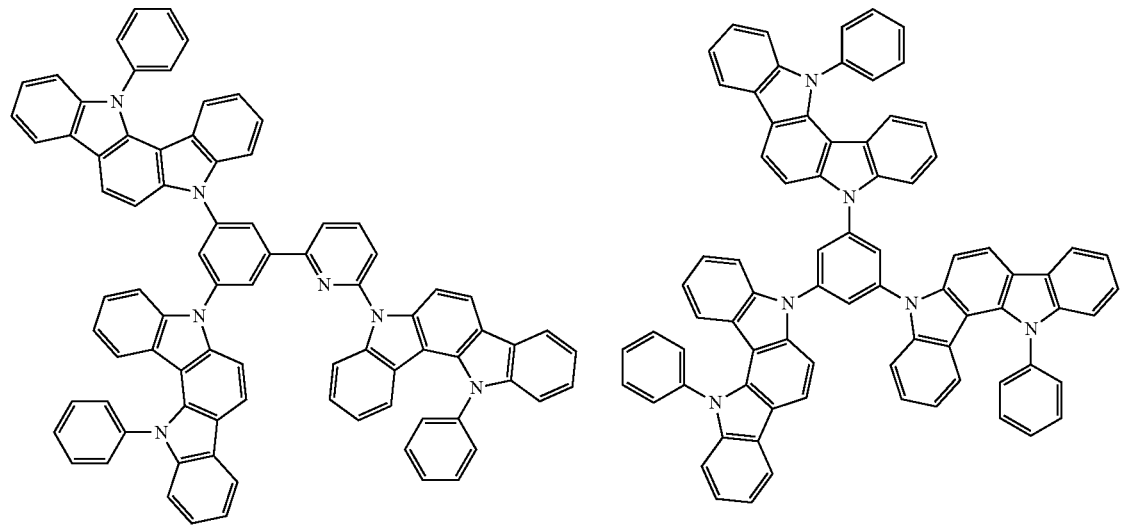

In a particular aspect, the set of non-hydrogen substituents selected for R₁, R₂, R₃, R₄, and R₅, and the set of non-hydrogen substituents selected for R₆, R₇, R₈ are the same. Therefore, the first compound and the second compound are suitable for premixing.

In one aspect, the first organic layer is an emissive layer and the first compound and the second compound are hosts, and wherein the emissive layer further comprises an emissive phosphorescent dopant.

Preferably, the emissive phosphorescent dopant is selected from the group consisting of:

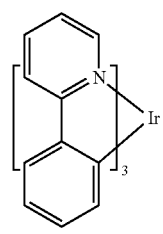
D1

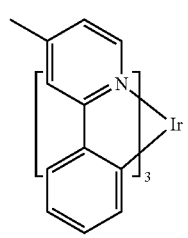
D2

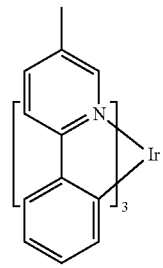
D3

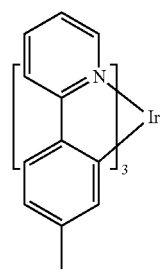
D4

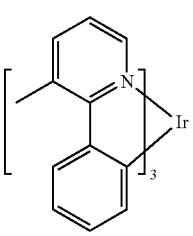
D5

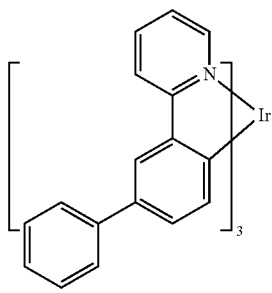
D6

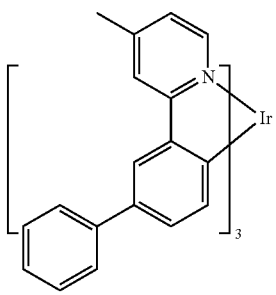
D7

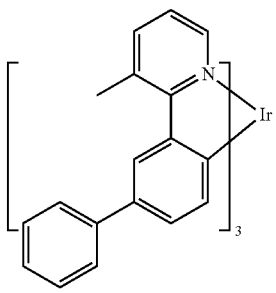
D8

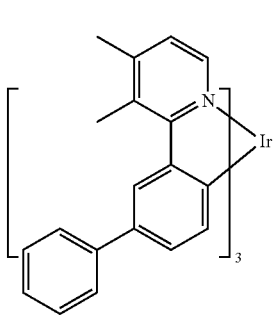
D9

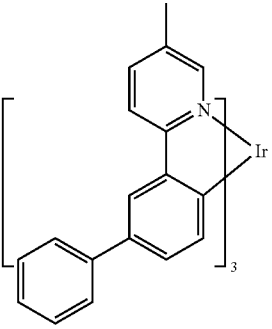
D10

D11
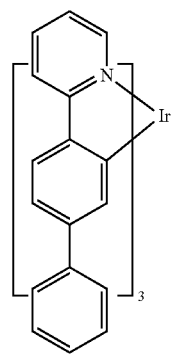
D12
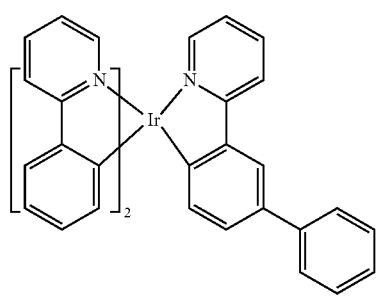
D13
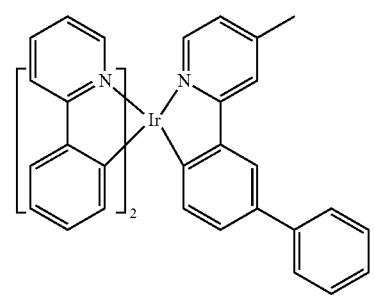
D14
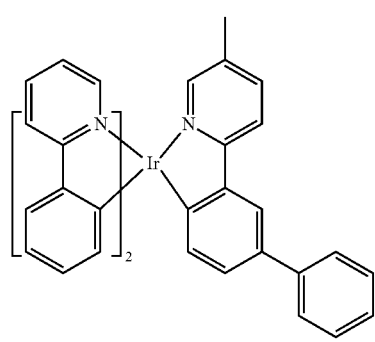
D15
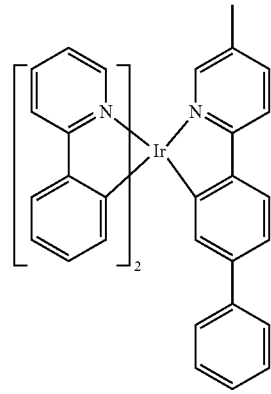
D16
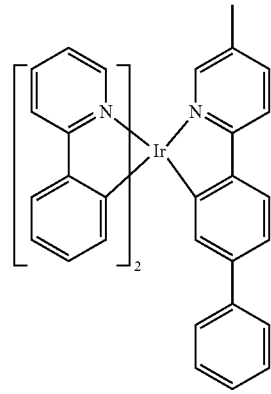
D17
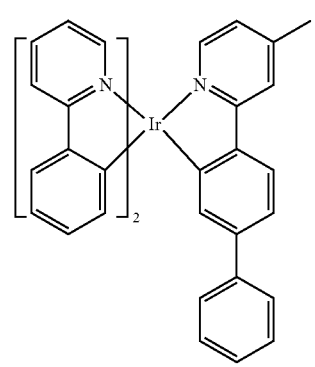
D18
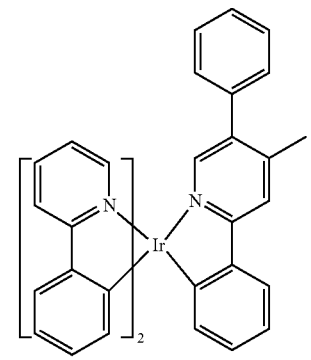
D19
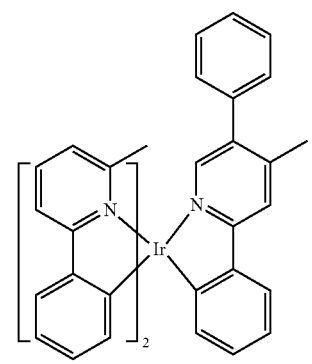

-continued
D20
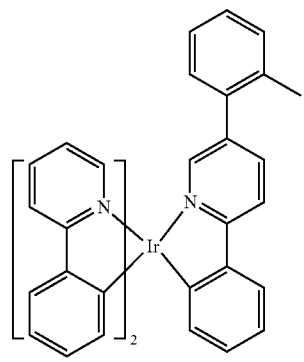
D21
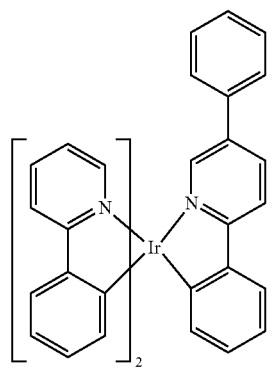
D22
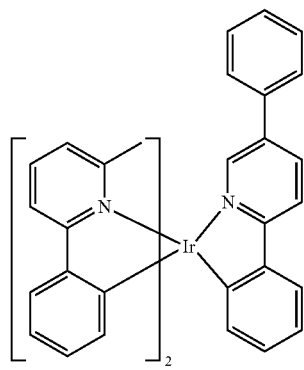
D23
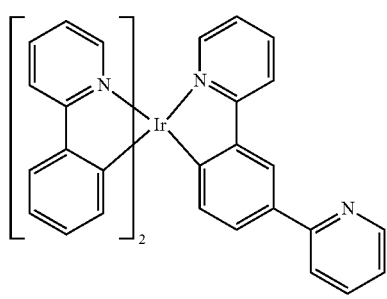
D24
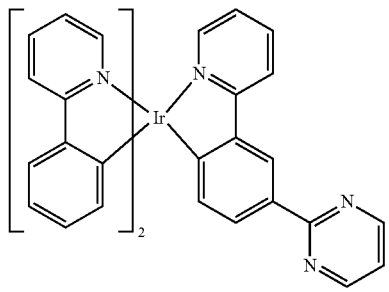
D25
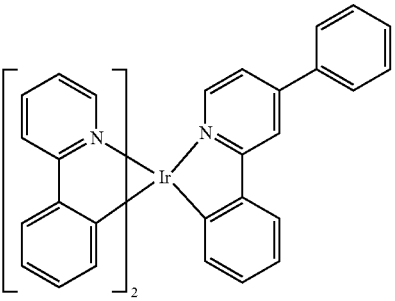
D26
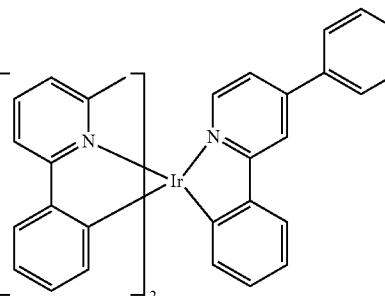
D27
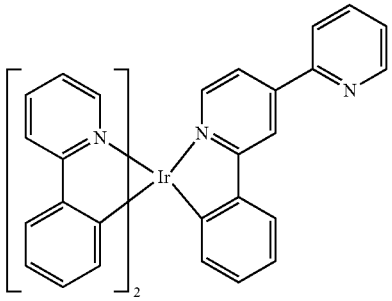
D28
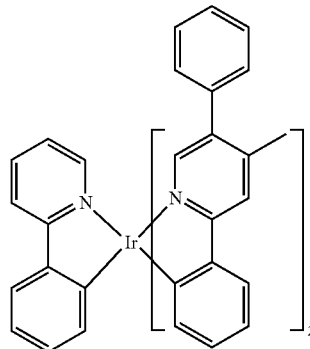

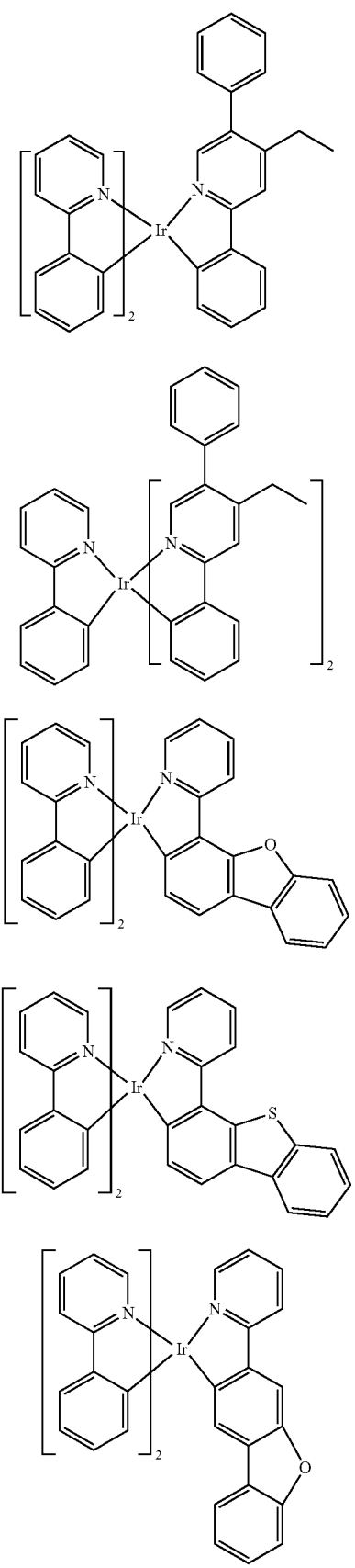
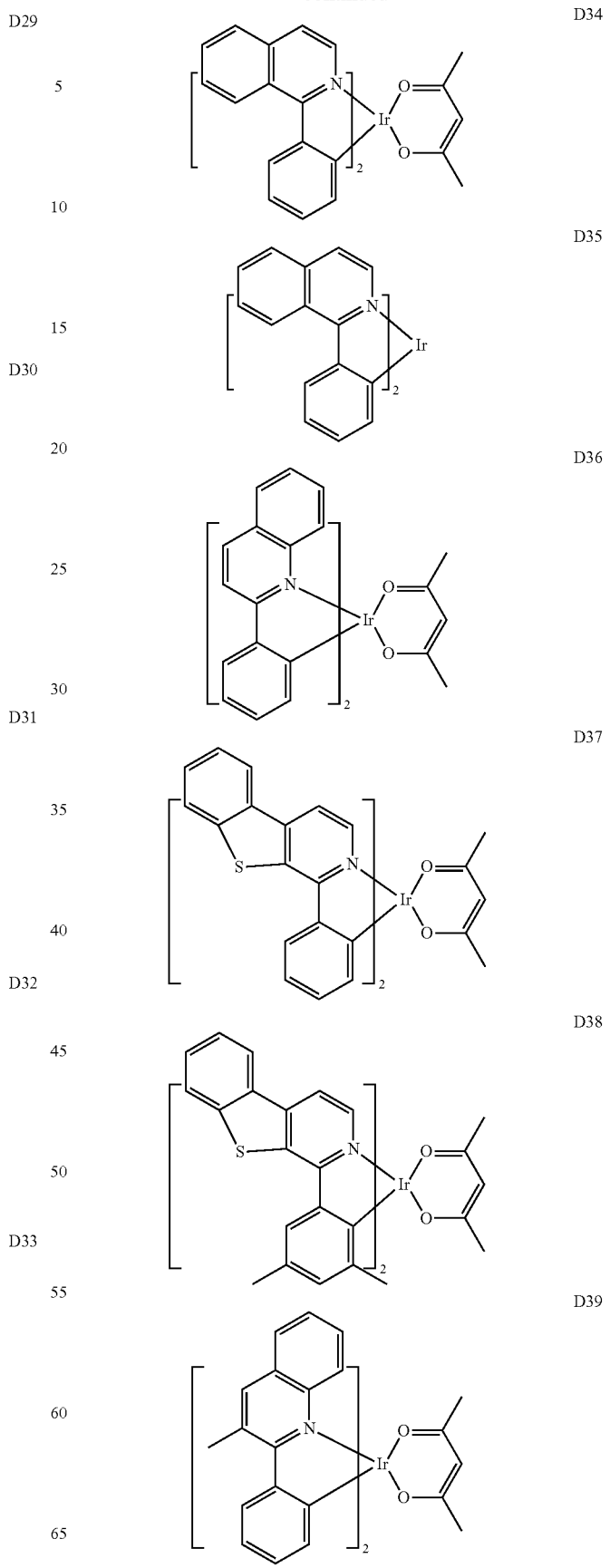

D40
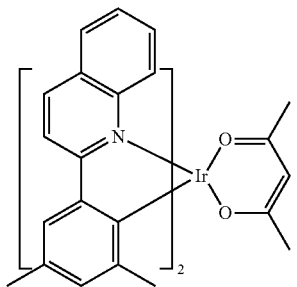

D41
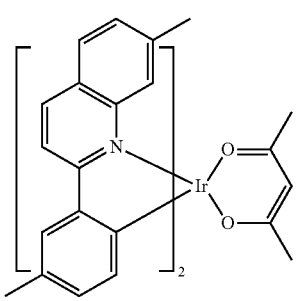

D42
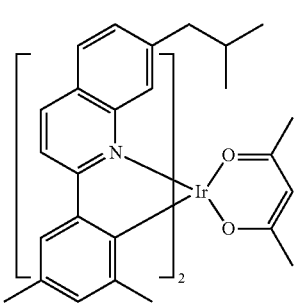

D43
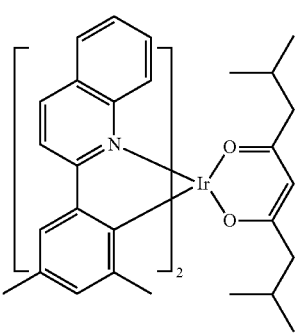

D44
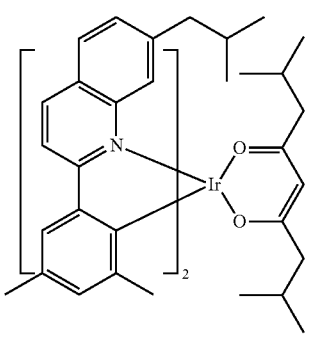

D45
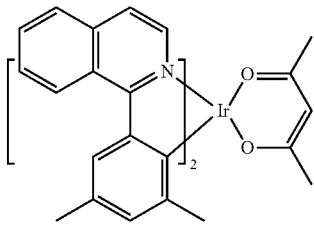

D46
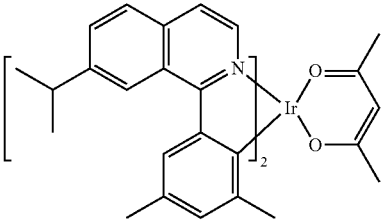

D47
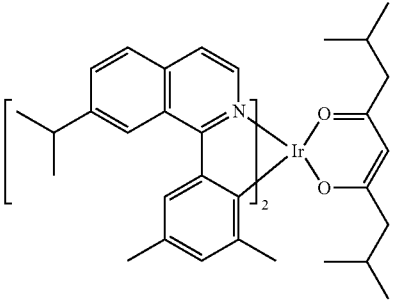

In another aspect, the device further comprises a second organic layer different from the first organic layer, and the first organic layer is a non-emissive layer. Preferably, the first organic layer is a blocking layer.

In one aspect, the first electrode is an anode and the first organic layer is deposited over the anode.

In one aspect, the first compound has an evaporation temperature within 30° C. of the evaporation temperature of the second compound.

In one aspect, the organic composition comprises about 5% to about 95% of the first compound and about 5% to about 95% the second compound.

In one aspect, the device is an organic light emitting device. In another aspect, the device is a consumer product.

Additionally, a method of fabricating an organic light emitting device is provided. The device comprises a first electrode, a second electrode, and a first organic layer disposed between the first electrode and the second electrode. The first organic layer comprises an organic composition further comprising a first compound and a second compound. The method comprises providing a substrate having the first electrode disposed thereon, depositing the organic composition over the first electrode; and depositing the second electrode over the first organic layer. The first compound has the formula:

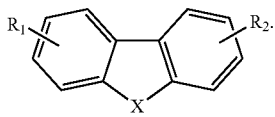

X is Se, S or O. $R_1$ and $R_2$ are substituents independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C\equiv CHC_nH_{2n+1}$, $Ar_1$, $Ar_1$-$Ar_2$, $C_nH_{2n+1}$—$Ar_1$, or no substitution. Each of $R_1$ and $R_2$ may represent mono, di, tri, or tetra substitutions. n is 1, 2, 3, 4, 5, 6, 7, 8, 9, or 10. $Ar_1$ and $Ar_2$ are independently selected from the group consisting of benzene, biphenyl, naphthalene, triphenylene, carbazole, and heteroaromatic analogs thereof. At least one of $R_1$ and $R_2$ includes a triphenylene group. The second compound has the formula (1):

(1)

wherein

Y is an m-valent aromatic hydrocarbon group of 6 to 50 carbon atoms or an m-valent aromatic heterocyclic group of 3 to 50 carbon atoms excluding a group having more than 5 condensed rings.

m denotes an integer of 1 to 3, such that when m is greater than 2, each Z may be the same or different Z is represented by formula (1a):

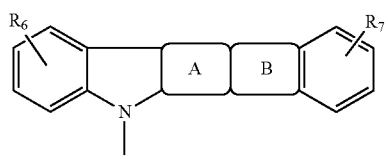
(1a)

wherein ring A is an aromatic hydrocarbon ring represented by formula (1b)

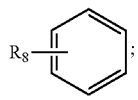
(1b)

ring B is a heterocyclic ring represented by formula (1c)

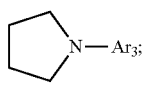
(1c)

ring A and B are respectively condensed with the adjacent rings;

$R_6$-$R_8$ are each independently selected from hydrogen, an aliphatic hydrocarbon group of 1 to 10 carbon atoms, an aromatic hydrocarbon group of 6 to 18 carbon atoms, or an aromatic heterocyclic group of 3 to 17 carbon atoms; and, $Ar_3$ is an aromatic hydrocarbon group of 6 to 50 carbon atoms, or an aromatic heterocyclic group of 3 to 50 carbon atoms excluding a group having more than 5 condensed rings.

In Formula 1, examples of Y and $Ar_3$ include benzene, naphthalene, anthracene, pyridine, pyrazine, pyrimidine, pyridajine, triazine, isoindole, indazole, purine, isoquinoline, imidazole, naphthyridine, Phthalazine, quinazoline, quinoxaline, cinnoline, quinoline, pteridine, phenanthridine, acridine, perimidine, phenanthroline, phenazine, carboline, indole, benzoxazole, benzothiazole, carbazole, dibenzofuran, dibenzothiophene, and may arbitrarily connect two or more these groups. Further, in Formula 1, Y is an m-valent group and $Ar_3$ is a monovalent group.

In one aspect, the first compound has the formula:

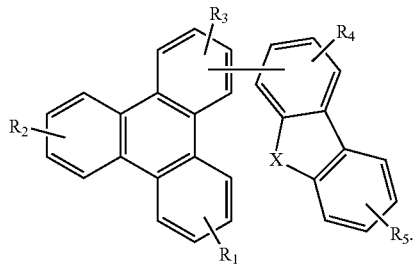

where X is Se, S or O. Each of $R_1$, $R_2$, $R_3$, $R_4$, and $R_5$ may represent mono, di, tri, or tetra substitutions. $R_1$, $R_2$, $R_3$, $R_4$, and $R_5$ are independently selected from the group consisting of hydrogen, halogen, alkyl, alkoxy, amino, alkenyl, alkynyl, aryl and heteroaryl. The second compound has the formula (2):

(2)

wherein

Y' is an m-valent aromatic hydrocarbon group of 6 to 40 carbon atoms or an m-valent aromatic heterocyclic group of 3 to 40 carbon atoms excluding a group having more than 5 condensed rings;

m denotes an integer of 1 or 2, and when m=2, each Z may be the same or different;

Z is represented by formula (2a):

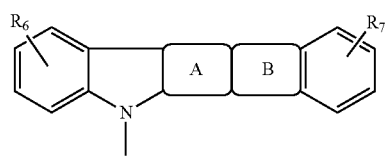
(2a)

wherein ring A is an aromatic hydrocarbon ring represented by formula (2b),

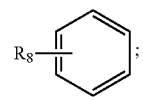
(2b)

ring B is an heterocyclic ring represented by formula (2c),

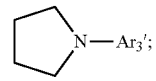
(2c)

ring A and B are respectively condensed with the adjacent rings;

$R_6$~$R_8$ are independently selected from hydrogen, an aliphatic hydrocarbon group of 1 to 10 carbon atoms, an aromatic hydrocarbon group of 6 to 18 carbon atoms, or an aromatic heterocyclic group of 3 to 17 carbon atoms; and, $Ar_3'$ is an aromatic hydrocarbon group of 6 to 40 carbon atoms, or an aromatic heterocyclic group of 3 to 40 carbon atoms excluding a group having more than 5 condensed rings.

In Formula 2, examples of Y' or $Ar_3'$ include a group leaded from benzene, naphthalene, anthracene, pyridine, pyrazine, pyrimidine, pyridajine, triazine, isoindole, indazole, purine, isoquinoline, imidazole, naphthyridine, Phthalazine, quinazoline, quinoxaline, cinnoline, quinoline, pteridine, phenanthridine, acridine, perimidine, phenanthroline, phenazine, carboline, indole, benzoxazole, benzothiazole, carbazole, dibenzofuran, dibenzothiophene, and may arbitrarily connect two or more these groups. Further, Y' is an m-valent group, and $Ar_3'$ is a monovalent group Preferably, the first compound has the formula;

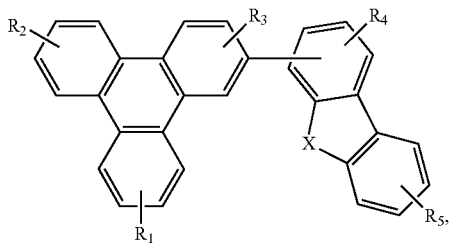

X is Se, S or O. Each of $R_1$, $R_2$, $R_3$, $R_4$, and $R_5$ may represent mono, di, tri, or tetra substitutions. $R_1$, $R_2$, $R_3$, $R_4$, and $R_5$ are independently selected from the group consisting of hydrogen, halogen, alkyl, alkoxy, amino, alkenyl, alkynyl, aryl and heteroaryl. The second compound has the formula (3);

 (3)

wherein

Y'' is a monovalent aromatic heterocyclic group of 3 to 30 carbon atoms excluding a group having more than 5 condensed rings;

m denote an integer of 1.

Z is a represented by formula (3a)

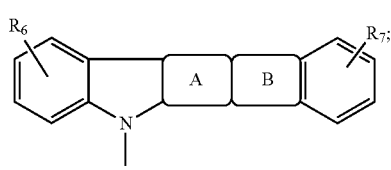

ring A is an aromatic hydrocarbon ring represented by formula (3b)

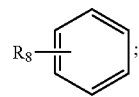

ring B is an heterocyclic ring represented by formula (3c)

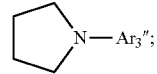

ring A and ring B are respectively condensed with the adjacent rings;

$R_6$, $R_7$, $R_8$ are each independently selected from hydrogen, an aliphatic hydrocarbon group of 1 to 10 carbon atoms, an aromatic hydrocarbon group of 6 to 18 carbon atoms, or an aromatic heterocyclic group of 3 to 17 carbon atoms;

$Ar_3''$ is an aromatic hydrocarbon group of 6 to 30 carbon atoms, or an aromatic heterocyclic group of 3 to 30 carbon atoms excluding a group having more than 5 condensed rings.

In Formula 3, examples of Y'' include pyridine, pyrazine, pyrimidine, pyridajine, triazine, isoindole, indazole, purine, isoquinoline, imidazole, naphthyridine, Phthalazine, quinazoline, quinoxaline, cinnoline, quinoline, pteridine, phenanthridine, acridine, perimidine, phenanthroline, phenazine, carboline, indole, benzoxazole, benzothiazole, carbazole, dibenzofuran, dibenzothiophene, and may arbitrarily connect two or more these groups. Further, in Formula 3, examples of $Ar_3''$ include benzene, naphthalene, anthracene, pyridine, pyrazine, pyrimidine, pyridajine, triazine, isoindole, indazole, purine, isoquinoline, imidazole, naphthyridine, Phthalazine, quinazoline, quinoxaline, cinnoline, quinoline, pteridine, phenanthridine, acridine, perimidine, phenanthroline, phenazine, carboline, indole, benzoxazole, benzothiazole, carbazole, dibenzofuran, dibenzothiophene, and may arbitrarily connect two or more these groups. Further, in Formula 3, Y'' is an m-valent group, $Ar_3''$ is a monovalent group.

More preferably, the first compound is selected from the group consisting of

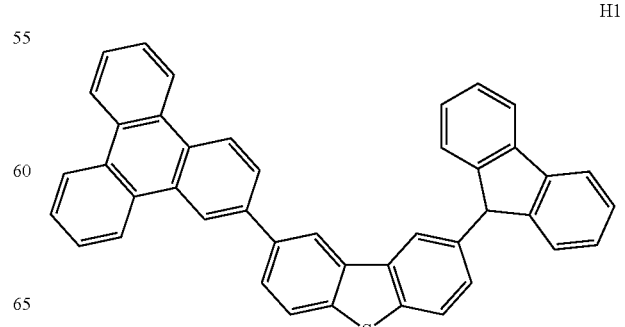

H2
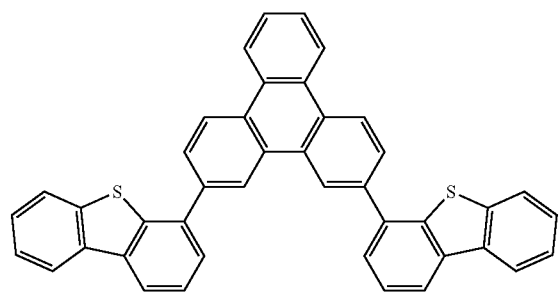
H4
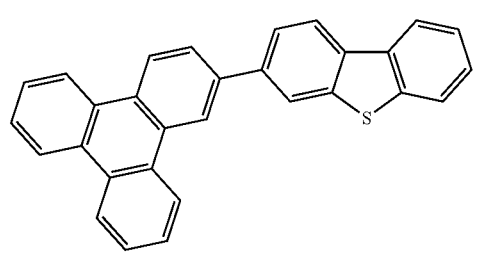
H5
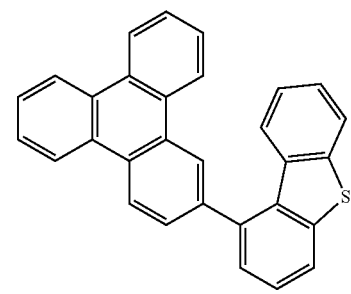
H9
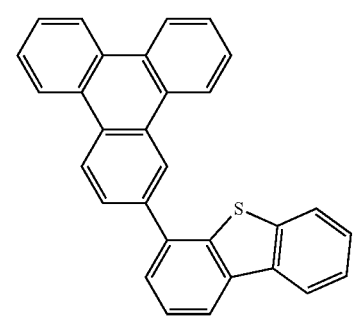
H10
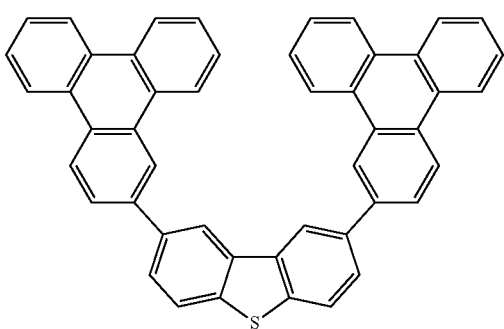
H11
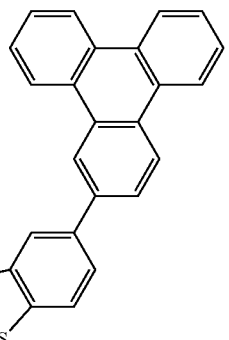
H12
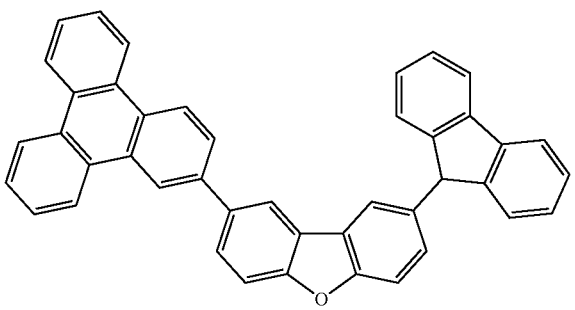
H13
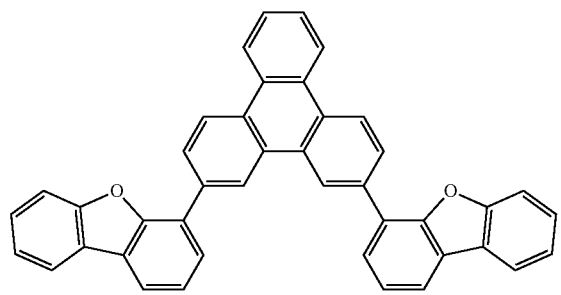
H15
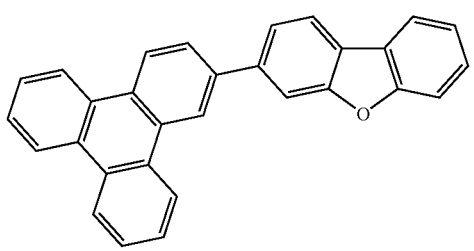

-continued
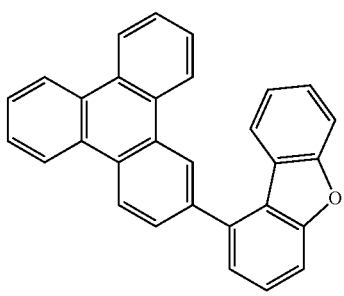 H16
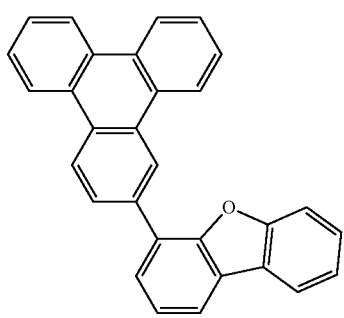 H20
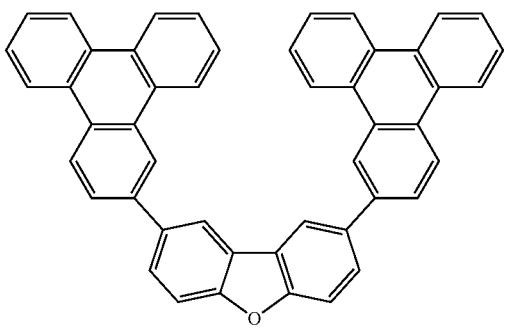 H21
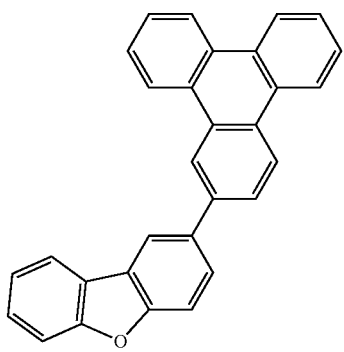 H22
-continued
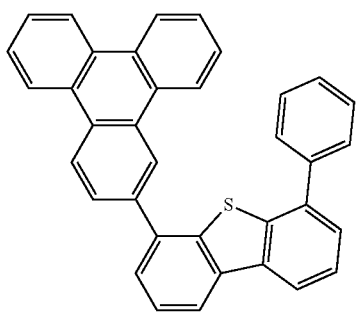 H23
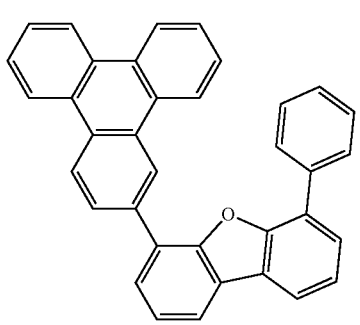 H25
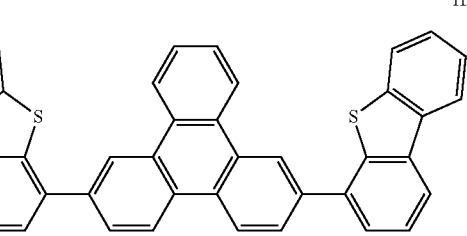 H30
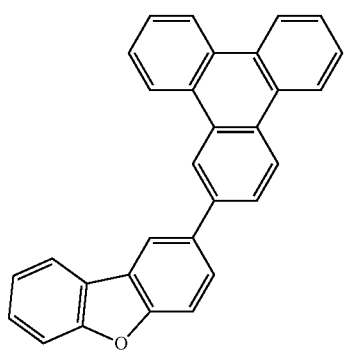 H35
More preferably, the second compound is selected from the group consisting of:

75              76
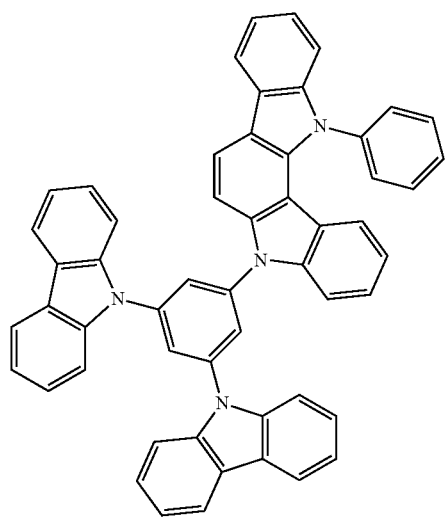 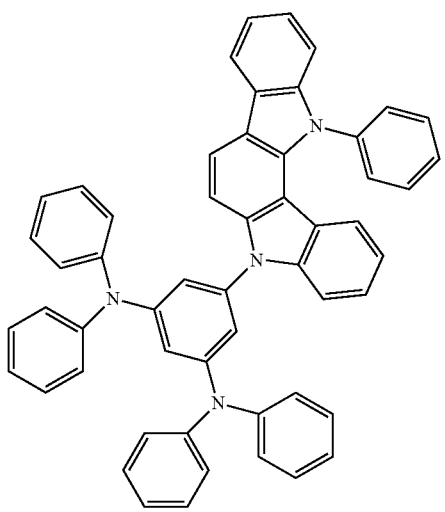
H201            H202
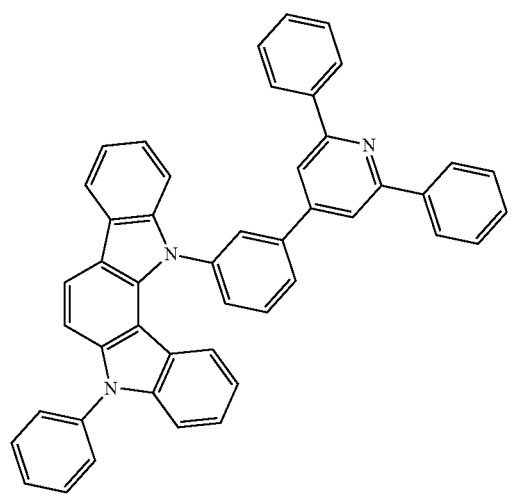 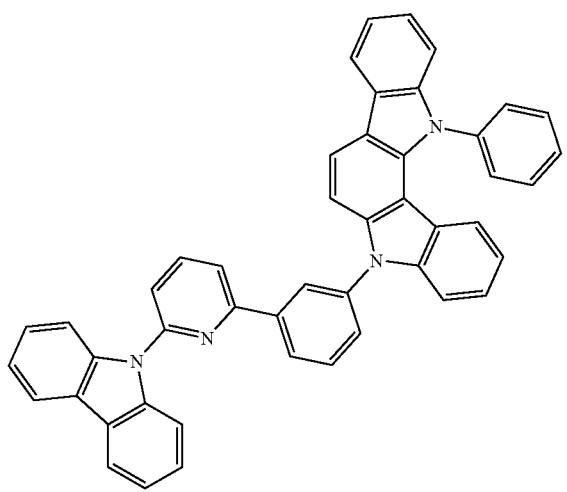
H203            H204
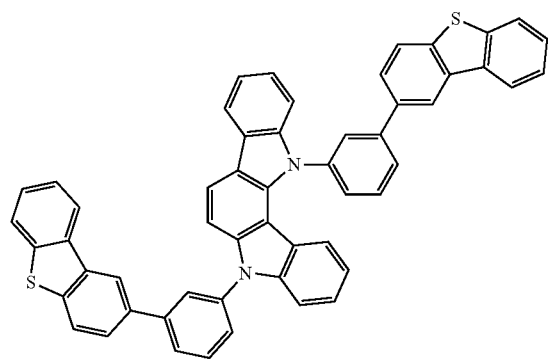 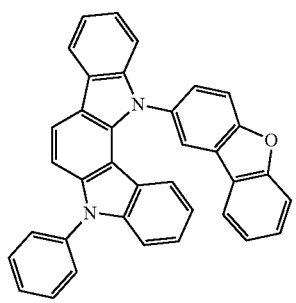
H205            H206

-continued
H207
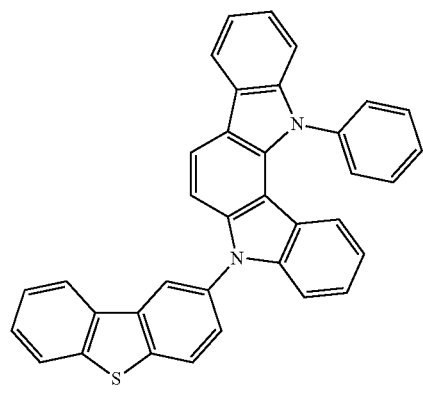
H208
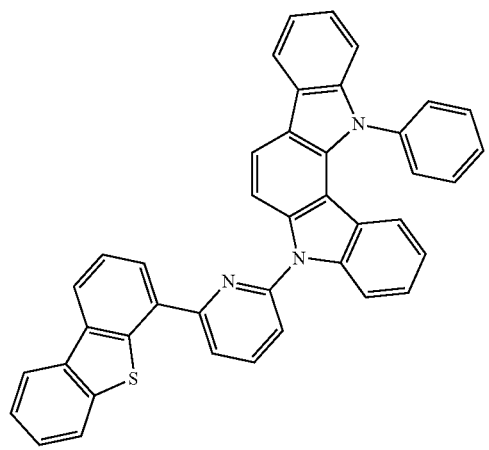
H209
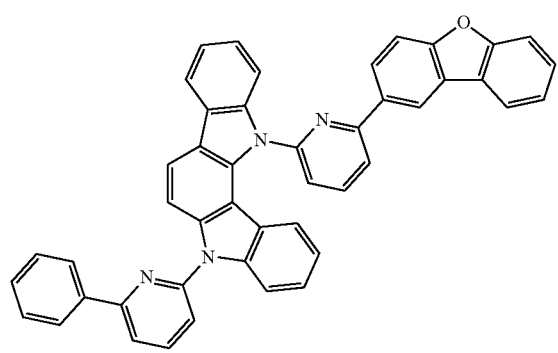
H210
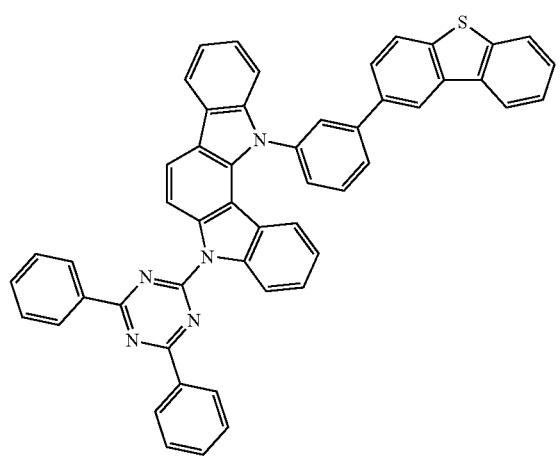
H211
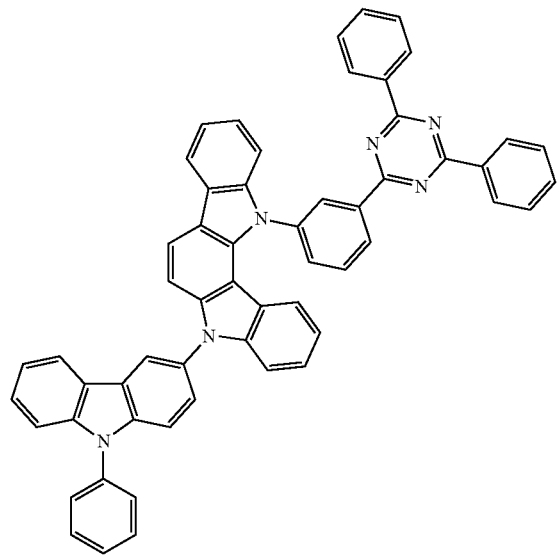
H212
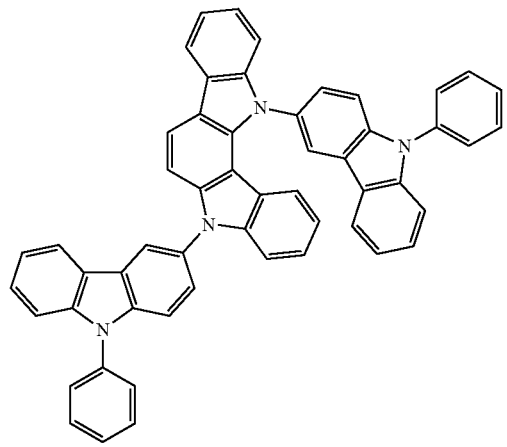

-continued
H213
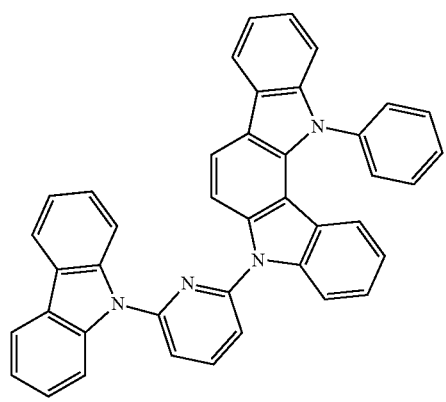
H214
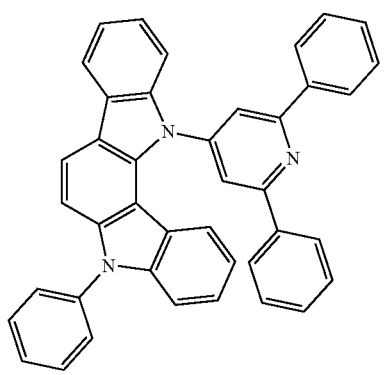
H215
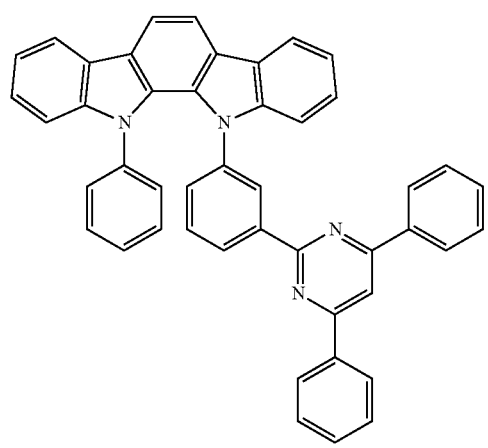
H216
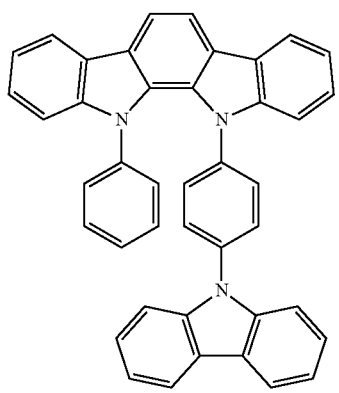
H217
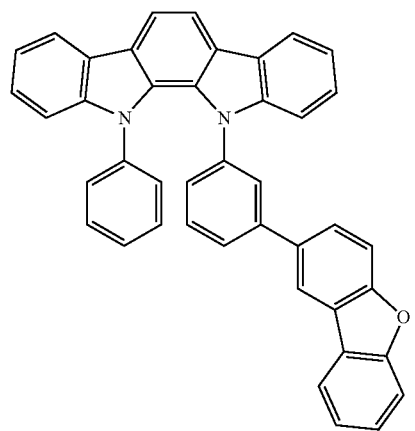
H218
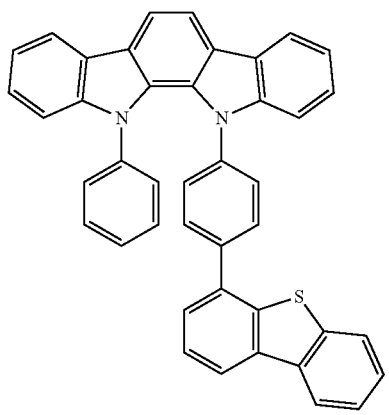
H219
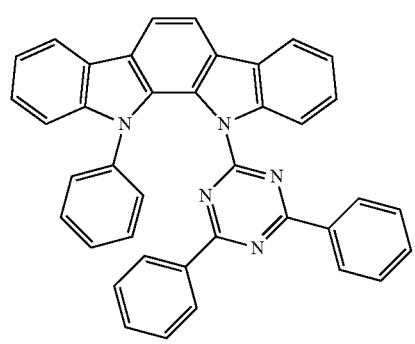
H220
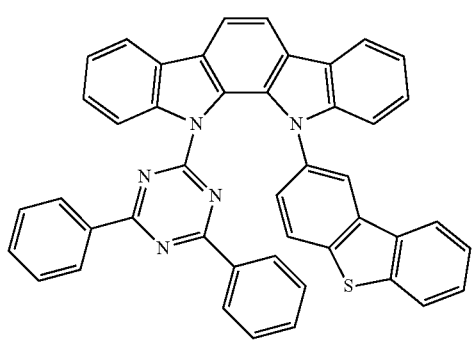

-continued
H221
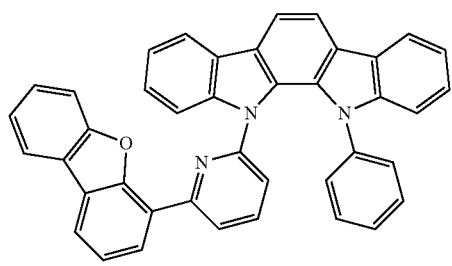
H222
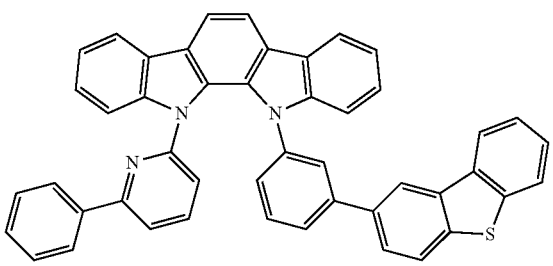
H223
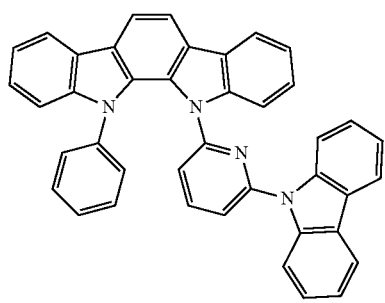
H224
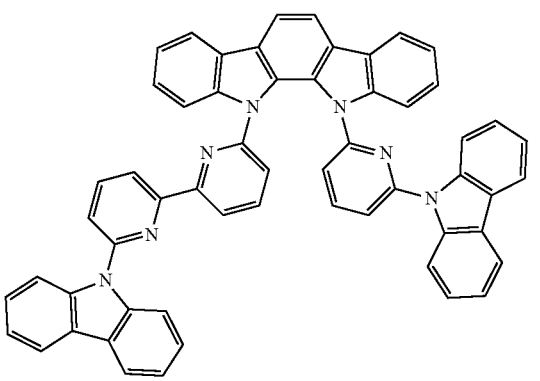
H225
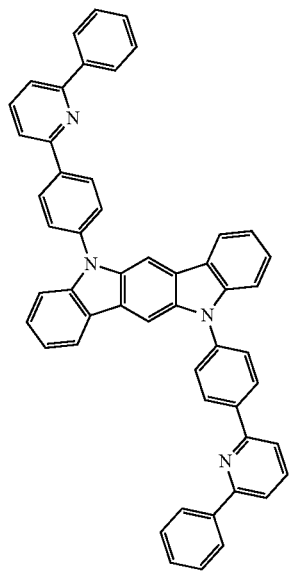
H226
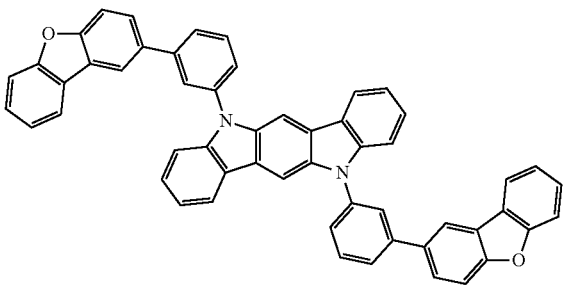
H227
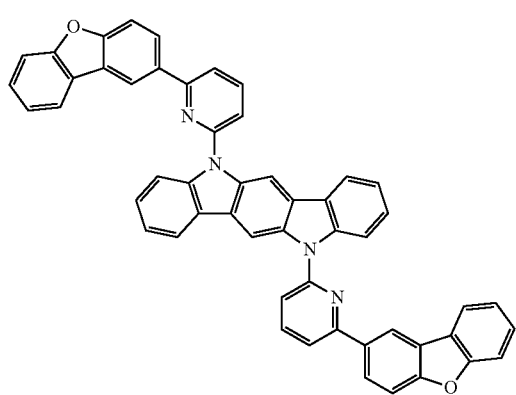
H228
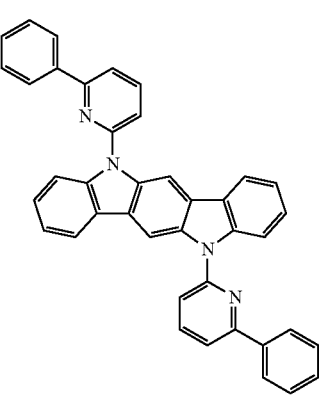

-continued
H229
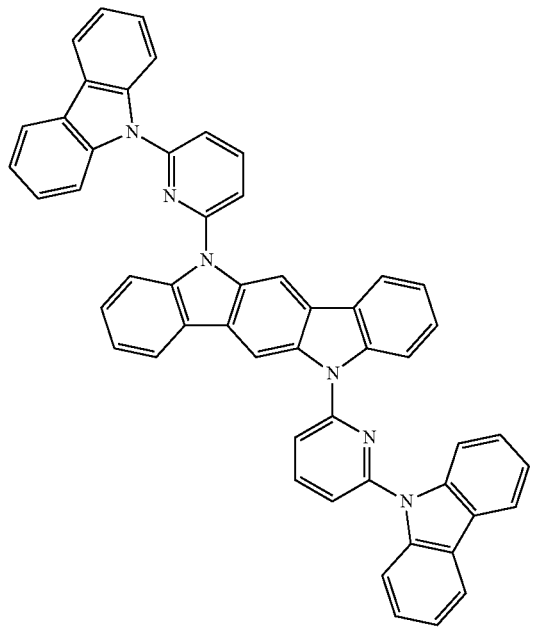
H230
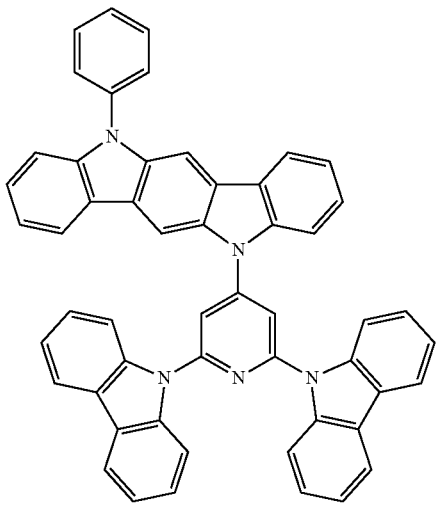
H231
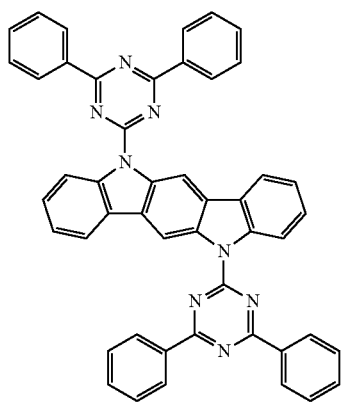
H232
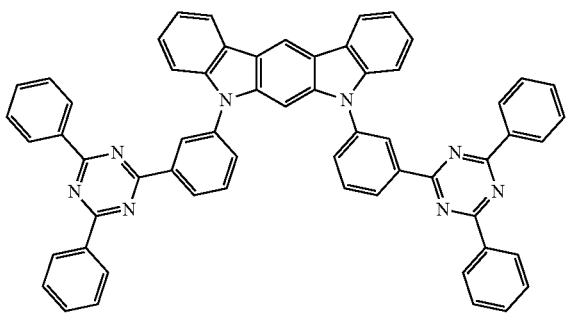
H233
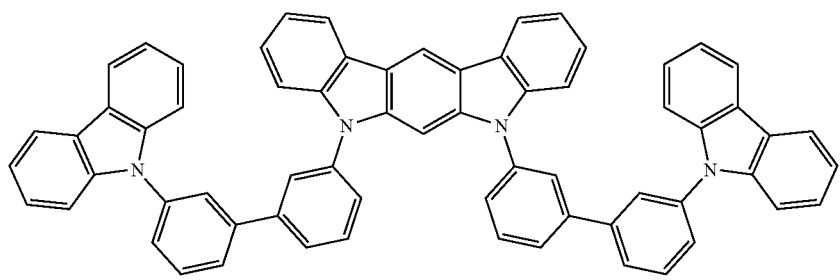

-continued
H234
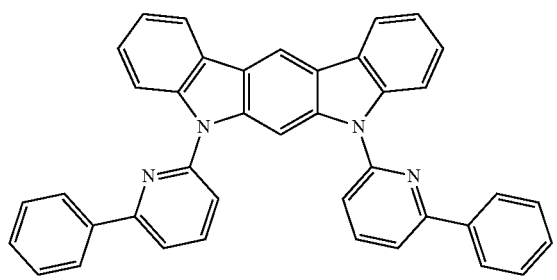
H235
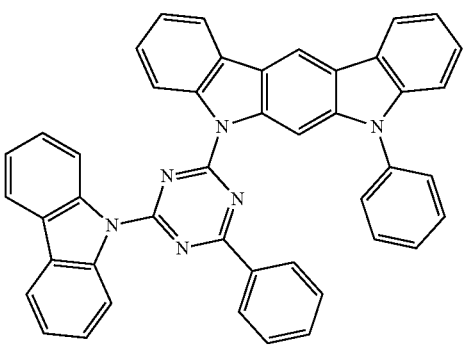
H236
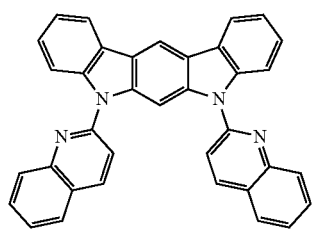
H237
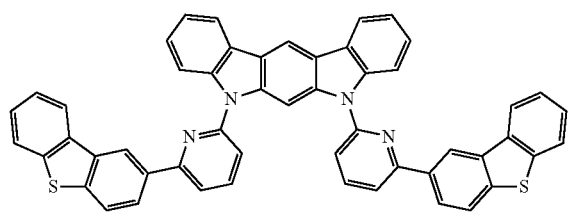
H238
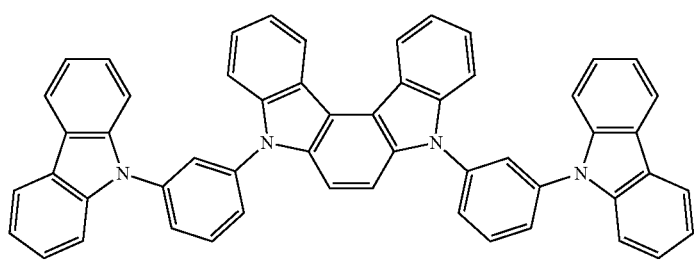
H239
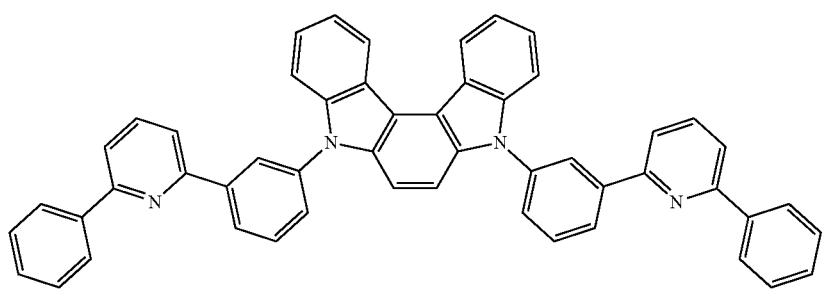
H240
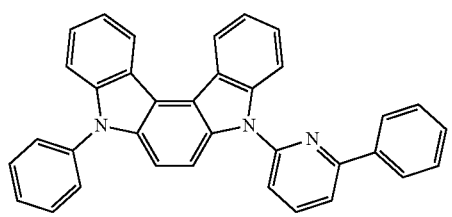
H241
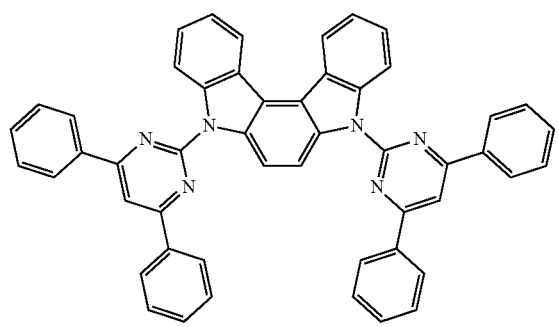

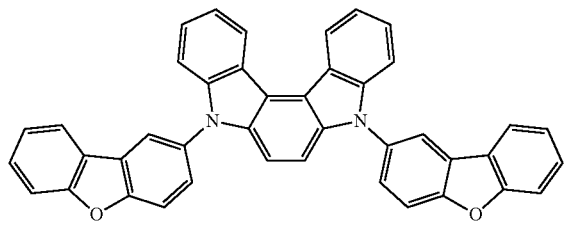
H242
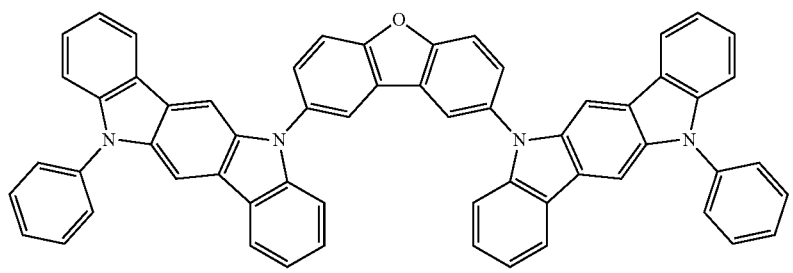
H243
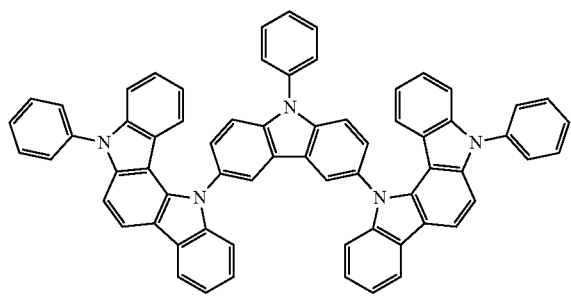
H244
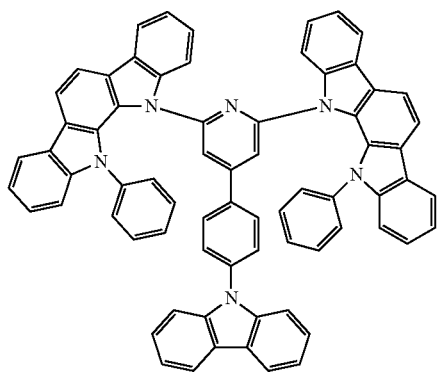
H245
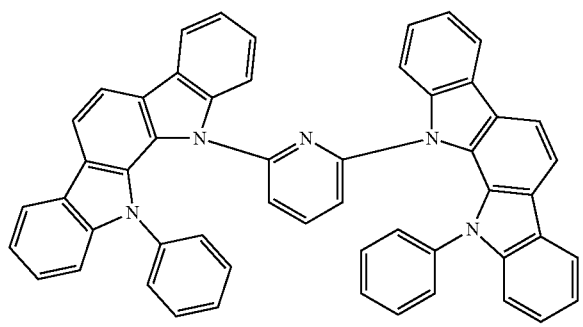
H246
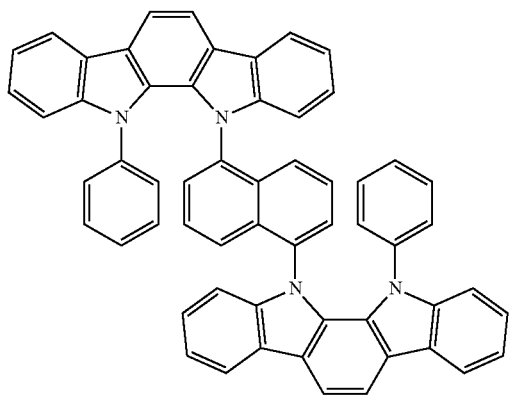
H247

H248
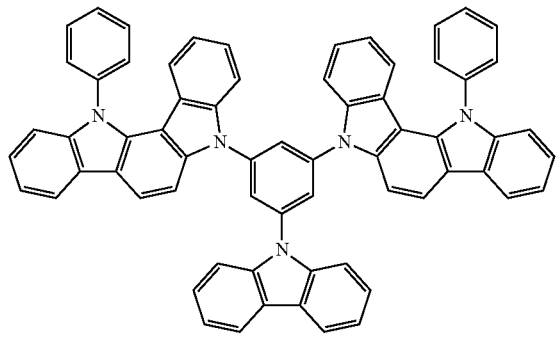
H249
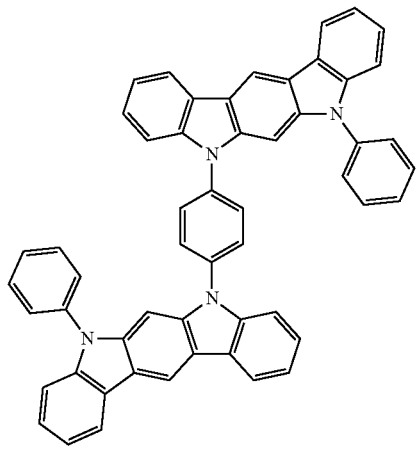
H250
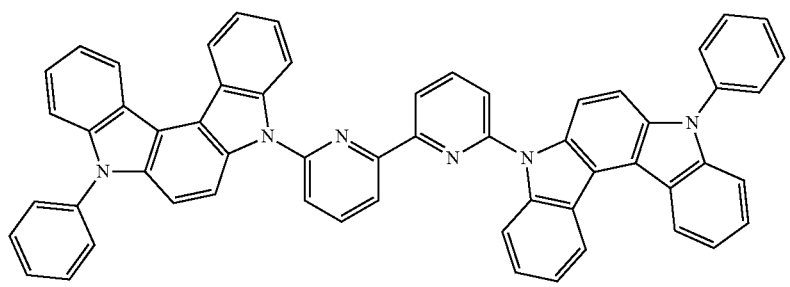
H251
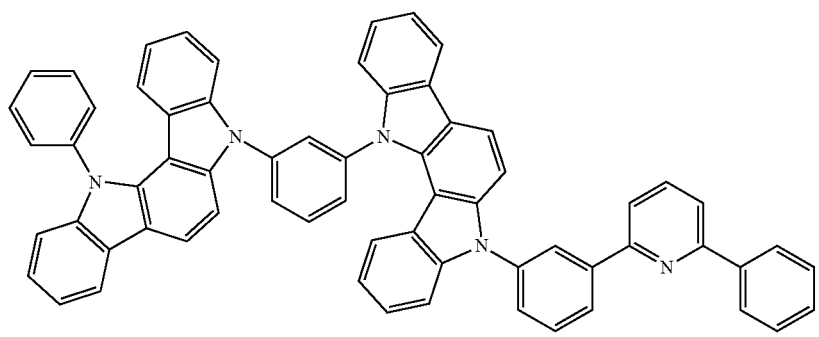
H252
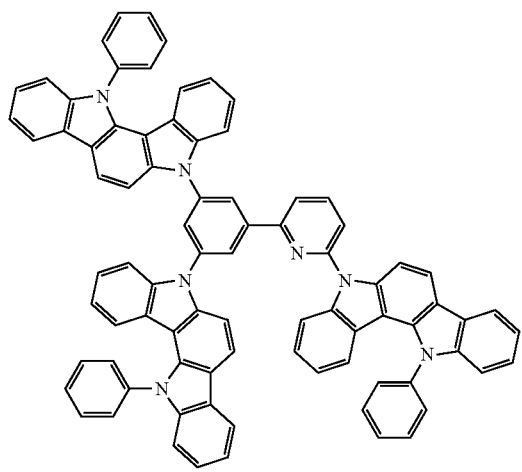
H253
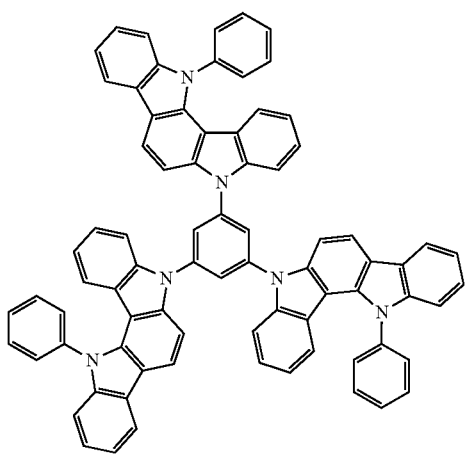

In a particular aspect, the set of non-hydrogen substituents selected for $R_1$, $R_2$, $R_3$, $R_4$, and $R_5$, and the set of non-hydrogen substituents selected for $R_6$, $R_7$, and $R_8$ are the same and the method further comprises mixing the first compound and the second compound before depositing the organic composition over the first electrode. Without being bound by theory, it is believed that the first compound and the second compound are particularly well-suited for premixing when each compound contains identical substitutions because derivatives with the same molecular modification will have the same molecular weight difference, and may have similar intermolecular interactions, e.g., a first compound including a phenyl substitution is expected to work well when premixed with a second compound also containing a phenyl substitution.

In another aspect, the first compound has the formula:

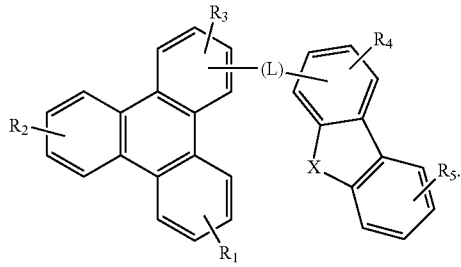

X is Se, S or O. Each of $R_1$, $R_2$, $R_3$, $R_4$, and $R_5$ may represent mono, di, tri, or tetra substitutions. $R_1$, $R_2$, $R_3$, $R_4$, and $R_5$ are independently selected from the group consisting of hydrogen, halogen, alkyl, alkoxy, amino, alkenyl, alkynyl, aryl and heteroaryl. L is selected from the group consisting of benzene, biphenyl, naphthalene, triphenylene, carbazole, and heteroaromatic analogs thereof. The second compound has the formula (2):

 (2)

wherein

Y' is an m-valent aromatic hydrocarbon group of 6 to 40 carbon atoms or an m-valent aromatic heterocyclic group of 3 to 40 carbon atoms excluding a group having more than 5 condensed rings;

m denotes an integer of 1 or 2, and when m=2, each Z may be the same or different;

Z is represented by formula (2a):

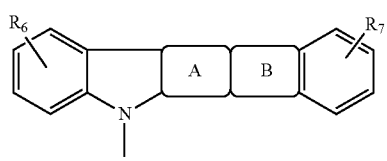 (2a)

wherein ring A is an aromatic hydrocarbon ring represented by formula (2b),

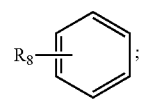 (2b)

ring B is an heterocyclic ring represented by formula (2c),

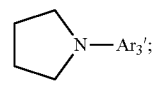 (2c)

ring A and B are respectively condensed with the adjacent rings;

$R_6$-$R_8$ are each independently selected from hydrogen, an aliphatic hydrocarbon group of 1 to 10 carbon atoms, an aromatic hydrocarbon group of 6 to 18 carbon atoms, or an aromatic heterocyclic group of 3 to 17 carbon atoms; and, $Ar_3'$ is an aromatic hydrocarbon group of 6 to 40 carbon atoms, or an aromatic heterocyclic group of 3 to 40 carbon atoms excluding a group having more than 5 condensed rings.

In Formula 2, examples of Y' and $Ar_3'$ include benzene, naphthalene, anthracene, pyridine, pyrazine, pyrimidine, pyridajine, triazine, isoindole, indazole, purine, isoquinoline, imidazole, naphthyridine, Phthalazine, quinazoline, quinoxaline, cinnoline, quinoline, pteridine, phenanthridine, acridine, perimidine, phenanthroline, phenazine, carboline, indole, benzoxazole, benzothiazole, carbazole, dibenzofuran, dibenzothiophene, and may arbitrarily connect two or more these groups. Further, in Formula 2, Y' is an m-valent group, $Ar_3'$ is a monovalent group.

Preferably, the first compound has the formula:

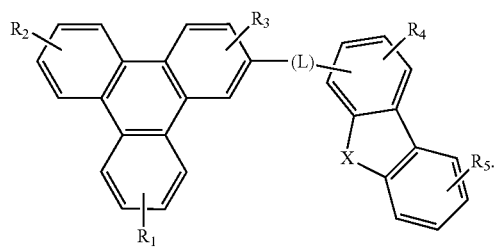

wherein X is Se, S or O. Each of $R_1$, $R_2$, $R_3$, $R_4$ and $R_5$ may represent mono, di, tri, or tetra substitutions. $R_1$, $R_2$, $R_3$, $R_4$ and $R_5$ are independently selected from the group consisting of hydrogen, halogen, alkyl, alkoxy, amino, alkenyl, alkynyl, aryl and heteroaryl. The second compound has the formula (3):

 (3)

wherein Y" is a monovalent aromatic heterocyclic group of 3 to 30 carbon atoms excluding a group having more than 5 condensed rings; m denotes an integer of 1; and, Z is a represented by formula (3a);

(3a)

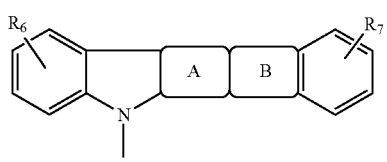

wherein ring A is an aromatic hydrocarbon ring represented by formula (3b):

(3b)

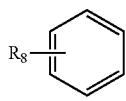

ring B is an heterocyclic ring represented by formula (3c), (3c)

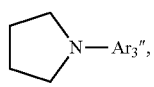

ring A and B are respectively condensed with the adjacent rings;

$R_6$, $R_7$, $R_8$ is independently selected from hydrogen, an aliphatic hydrocarbon group of 1 to 10 carbon atoms, an aromatic hydrocarbon group of 6 to 18 carbon atoms, or an aromatic heterocyclic group of 3 to 17 carbon atoms; and, $Ar_3''$ is an aromatic hydrocarbon group of 6 to 30 carbon atoms, or an aromatic heterocyclic group of 3 to 30 carbon atoms excluding a group having more than 5 condensed rings.

In Formula 3, examples of Y" include pyridine, pyrazine, pyrimidine, pyridajine, triazine, isoindole, indazole, purine, isoquinoline, imidazole, naphthyridine, Phthalazine, quinazoline, quinoxaline, cinnoline, quinoline, pteridine, phenanthridine, acridine, perimidine, phenanthroline, phenazine, carboline, indole, benzoxazole, benzothiazole, carbazole, dibenzofuran, dibenzothiophene, and may arbitrarily connect two or more these groups. Further, in Formula 3, examples of $Ar_3''$ include benzene, naphthalene, anthracene, pyridine, pyrazine, pyrimidine, pyridajine, triazine, isoindole, indazole, purine, isoquinoline, imidazole, naphthyridine, Phthalazine, quinazoline, quinoxaline, cinnoline, quinoline, pteridine, phenanthridine, acridine, perimidine, phenanthroline, phenazine, carboline, indole, benzoxazole, benzothiazole, carbazole, dibenzofuran, dibenzothiophene, and may arbitrarily connect two or more these groups. Further, in formula 3, Y" is an m-valent group and $Ar_3''$ is a monovalent group.

The first compound may be selected from the group consisting of:

H3

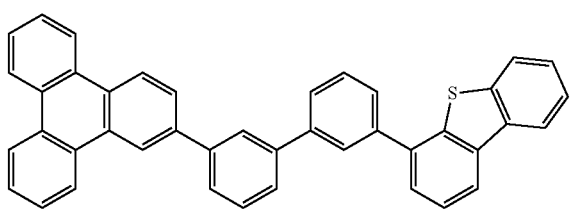

H6

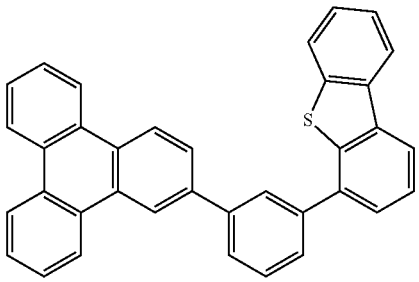

H7

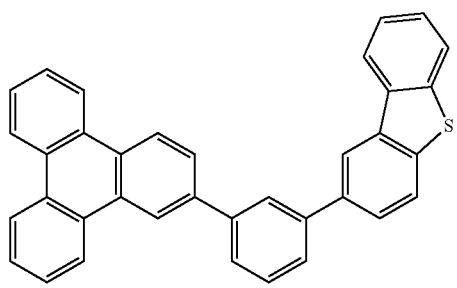

H8

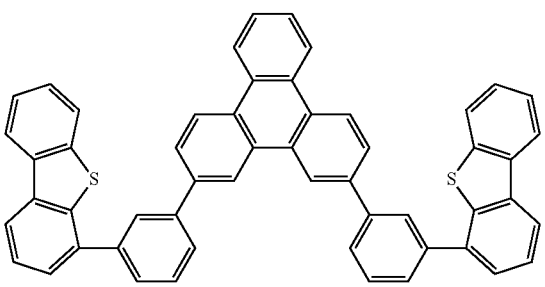

H14

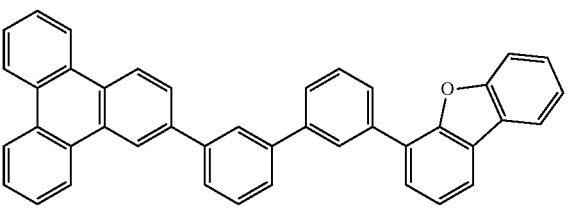

H17

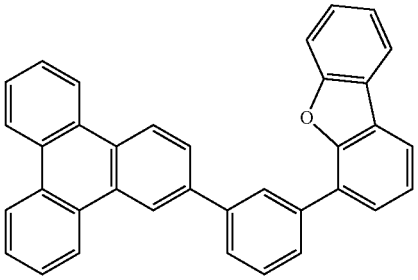

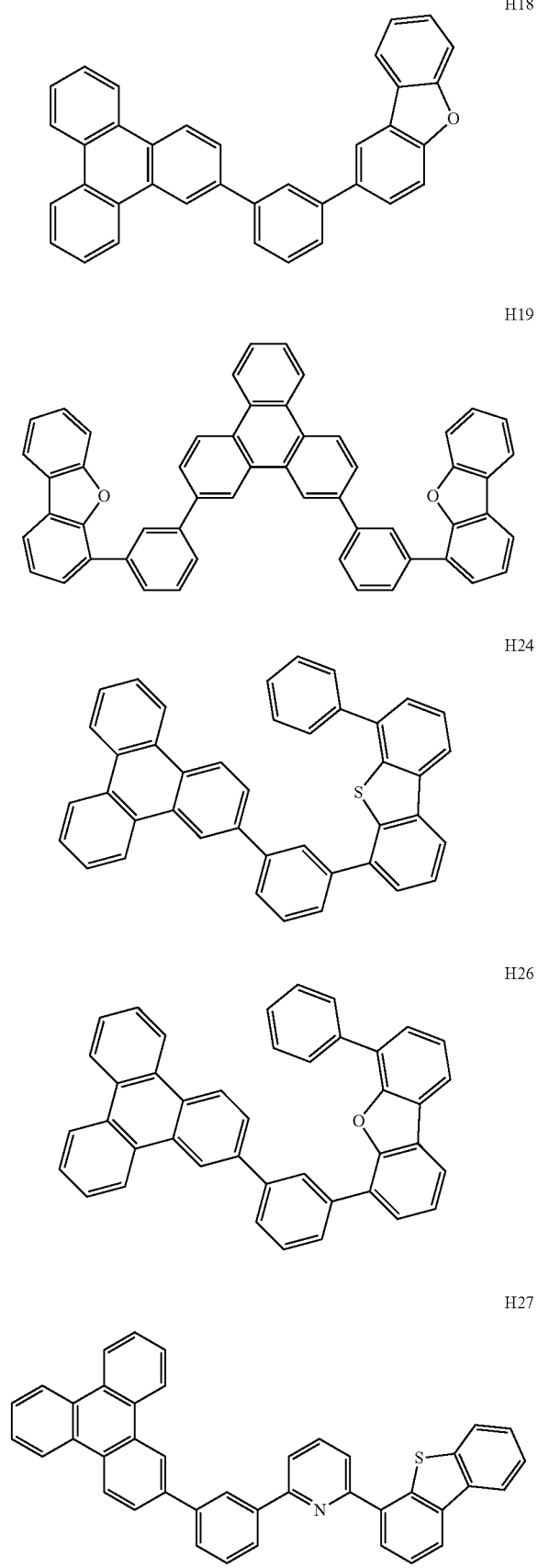
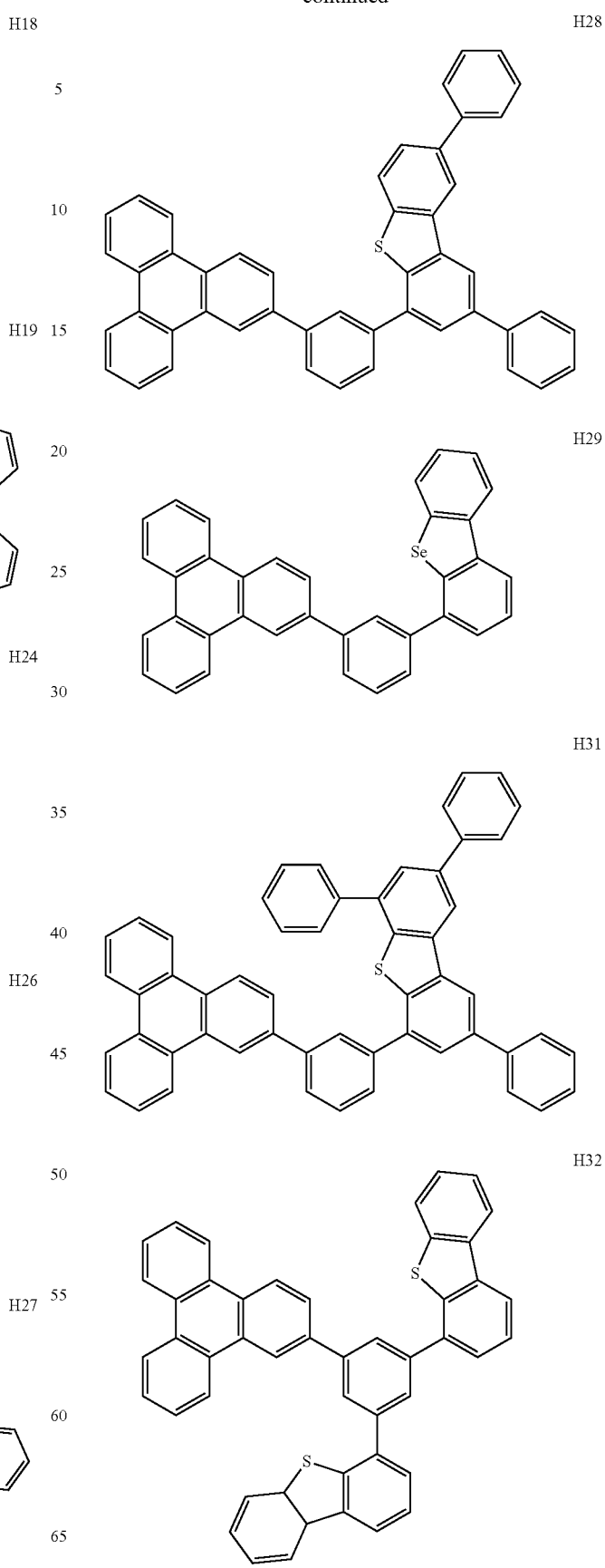

-continued

H33
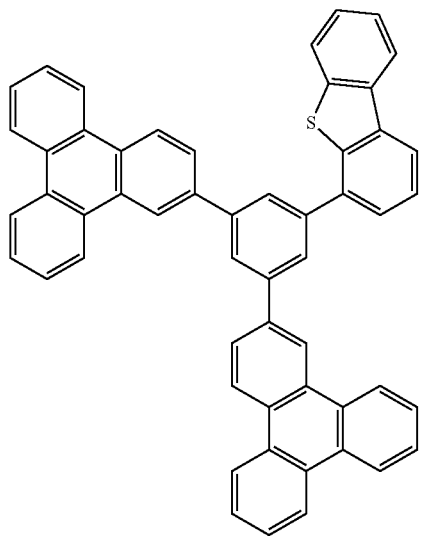

H34
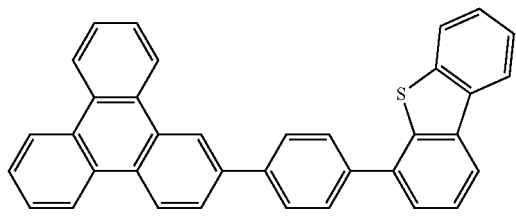

H36
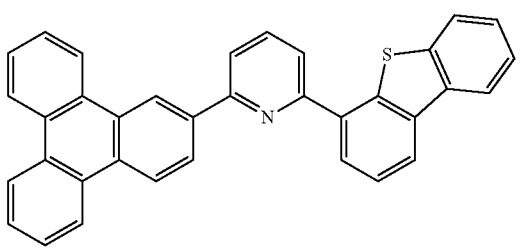

H37
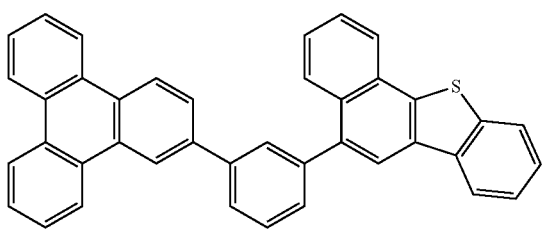

In a particular aspect, the set of non-hydrogen substituents selected for $R_1$, $R_2$, $R_3$, $R_4$, and $R_5$, and the set of non-hydrogen substituents selected for $R_6$, $R_7$, $R_8$ are the same and the method further comprises mixing the first compound and the second compound before depositing the organic composition over the first electrode.

In one aspect, the first compound and the second compound are mixed together and evaporated from a single source.

In one aspect, the organic composition comprises about 5% to about 95% of the first compound and about 5% to about 95% the second compound.

In one aspect, the first compound has a evaporation temperature within 30° C. of the evaporation temperature of the second compound. In another aspect, the first compound has an evaporation temperature within 10° C. of the evaporation temperature of the second compound.

Table 1 shows evaporation temperatures for exemplary first compounds disclosed herein at deposition rate of 2-3 Å/s at $<10^{-7}$ torr with a 50 cm source to substrate distance.

TABLE 1

| Compound | $T_{evap}$ (° C.) at deposition rate of 2-3 Å/s at $<10^{-7}$ torr |
|---|---|
| H2 | 284 |
| H3 | 280 |
| H6 | 248 |
| H7 | 245 |
| H9 | 205 |
| H17 | 240 |
| H24 | 280 |
| H10 | 345 |
| H36 | 275 |
| H28 | 309 |
| H29 | 228 |
| H30 | 272 |
| H31 | 295 |
| H32 | 336 |
| H34 | 250 |
| H37 | 260 |

Table 2 shows evaporation temperatures for preferred second compounds disclosed herein at deposition rate of 2-3 Å/s at $<10^{-7}$ torr with a 50 cm source to substrate distance.

TABLE 2

| Compound | $T_{evap}$ (° C.) at deposition rate of 2-3 Å/s at $<10^{-7}$ torr |
|---|---|
| H201 | 251 |
| H203 | 225 |
| H204 | 228 |
| H206 | 188 |
| H207 | 192 |
| H211 | 269 |
| H215 | 225 |
| H219 | 205 |
| H221 | 208 |
| H225 | 245 |
| H228 | 205 |
| H229 | 252 |
| H244 | 295 |
| H246 | 252 |
| H247 | 265 |
| H251 | 292 |
| H253 | 339 |

In one aspect, the first electrode is an anode and the first organic layer is deposited over the anode.

In one aspect, the method further comprises depositing a second organic layer different from the first organic layer and the first organic layer is a non-emissive layer. In another aspect, the first organic layer is a blocking layer. In yet another aspect, the first organic layer is an emissive layer and the first compound and the second compound are hosts, and the emissive layer further comprises an emissive phosphorescent dopant.

Preferably, the emissive phosphorescent dopant is selected from the group consisting of:

D1
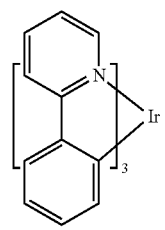
D2
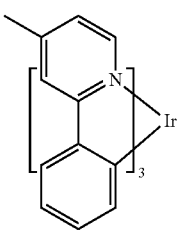
D3
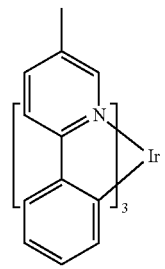
D4
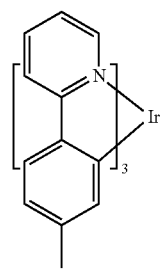
D5
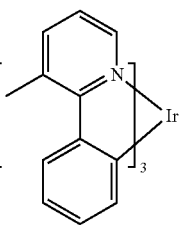
D6
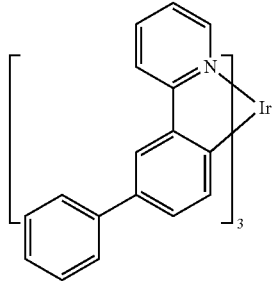
-continued
D7
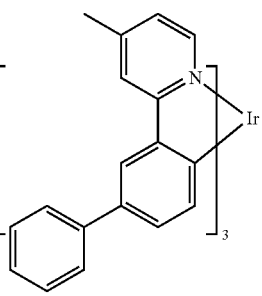
D8
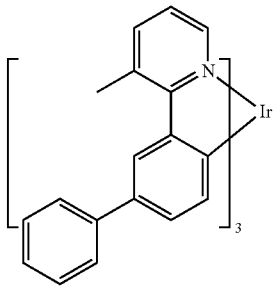
D9
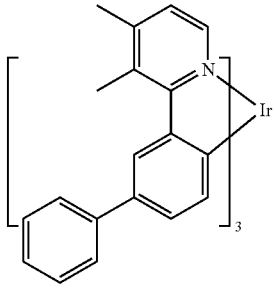
D10
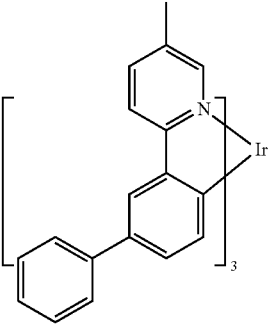
D11
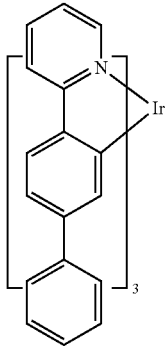

-continued
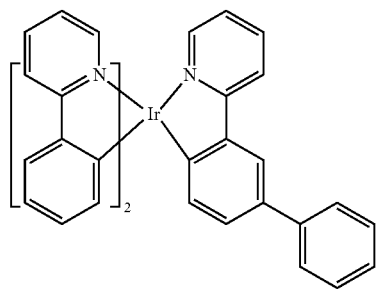
D12
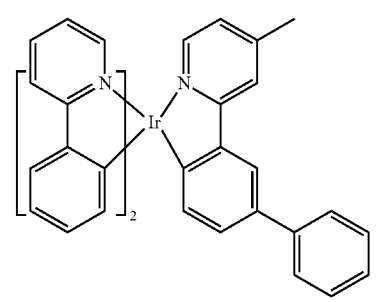
D13
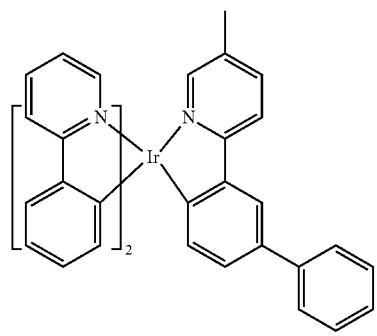
D14
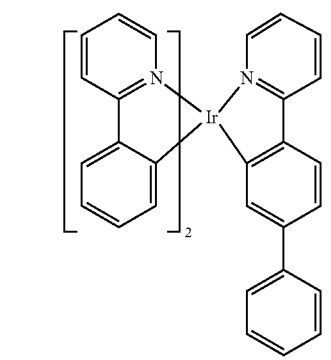
D15
-continued
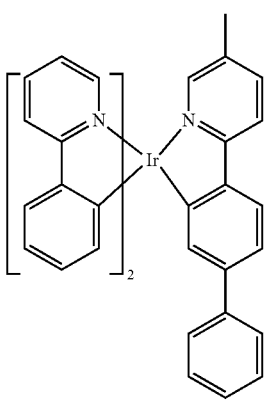
D16
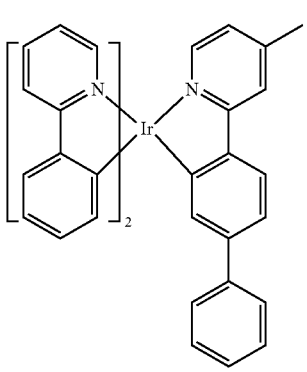
D17
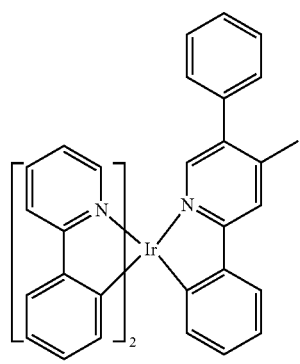
D18
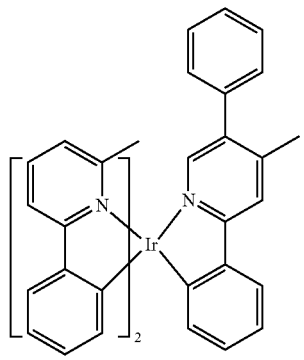
D19

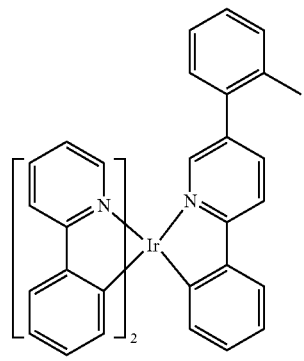
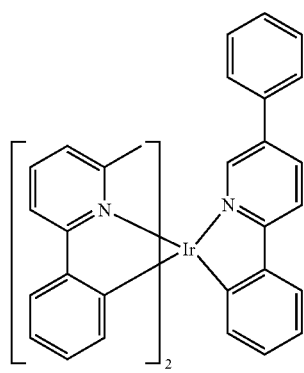
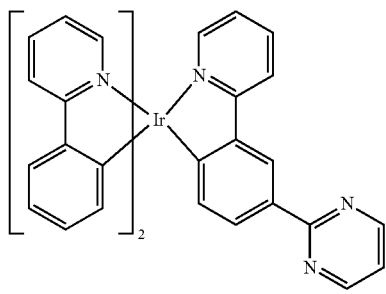
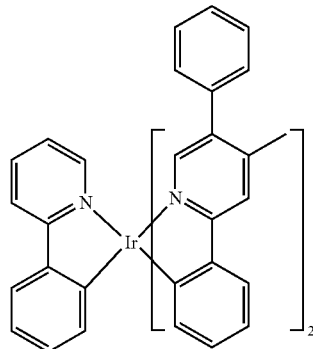

D29 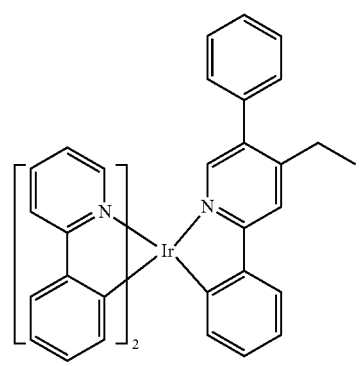
D30 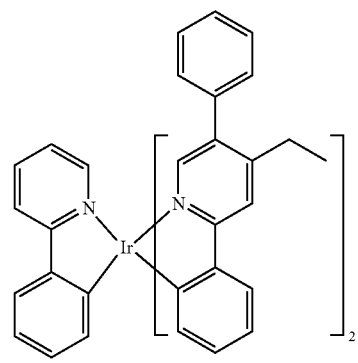
D31 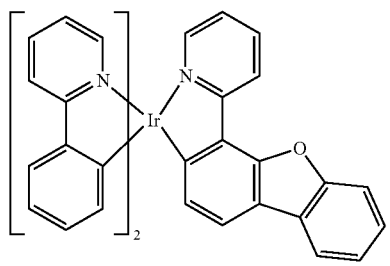
D32 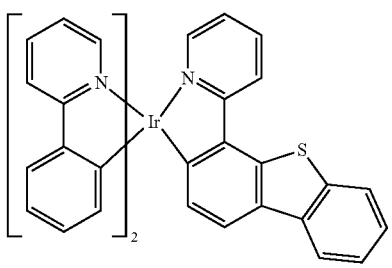
D33 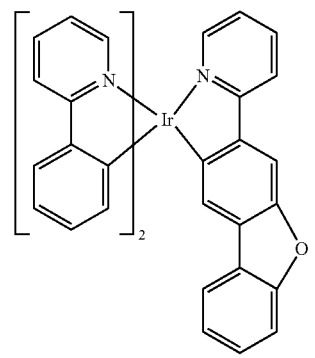
D34 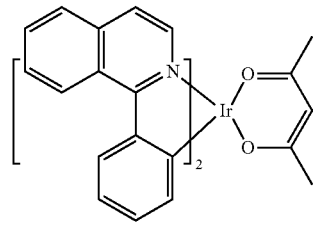
D35 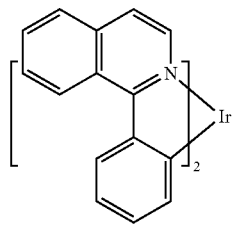
D36 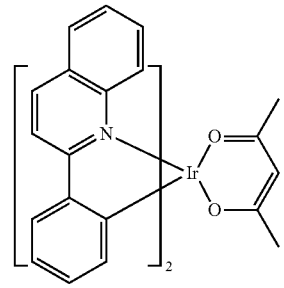
D37 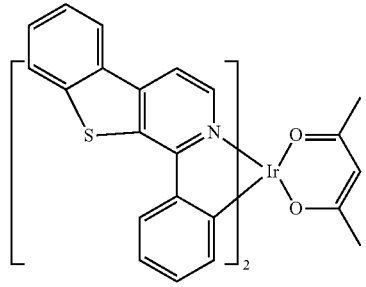
D38 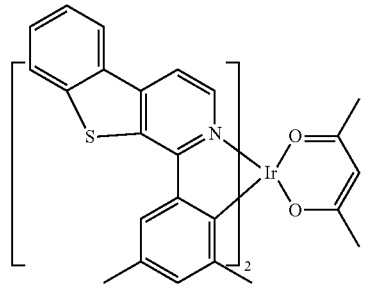
D39 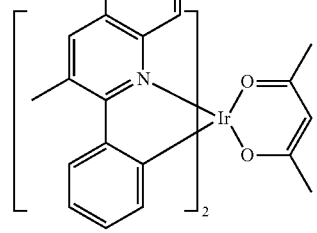

-continued

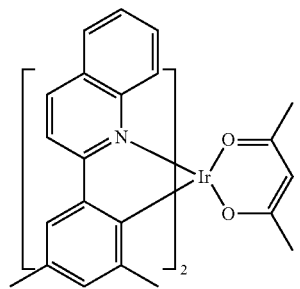
D40

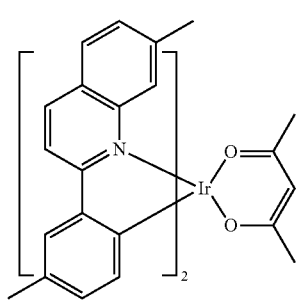
D41

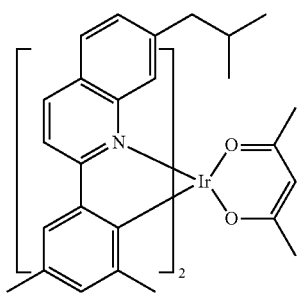
D42

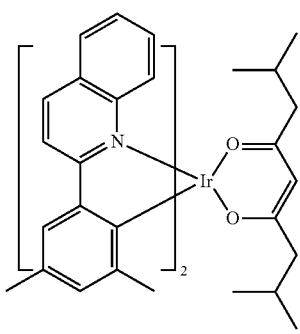
D43

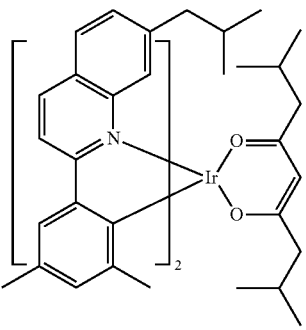
D44

-continued

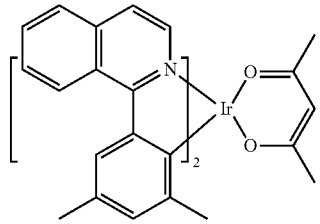
D45

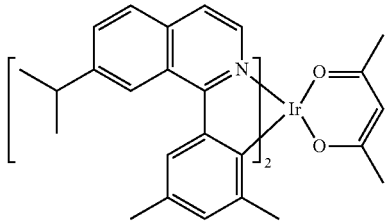
D46

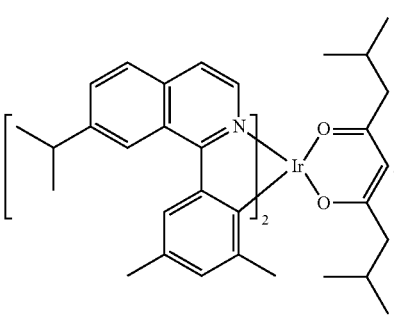
D47

Moreover, a host composition comprising a mixture of a first compound and a second compound is provided. The first compound has the formula:

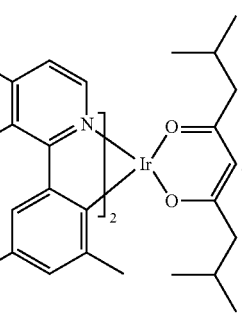

wherein X is Se, S or O. Each of $R_1$, $R_2$, $R_3$, $R_4$, and $R_5$ may represent mono, di, tri, or tetra substitutions. $R_1$, $R_2$, $R_3$, $R_4$, and $R_5$ are independently selected from the group consisting of hydrogen, halogen, alkyl, alkoxy, amino, alkenyl, alkynyl, aryl and heteroaryl. The second compound has the formula: (2):

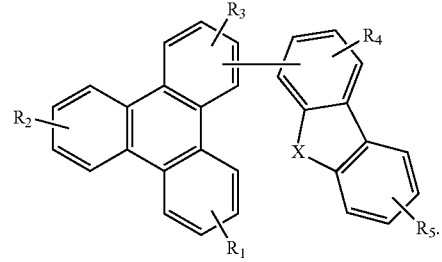

(2)

wherein Y' is an m-valent aromatic hydrocarbon group of 6 to 40 carbon atoms or an m-valent aromatic heterocyclic group of 3 to 40 carbon atoms excluding a group having more than 5 condensed rings;

m denotes an integer of 1 or 2, and when m=2, each Z may be the same or different;

Z is represented by formula (2a);

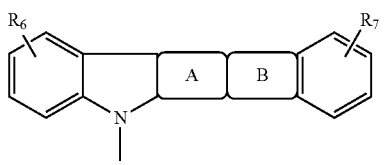

wherein ring A is an aromatic hydrocarbon ring represented by formula (2b):

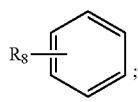

ring B is an heterocyclic ring represented by formula (2c),

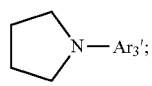

ring A and B are respectively condensed with the adjacent rings;

$R_6$-$R_8$ are independently selected from hydrogen, an aliphatic hydrocarbon group of 1 to 10 carbon atoms, an aromatic hydrocarbon group of 6 to 18 carbon atoms, or an aromatic heterocyclic group of 3 to 17 carbon atoms; and, $Ar_3'$ is an aromatic hydrocarbon group of 6 to 40 carbon atoms, or an aromatic heterocyclic group of 3 to 40 carbon atoms excluding a group having more than 5 condensed rings.

In Formula 2 above, examples of Y' and $Ar_3'$ include a group leaded from benzene, naphthalene, anthracene, pyridine, pyrazine, pyrimidine, pyridajine, triazine, isoindole, indazole, purine, isoquinoline, imidazole, naphthyridine, Phthalazine, quinazoline, quinoxaline, cinnoline, quinoline, pteridine, phenanthridine, acridine, perimidine, phenanthroline, phenazine, carboline, indole, benzoxazole, benzothiazole, carbazole, dibenzofuran, dibenzothiophene, and may arbitrarily connect two or more these groups. Further, in formula 2, Y' is an m-valent group, $Ar_3'$ is a monovalent group.

In one aspect, the first compound has the formula:

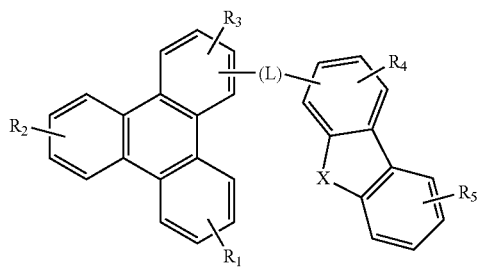

wherein X is Se, S or O. Each of $R_1$, $R_2$, $R_3$, $R_4$, and $R_5$ may represent mono, di, tri, or tetra substitutions. $R_1$, $R_2$, $R_3$, $R_4$, and $R_5$ are independently selected from the group consisting of hydrogen, halogen, alkyl, alkoxy, amino, alkenyl, alkynyl, aryl and heteroaryl. L is selected from the group consisting of benzene, biphenyl, naphthalene, triphenylene, carbazole, and heteroaromatic analogs thereof. The second compound has the formula (2):

(2)

wherein Y' is an m-valent aromatic hydrocarbon group of 6 to 40 carbon atoms or an m-valent aromatic heterocyclic group of 3 to 40 carbon atoms excluding a group having more than 5 condensed rings;

m denotes an integer of 1 or 2, and when m=2, each Z may be the same or different;

Z is represented by formula (2a):

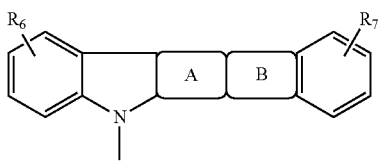

wherein ring A is an aromatic hydrocarbon ring represented by formula (2b):

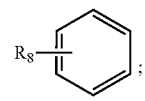

ring B is an heterocyclic ring represented by formula (2c),

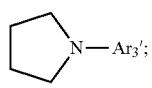

ring A and B are respectively condensed with the adjacent rings;

$R_6R_8$ are each independently selected from hydrogen, an aliphatic hydrocarbon group of 1 to 10 carbon atoms, an aromatic hydrocarbon group of 6 to 18 carbon atoms, or an aromatic heterocyclic group of 3 to 17 carbon atoms; and, $Ar_3'$ is an aromatic hydrocarbon group of 6 to 40 carbon atoms, or an aromatic heterocyclic group of 3 to 40 carbon atoms excluding a group having more than 5 condensed rings.

In Formula 2, examples of Y' and $Ar_3'$ include benzene, naphthalene, anthracene, pyridine, pyrazine, pyrimidine, pyridajine, triazine, isoindole, indazole, purine, isoquinoline, imidazole, naphthyridine, Phthalazine, quinazoline, quinoxaline, cinnoline, quinoline, pteridine, phenanthridine, acridine, perimidine, phenanthroline, phenazine, carboline, indole, benzoxazole, benzothiazole, carbazole, dibenzofuran, dibenzothiophene, and may arbitrarily connect two or more these groups. Further, in Formula 2, Y' is an m-valent group and Ar₃' is a monovalent group.

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

In addition to and/or in combination with the materials disclosed herein, many hole injection materials, hole transporting materials, host materials, dopant materials, exiton/hole blocking layer materials, electron transporting and electron injecting materials may be used in an OLED.

Hole Injection Materials/Hole Transporting Materials:

A hole injecting/transporting material to be used in the present invention is not particularly limited, and any compound may be used as long as the compound is typically used as a hole injecting/transporting material. Examples of the material include, but are not limited to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as MoO$_x$; an organic compound with extremely deep LUMO, such as 1,4,5,8,9,12-Hexaazatriphenylenehexacarbonitrile; a metal complex, and a cross-linkable compounds.

Examples of aromatic amine derivatives used in HIL or HTL include, but are not limited to the following general structures:

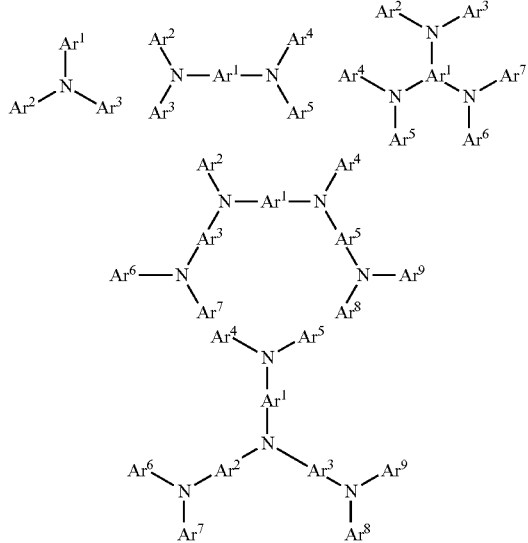

Each of Ar¹ to Ar⁹ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar is further substituted by a substituent selected from the group consisting of hydrogen, alkyl, alkoxy, amino, alkenyl, alkynyl, arylalkyl, heteroalkyl, aryl and heteroaryl.

In one aspect, Ar¹ to Ar⁹ is independently selected from the group consisting of:

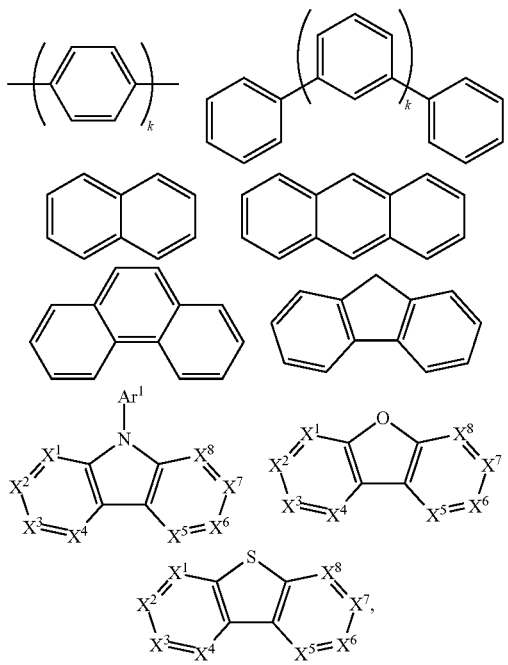

k is an integer from 1 to 20; X¹ to X⁸ is CH or N; Ar¹ has the same group defined above.

Examples of metal complexes used in HIL or HTL include, but are not limited to the following general formula:

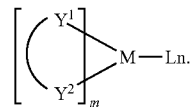

M is a metal, having an atomic weight greater than 40; (Y¹-Y²) is a bidentate ligand, Y1 and Y² are independently selected from C, N, O, P, and S; L is an ancillary ligand; m is an integer value from 1 to the maximum number of ligands that may be attached to the metal; and m+n is the maximum number of ligands that may be attached to the metal.

In one aspect, $(Y^1-Y^2)$ is a 2-phenylpyridine derivative.

In another aspect, $(Y^1-Y^2)$ is a carbene ligand.

In another aspect, M is selected from Ir, Pt, Os, and Zn.

In a further aspect, the metal complex has a smallest oxidation potential in solution vs. $Fc^+/Fc$ couple less than about 0.6 V.

Host Materials:

The light emitting layer of the organic EL device of the present invention preferably contains at least an organometallic complex as light emitting material, and may contain a host material using the organometallic complex as a dopant material. Examples of the host material are not particularly limited, and any metal complexes or organic compounds may be used as long as the triplet energy of the host is larger than that of the dopant.

Examples of metal complexes used as host are preferred to have the following general formula:

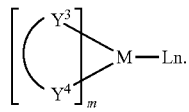

M is a metal; $(Y^3-Y^4)$ is a bidentate ligand, $Y^3$ and $Y^4$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, the metal complexes are:

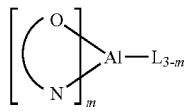 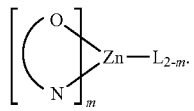

(O—N) is a bidentate ligand, having metal coordinated to atoms O and N.

In another aspect, M is selected from Ir and Pt.

In a further aspect, $(Y^3-Y^4)$ is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, alkyl, alkoxy, amino, alkenyl, alkynyl, arylalkyl, heteroalkyl, aryl and heteroaryl.

In one aspect, host compound contains at least one of the following groups in the molecule:

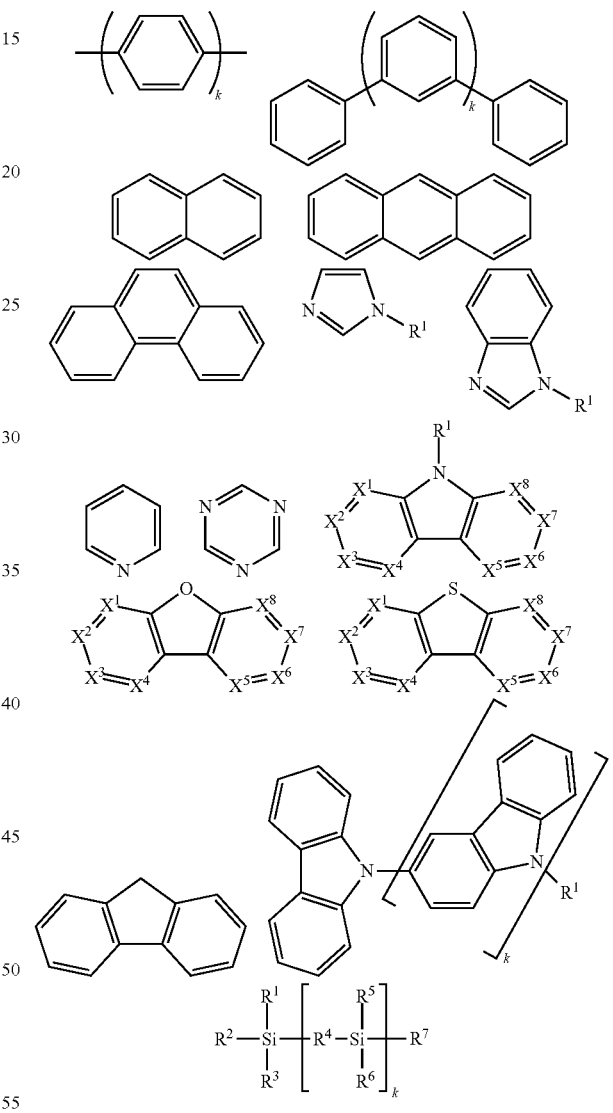

$R^1$ to $R^7$ is independently selected from the group consisting of hydrogen, alkyl, alkoxy, amino, alkenyl, alkynyl, arylalkyl, heteroalkyl, aryl and heteroaryl, when it is aryl or heteroaryl, it has the similar definition as Ar mentioned above.

k is an integer from 0 to 20.

$X^1$ to $X^8$ is selected from CH or N.

Hole Blocking Materials:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, a compound used in HBL contains the same molecule used as host described above.

In another aspect, a compound used in HBL contains at least one of the following groups in the molecule:

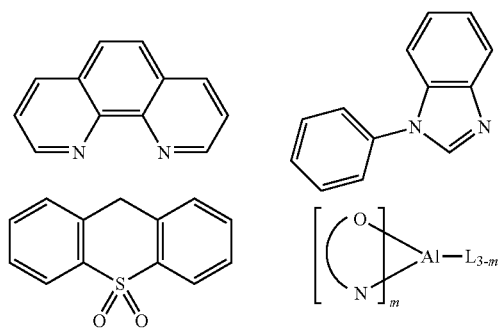

k is an integer from 0 to 20; L is an ancillary ligand, m is an integer from 1 to 3.

Electron Transporting Materials:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, a compound used in ETL contains at least one of the following groups in the molecule:

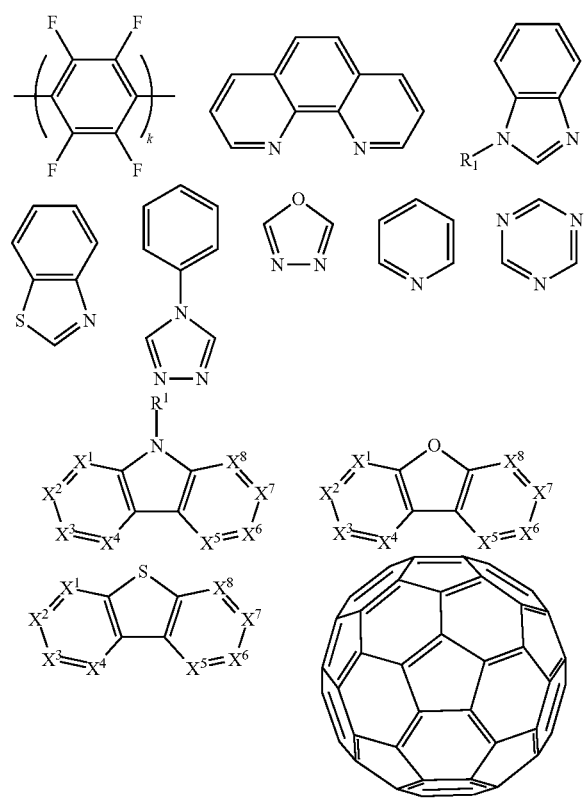

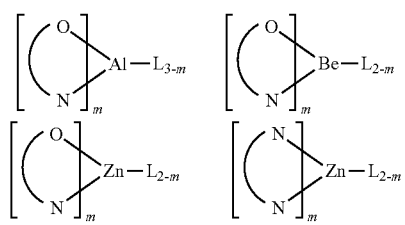

$R^1$ is selected from the group consisting of hydrogen, alkyl, alkoxy, amino, alkenyl, alkynyl, arylalkyl, heteroalkyl, aryl and heteroaryl, when it is aryl or heteroaryl, it has the similar definition as Ar mentioned above.

$Ar^1$ to $Ar^3$ has the similar definition as Ar mentioned above.

k is an integer from 0 to 20.

$X^1$ to $X^8$ is selected from CH or N.

In another aspect, the metal complexes used in ETL contain, but are not limited to one or more of the following general formulae:

(O—N) or (N—N) is a bidentate ligand, having metal coordinated to atoms O, N or N, N; L is an ancillary ligand; m is an integer value from 1 to the maximum number of ligands that may be attached to the metal.

Device Examples

Representative device examples are fabricated by high vacuum ($<10^{-7}$ Torr) thermal evaporation. The anode electrode consists of ~800 Å of indium tin oxide (ITO). The cathode consists of 10 Å of LiF followed by 1,000 Å of Al. All representative device examples are encapsulated with a glass lid sealed with an epoxy resin in a nitrogen glove box (<1 ppm of $H_2O$ and $O_2$) and a moisture getter is incorporated inside the package.

The organic stack in representative device examples consists of (sequentially, from the ITO surface): 100 Å of LG101 (available from L.G. Chem, Seoul, South Korea) as the hole injection layer (HIL), 300 Å of NPD as the hole transporting layer (HTL), 300 Å of the first compound, for Example 1, H2, and the second compound, for Example 1, H251, doped with emissive dopant D4 as the emissive layer (EML), 100 Å of NS60 (available from Nippon Steel Chemical Co., Ltd., Japan.) as the ETL2 and 400 Å of $Alq_3$ as the ETL1. In some embodiments of the present invention, the first and second compound host materials may be co-evaporated from their individual sources. Certain first and second compound host combinations such as those shown in Table 3 for representative Device Examples 1-19 may be suitable for pre-mixing and evaporation from a common source.

TABLE 3

| Device | First Compound | Second Compound |
|---|---|---|
| Example 1 | H2 | H251 |
| Example 2 | H6 | H225 |
| Example 3 | H6 | H201 |
| Example 4 | H6 | H229 |
| Example 5 | H7 | H225 |
| Example 6 | H9 | H219 |
| Example 7 | H9 | H228 |

TABLE 3-continued

| Device | First Compound | Second Compound |
|---|---|---|
| Example 8 | H9 | H221 |
| Example 9 | H17 | H225 |
| Example 10 | H29 | H203 |
| Example 11 | H29 | H215 |
| Example 12 | H29 | H204 |
| Example 13 | H30 | H247 |
| Example 14 | H31 | H251 |
| Example 15 | H31 | H244 |
| Example 16 | H32 | H253 |
| Example 17 | H34 | H229 |
| Example 18 | H34 | H246 |
| Example 19 | H36 | H211 |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A first device comprising an organic light emitting device, further comprising:
   a first electrode;
   a second electrode; and
   a first organic layer, disposed between the first electrode and the second electrode, wherein the first organic layer comprises an organic composition;
   wherein the organic composition comprises
   a first compound having the formula:

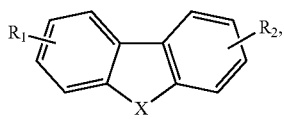

wherein X is S or O;
   wherein $R_1$ and $R_2$ are substituents independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C\equiv CHC_nH_{2n+1}$, $Ar_1$, $Ar_1-Ar_2$, $C_nH_{2n}-Ar_1$, and no substitution;
   wherein each of $R_1$ and $R_2$ may represent mono, di, tri, or tetra substitutions;
   wherein n is 1, 2, 3, 4, 5, 6, 7, 8, 9, or 10;
   wherein $Ar_1$ and $Ar_2$ are independently selected from the group consisting of benzene, biphenyl, naphthalene, triphenylene, carbazole, and heteroaromatic analogs thereof; and
   wherein at least one of $R_1$ and $R_2$ includes a triphenylene group; and
   a second compound having the formula (1):

(1)

wherein
   Y is an m-valent aromatic hydrocarbon group of 6 to 50 carbon atoms or an m-valent aromatic heterocyclic group of 3 to 50 carbon atoms excluding a group having more than 5 condensed rings;
   m denotes an integer of 1 to 3, such that when m is greater than 2, each Z may be the same or different;
   Z is represented by formula (1a):

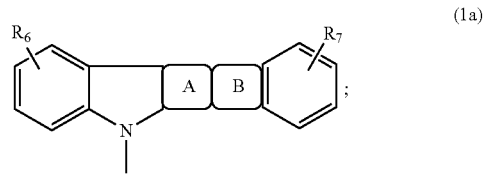

(1a)

wherein
   ring A is an aromatic hydrocarbon ring represented by formula (1b)

(1b)

ring B is a heterocyclic ring represented by formula (1c)

(1c)

ring A and B are respectively condensed with the adjacent rings;
   $R_6$, $R_7$, and $R_8$ are each independently selected from the group consisting of hydrogen, an aliphatic hydrocarbon group of 1 to 10 carbon atoms, an aromatic hydrocarbon group of 6 to 18 carbon atoms, and an aromatic heterocyclic group of 3 to 17 carbon atoms; and
   $Ar_3$ is an aromatic hydrocarbon group of 6 to 50 carbon atoms, or an aromatic heterocyclic group of 3 to 50 carbon atoms excluding a group having more than 5 condensed rings.

2. The first device of claim 1, wherein the first compound has the formula:

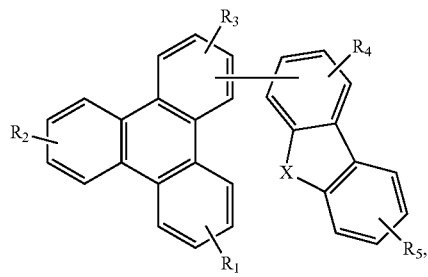

wherein X is S or O;
   wherein each of $R_1$, $R_2$, $R_3$, $R_4$, and $R_5$ may represent mono, di, tri, or tetra substitutions;

wherein $R_1$, $R_2$, $R_3$, $R_4$, and $R_5$ are independently selected from the group consisting of hydrogen, halogen, alkyl, alkoxy, amino, alkenyl, alkynyl, aryl and heteroaryl; and wherein the second compound has the formula (2):

(2)

wherein

Y' is an m-valent aromatic hydrocarbon group of 6 to 40 carbon atoms or an m-valent aromatic heterocyclic group of 3 to 40 carbon atoms excluding a group having more than 5 condensed rings;

m denotes an integer of 1 or 2, and when m=2, each Z may be the same or different;

Z is represented by formula (2a):

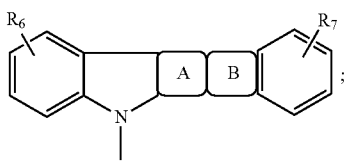
(2a)

wherein ring A is an aromatic hydrocarbon ring represented by formula (2b),

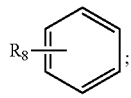
(2b)

ring B is a heterocyclic ring represented by formula (2c),

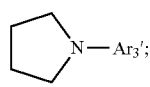
(2c)

ring A and B are respectively condensed with the adjacent rings;

$R_6$, $R_7$, and $R_8$ are independently selected from the group consisting of hydrogen, an aliphatic hydrocarbon group of 1 to 10 carbon atoms, an aromatic hydrocarbon group of 6 to 18 carbon atoms, and an aromatic heterocyclic group of 3 to 17 carbon atoms; and $Ar_a'$ is an aromatic hydrocarbon group of 6 to 40 carbon atoms, or an aromatic heterocyclic group of 3 to 40 carbon atoms excluding a group having more than 5 condensed rings.

3. The first device of claim 2, wherein the set of non-hydrogen substituents selected for $R_1$, $R_2$, $R_3$, $R_4$, and $R_5$, and the set of non-hydrogen substituents selected for $R_6$, $R_7$, and $R_8$ are the same.

4. The first device of claim 1, wherein the first compound has the formula:

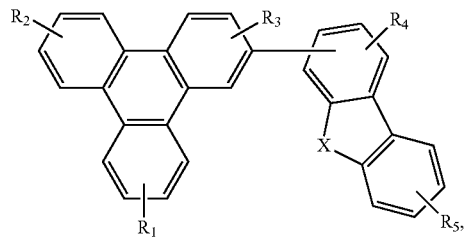

wherein X is S or O;

wherein each of $R_1$, $R_2$, $R_3$, $R_4$, and $R_5$ may represent mono, di, tri, or tetra substitutions;

wherein $R_1$, $R_2$, $R_3$, $R_4$, and $R_5$ are independently selected from the group consisting of hydrogen, halogen, alkyl, alkoxy, amino, alkenyl, alkynyl, aryl and heteroaryl; and wherein the second compound has the formula (3):

(3)

wherein

Y" is a monovalent aromatic heterocyclic group of 3 to 30 carbon atoms excluding a group having more than 5 condensed rings;

m denote an integer of 1;

Z is a represented by formula (3a), and

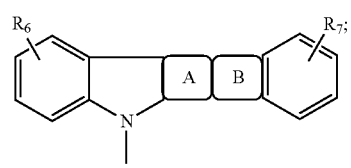
(3a)

wherein ring A is an aromatic hydrocarbon ring represented by formula (3b),

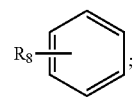
(3b)

ring B is a heterocyclic ring represented by formula (3c),

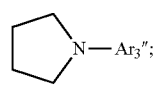
(3c)

ring A and ring B are respectively condensed with the adjacent rings;

$R_6$, $R_7$, and $R_8$ are independently selected from the group consisting of hydrogen, an aliphatic hydrocarbon group of 1 to 10 carbon atoms, an aromatic hydrocarbon group of 6 to 18 carbon atoms, and an aromatic heterocyclic group of 3 to 17 carbon atoms; and $Ar_a'$ is an aromatic hydrocarbon group of 6 to 30 carbon atoms, or an aromatic heterocyclic group of 3 to 30 carbon atoms excluding a group having more than 5 condensed rings.

5. The first device of claim 4, wherein the first compound is selected from the group consisting of:
H1
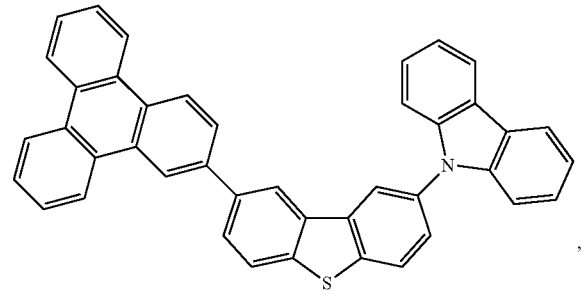
H2
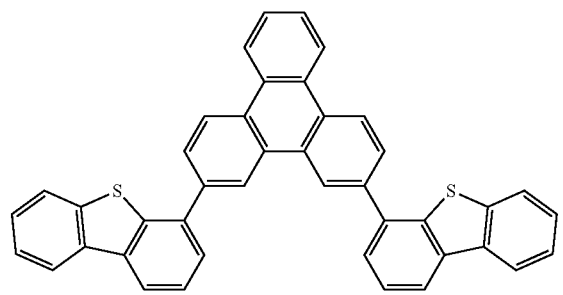
H4
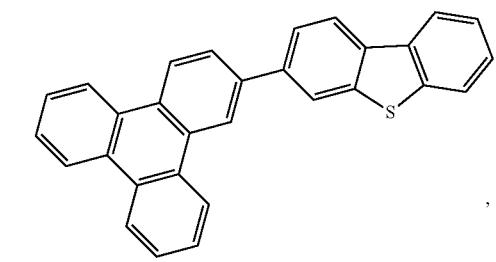
H5
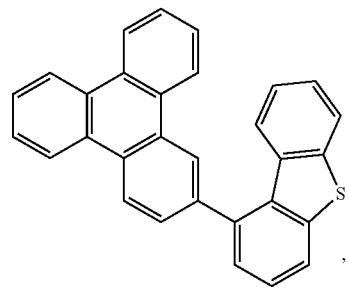
-continued
H9
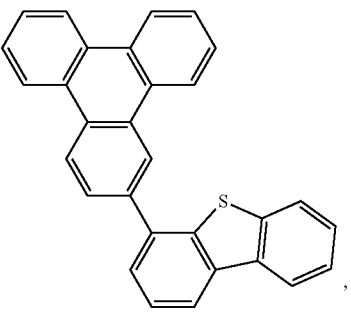
H10
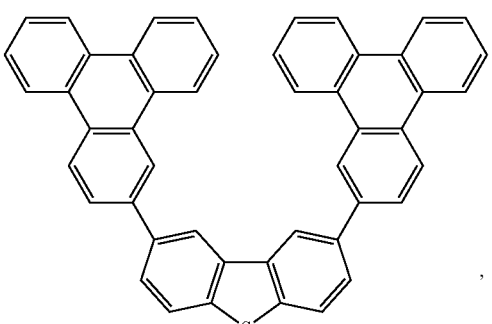
H11
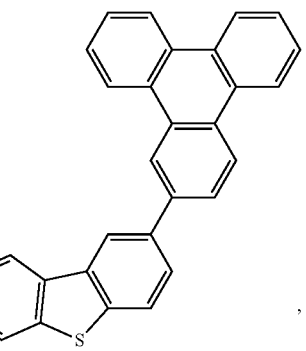
H12
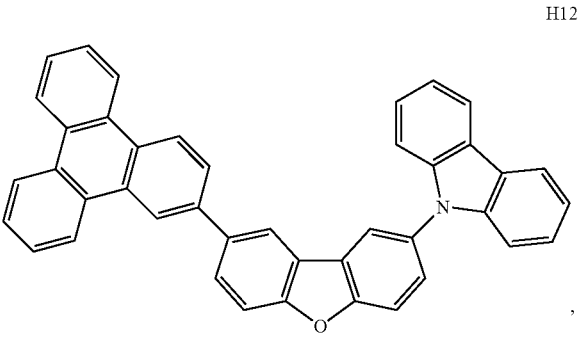

H13
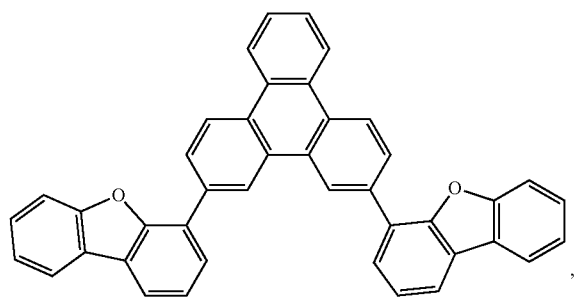
H15
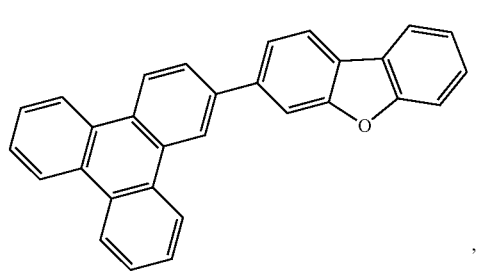
H16
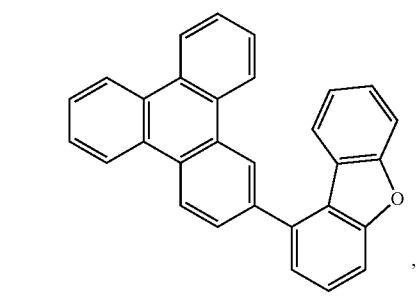
H20
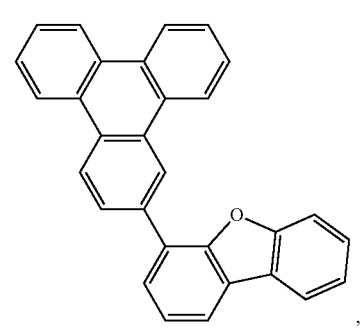
H21
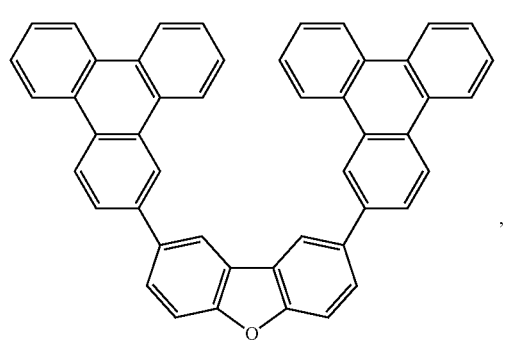
H22
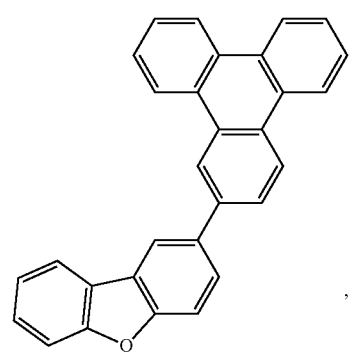
H23
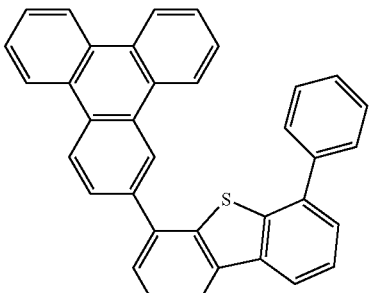
H25
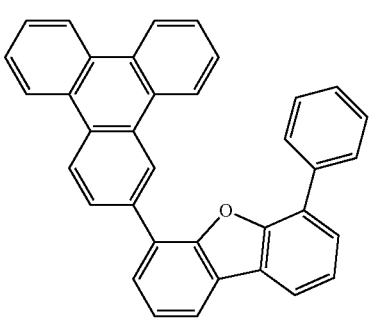
H30
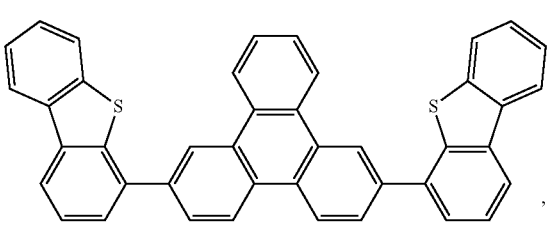
and
H35
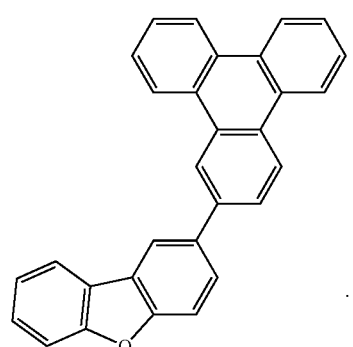
6. The first device of claim 5 wherein the second compound is selected from the group consisting of:

125                126
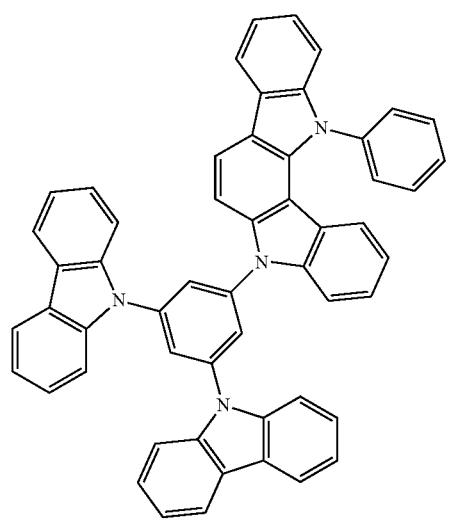   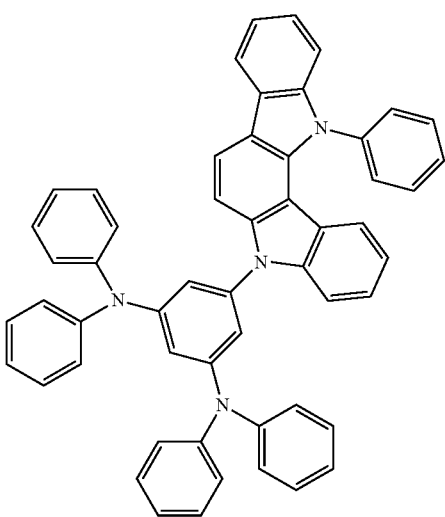
H201                   H202
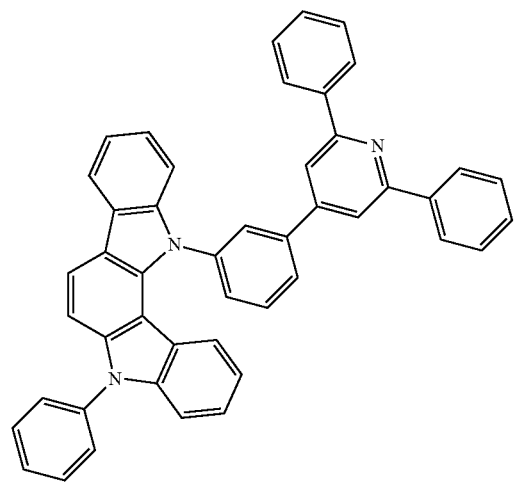   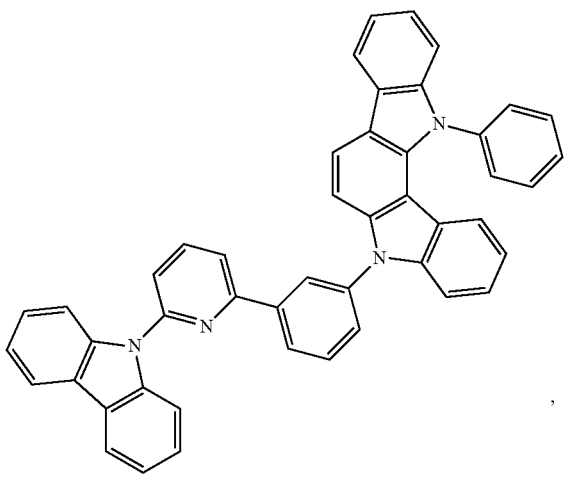
H203                   H204
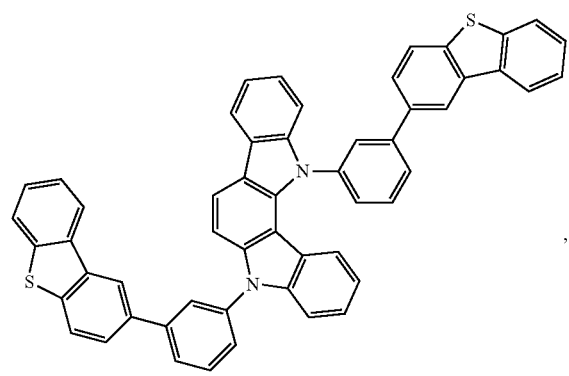   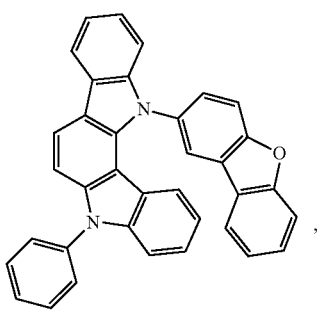
H205                   H206

-continued
H207
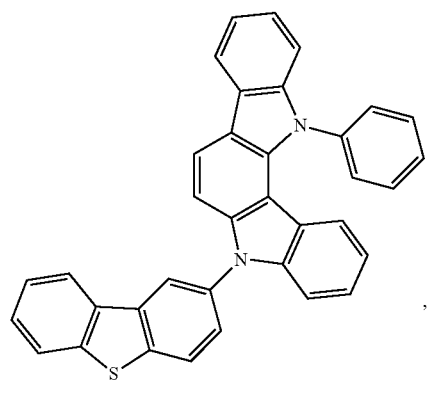
H208
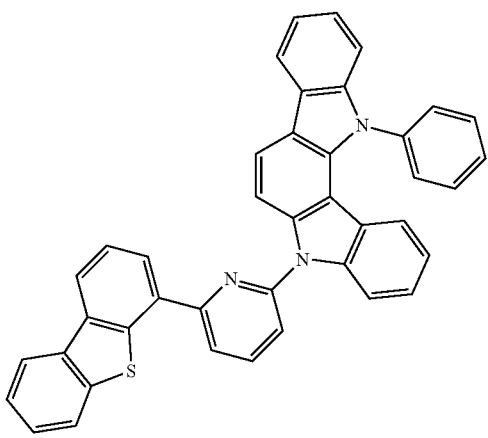
H209
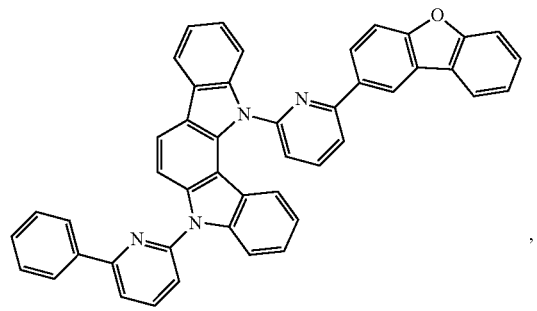
H210
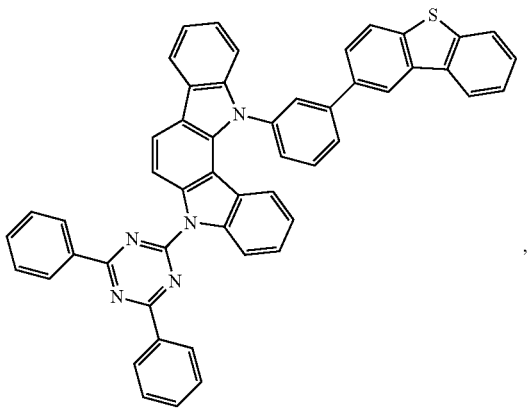
H211
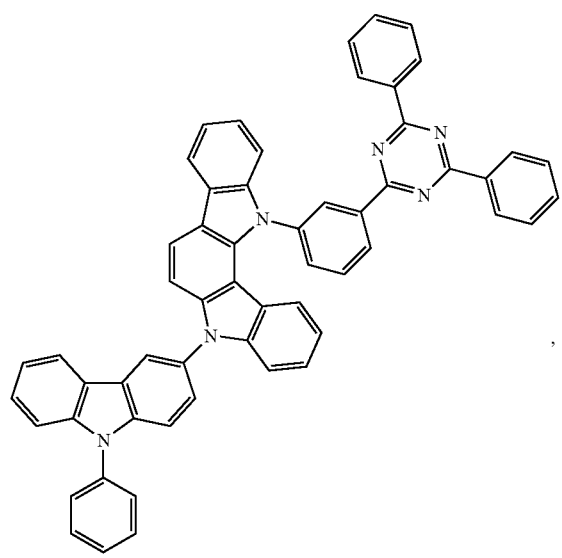
H212
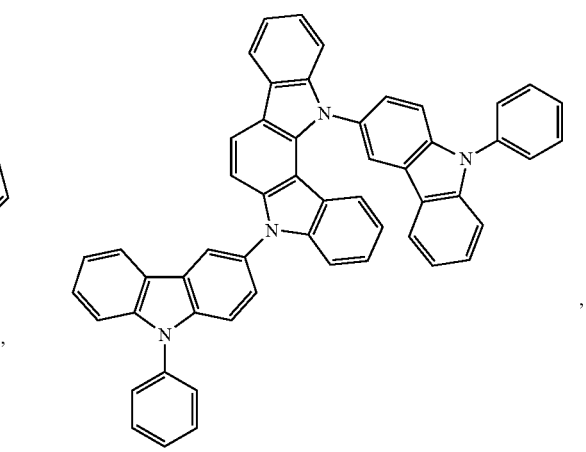

-continued
H213
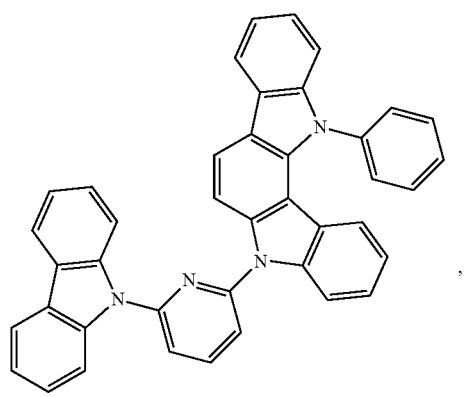
H214
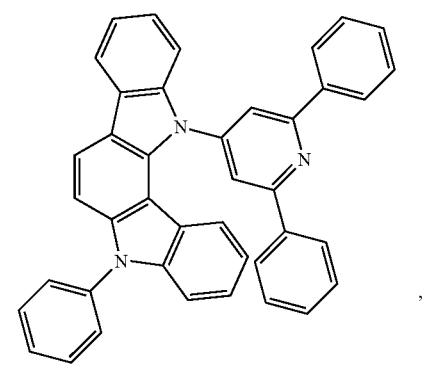
H215
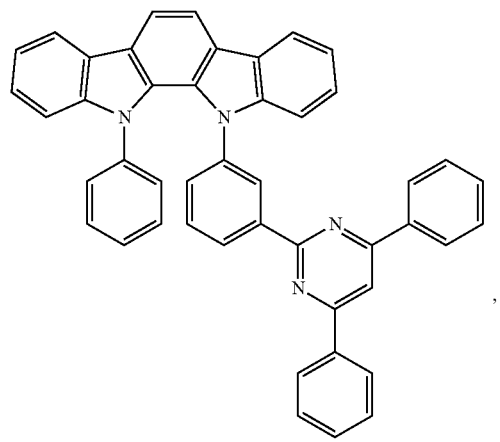
H216
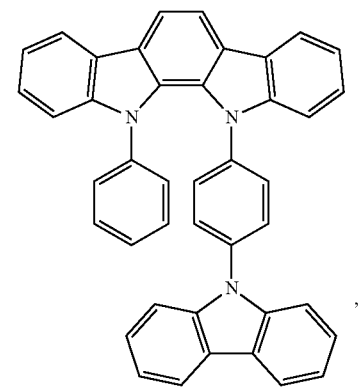
H217
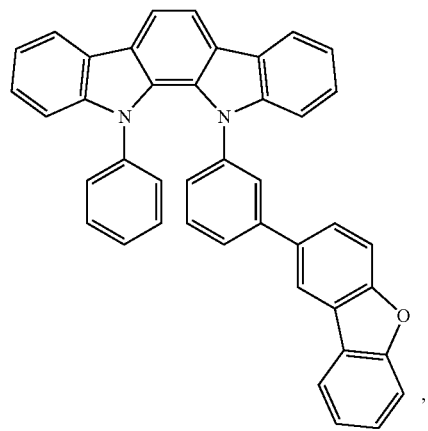
H218
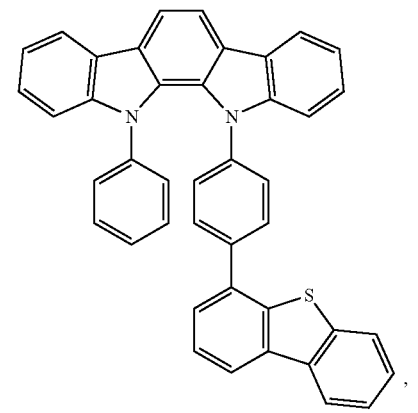
H219
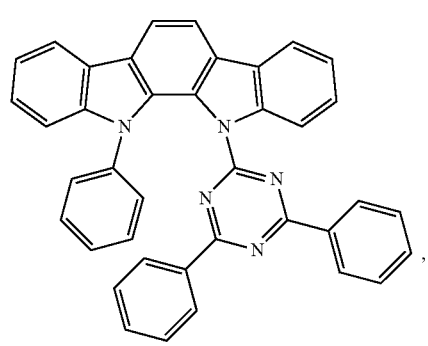
H220
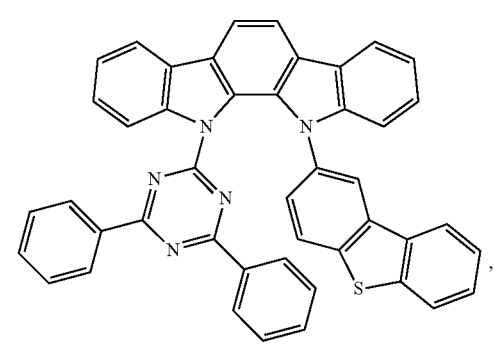

-continued
H221
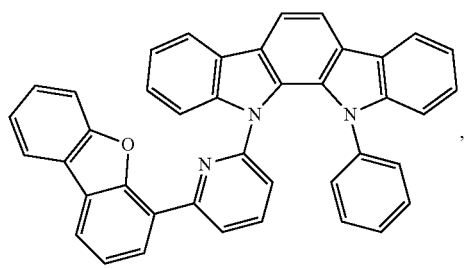
H222
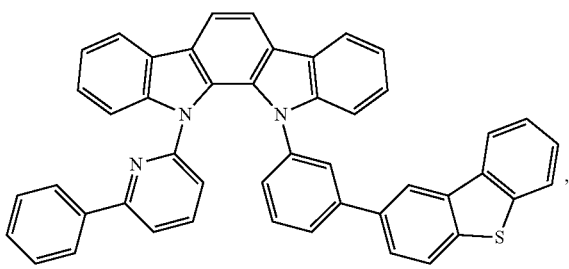
H223
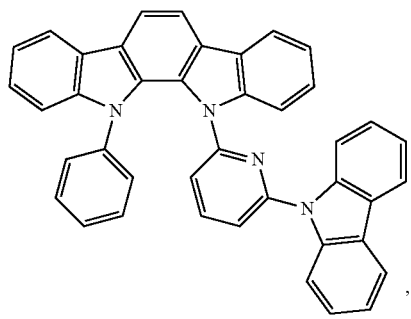
H224
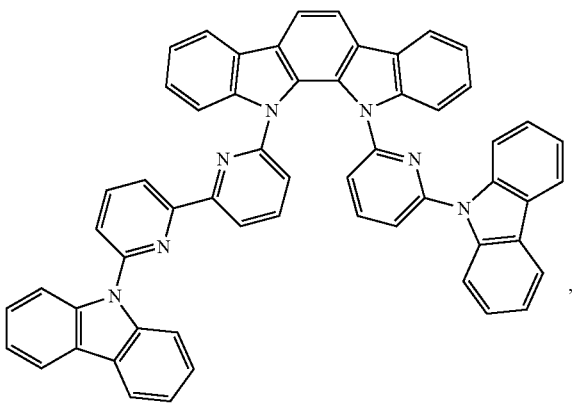
H225
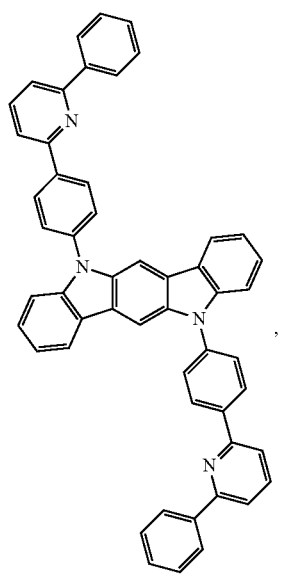
H226
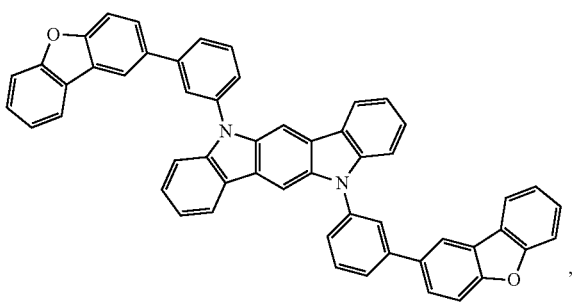

-continued
H227
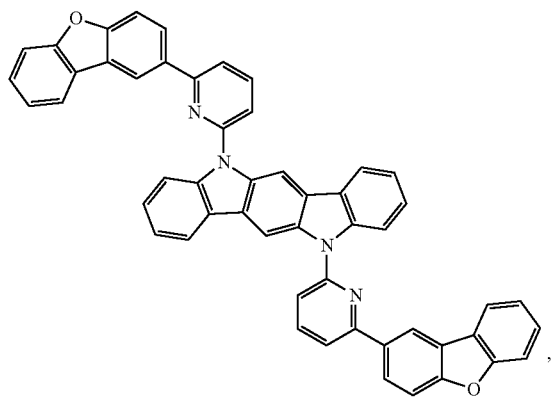
H228
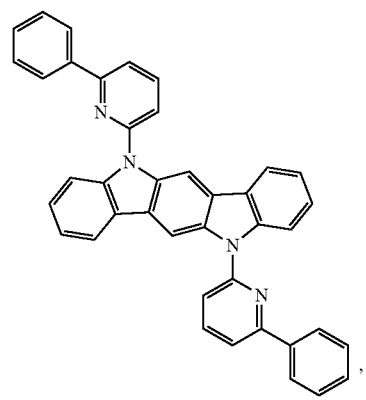
H229
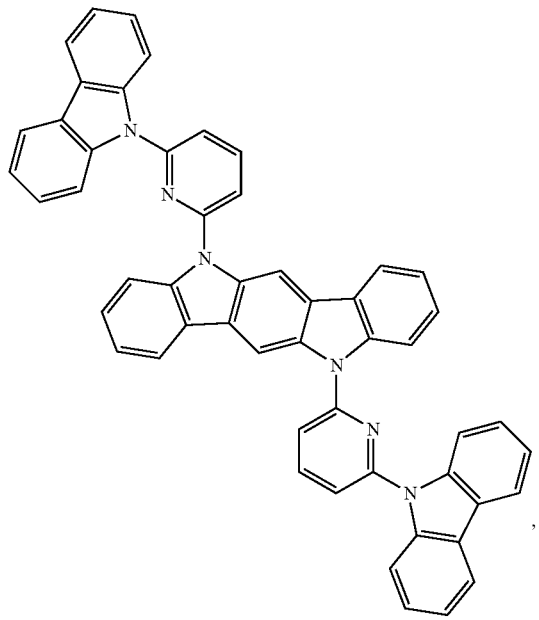
H230
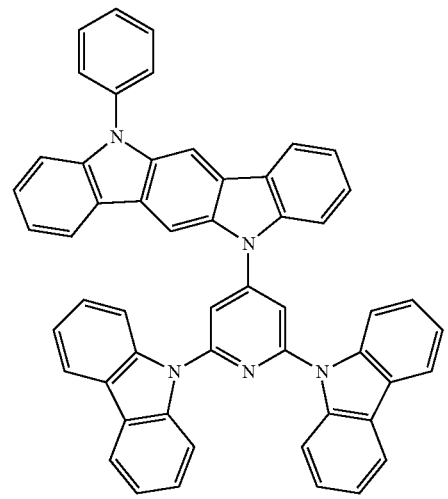
H231
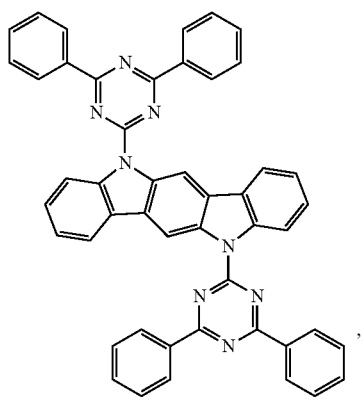
H232
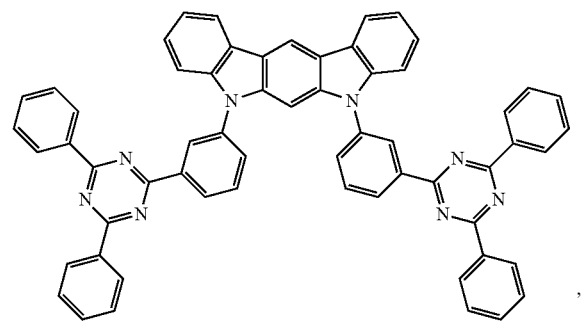

H233
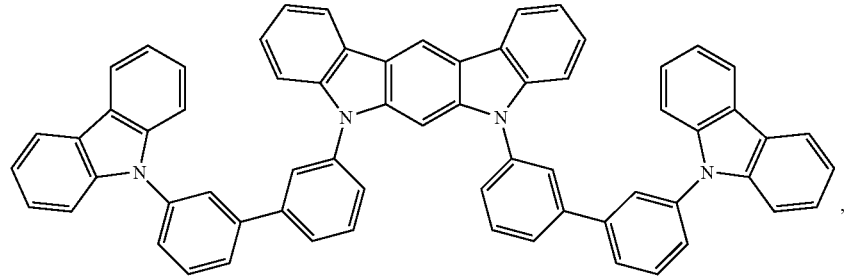
H234
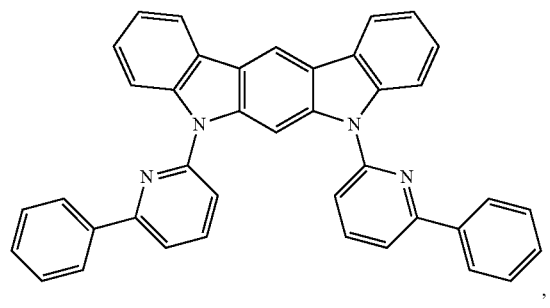
H235
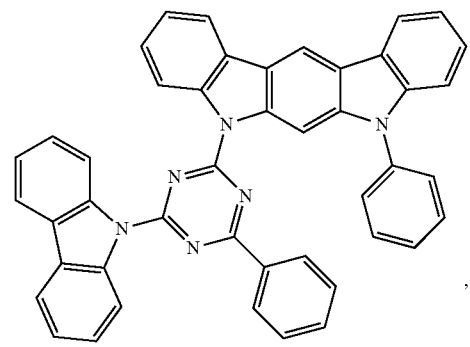
H236
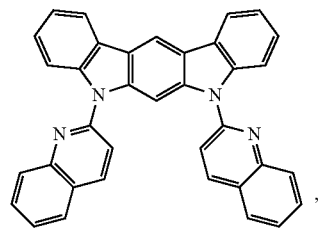
H237
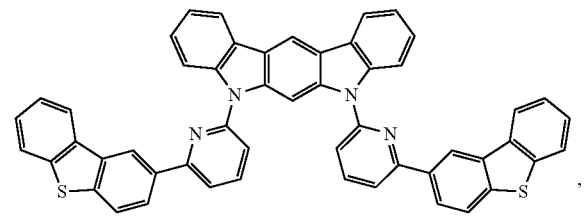
H238
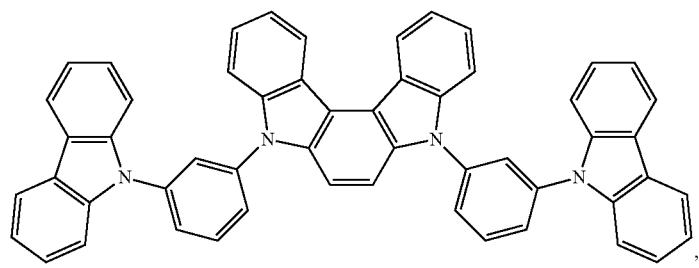
H239
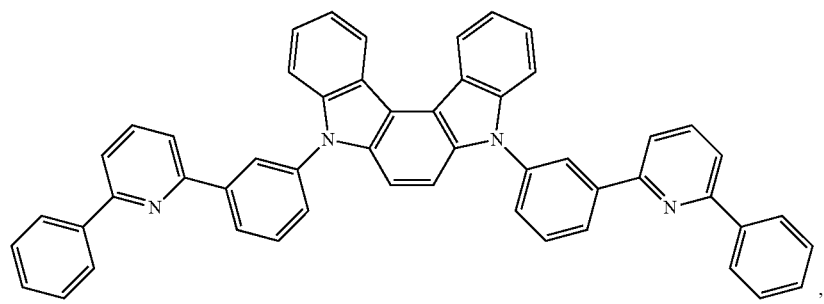

-continued
H240
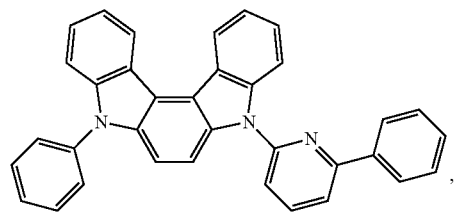
H241
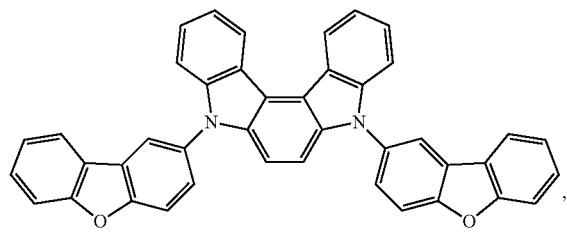
H242
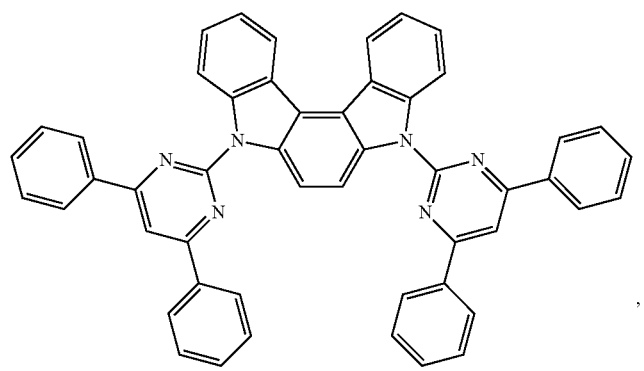
H243
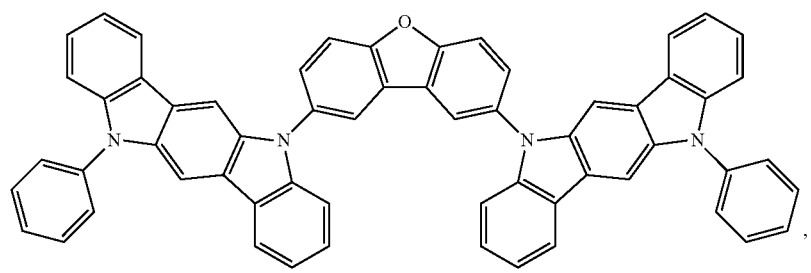
H244
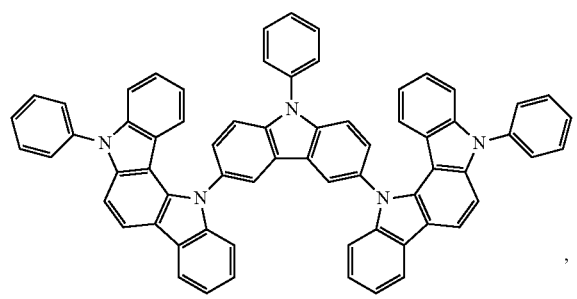
H245
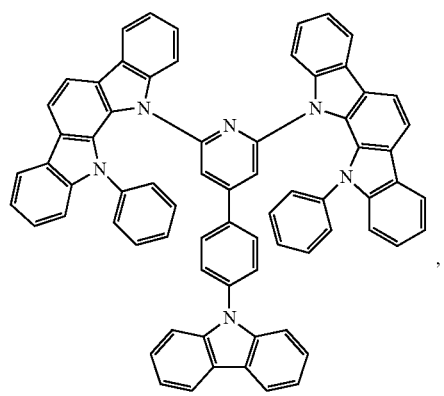

-continued
H246
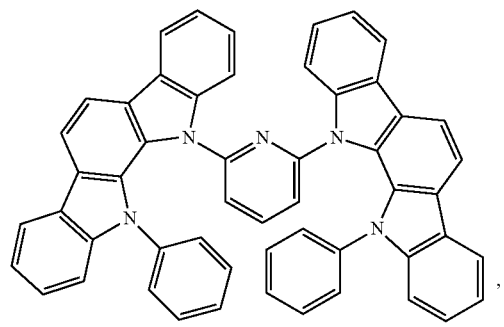
H247
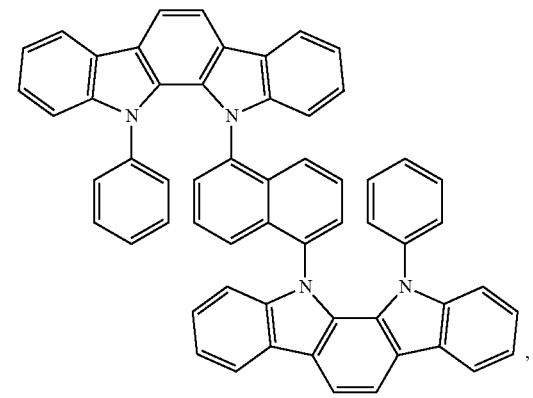
H248
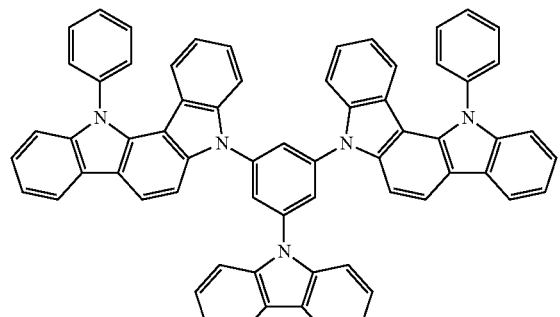
H249
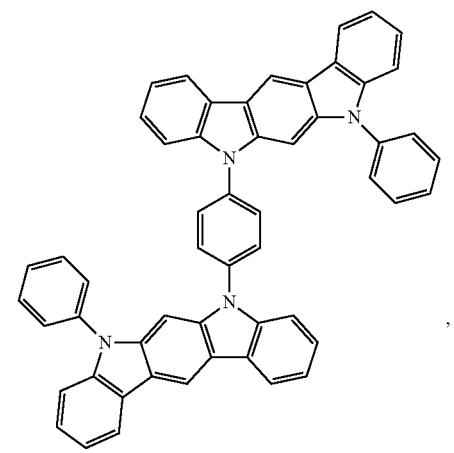
H250
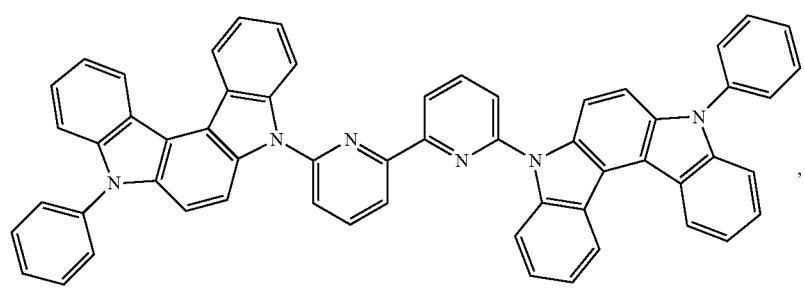
H251
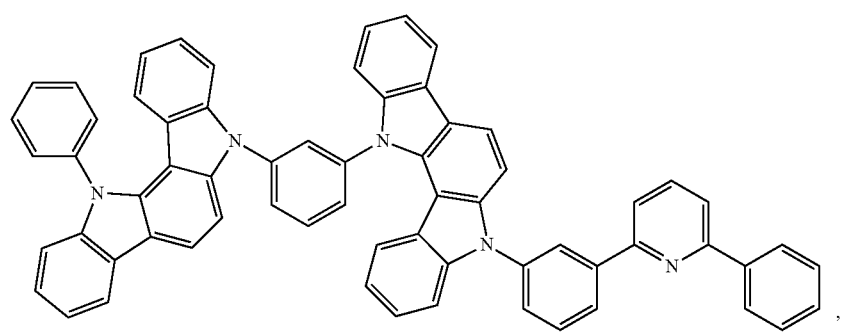

-continued

H252

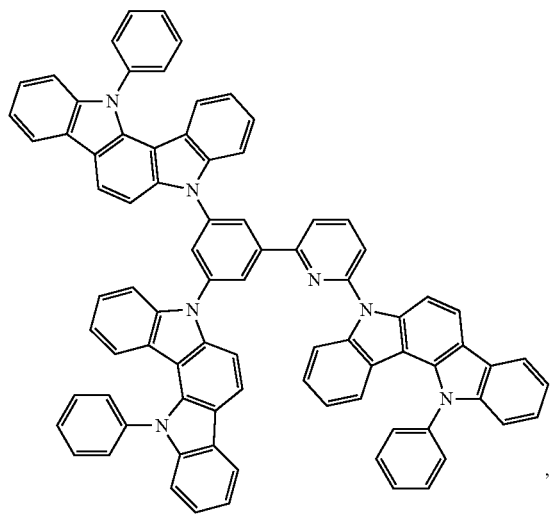

,

H253

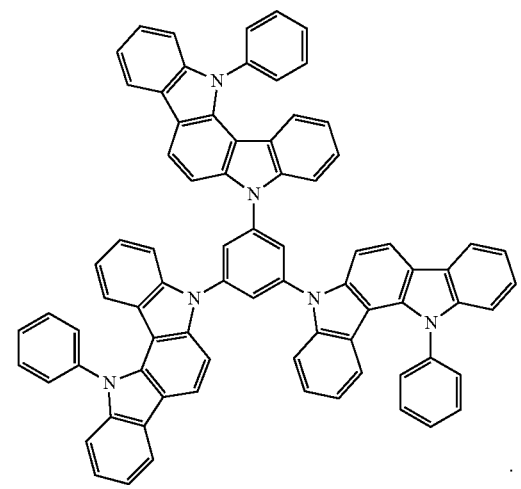

.

7. The first device of claim 1, wherein the first compound has the formula:

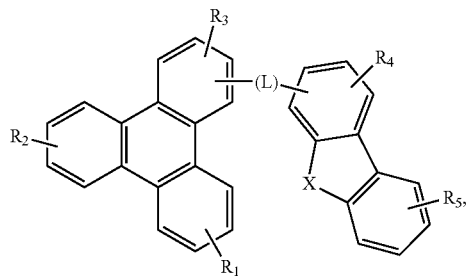

wherein X is S or O;
wherein each of $R_1$, $R_2$, $R_3$, $R_4$, and $R_5$ may represent mono, di, tri, or tetra substitutions;
wherein $R_1$, $R_2$, $R_3$, $R_4$, and $R_5$ are independently selected from the group consisting of hydrogen, halogen, alkyl, alkoxy, amino, alkenyl, alkynyl, aryl and heteroaryl;
wherein L is selected from the group consisting of benzene, biphenyl, naphthalene, triphenylene, carbazole, and heteroaromatic analogs thereof; and
wherein the second compound has the formula:

 (2)

wherein
Y' is an m-valent aromatic hydrocarbon group of 6 to 40 carbon atoms or an m-valent aromatic heterocyclic group of 3 to 40 carbon atoms excluding a group having more than 5 condensed rings;
m denotes an integer of 1 or 2, and in the case of m=2, each Z may be the same or different;
Z is represented by formula (2a)

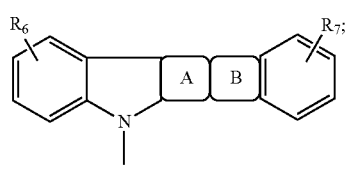 (2a)

wherein
ring A is an aromatic hydrocarbon ring represented by formula (2b)

 (2b)

ring B is a heterocyclic ring represented by formula (2c)

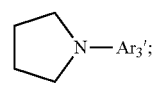 (2c)

ring A and B are respectively condensed with the adjacent rings;
$R_6$, $R_7$, and $R_8$ are independently selected from the group consisting of hydrogen, an aliphatic hydrocarbon group of 1 to 10 carbon atoms, an aromatic hydrocarbon group of 6 to 18 carbon atoms, and an aromatic heterocyclic group of 3 to 17 carbon atoms; and
$Ar_a'$ is an aromatic hydrocarbon group of 6 to 40 carbon atoms, or an aromatic heterocyclic group of 3 to 40 carbon atoms excluding a group having more than 5 condensed rings.

8. The first device of claim 7, wherein the set of non-hydrogen substituents selected for $R_1$, $R_2$, $R_3$, $R_4$, and $R_5$, and the set of non-hydrogen substituents selected for $R_6$, $R_7$, and $R_8$ are the same.

9. The first device of claim 1, wherein the first compound has the formula:

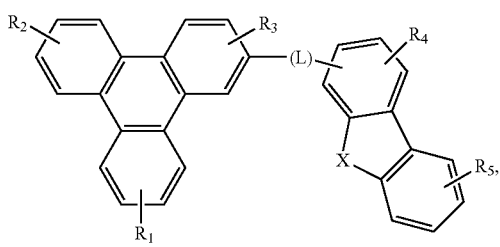

wherein X is S or O;
wherein each of $R_1$, $R_2$, $R_3$, $R_4$, $R_5$, and $R_6$ may represent mono, di, tri, or tetra substitutions;
wherein $R_1$, $R_2$, $R_3$, $R_4$, $R_5$, and $R_6$ are independently selected from the group consisting of hydrogen, halogen, alkyl, alkoxy, amino, alkenyl, alkynyl, aryl and heteroaryl; and
wherein the second compound has the formula:

  (3)

wherein
Y" is a monovalent aromatic heterocyclic group of 3 to 30 carbon atoms excluding a group having more than 5 condensed rings;
m denotes an integer of 1;
Z is a represented by formula (3a),

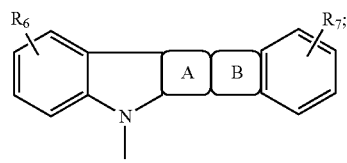  (3a)

wherein ring A is an aromatic hydrocarbon ring represented by formula 3b:

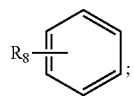  (3b)

ring B is a heterocyclic ring represented by formula (3c)

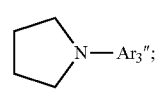  (3c)

ring A and B are respectively condensed with the adjacent rings;
$R_6$, $R_7$, and $R_8$ are independently selected from the group consisting of hydrogen, an aliphatic hydrocarbon group of 1 to 10 carbon atoms, an aromatic hydrocarbon group of 6 to 18 carbon atoms, and an aromatic heterocyclic group of 3 to 17 carbon atoms; and $Ar_a'$ is an aromatic hydrocarbon group of 6 to 30 carbon atoms, or an aromatic heterocyclic group of 3 to 30 carbon atoms excluding a group having more than 5 condensed rings.

10. The first device of claim 1, wherein the first compound is selected from the group consisting of:

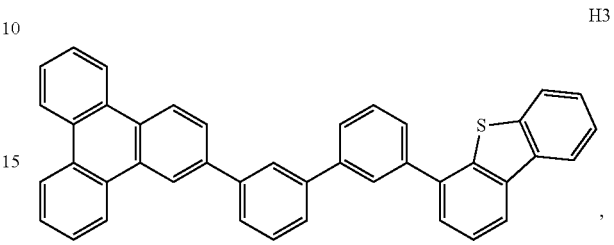

H3

,

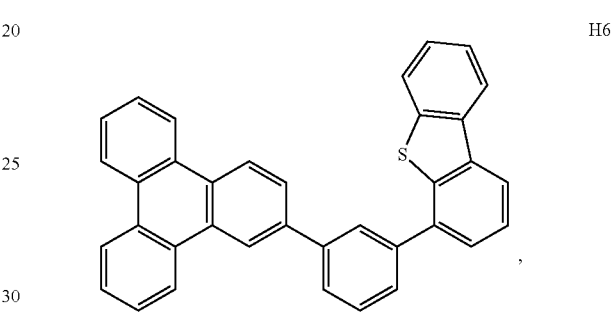

H6

,

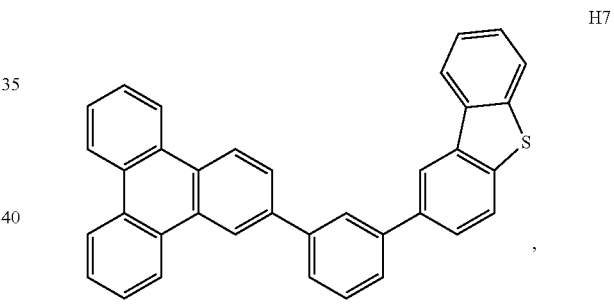

H7

,

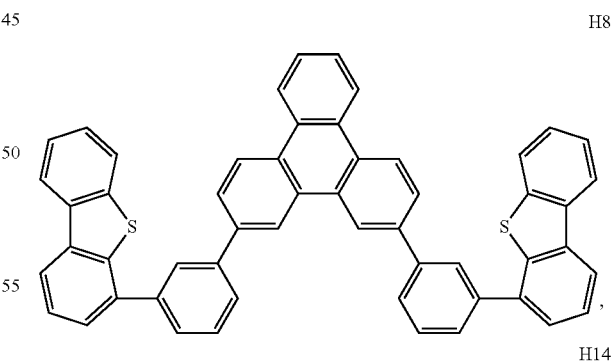

H8

,

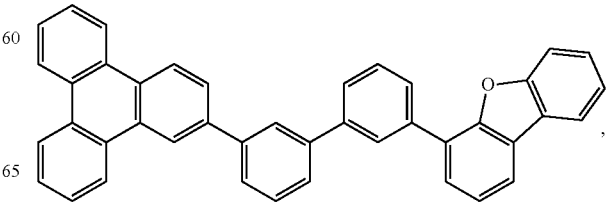

H14

,

H17 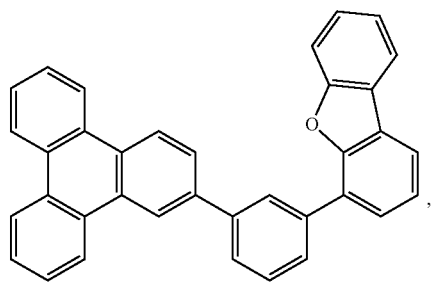
H18 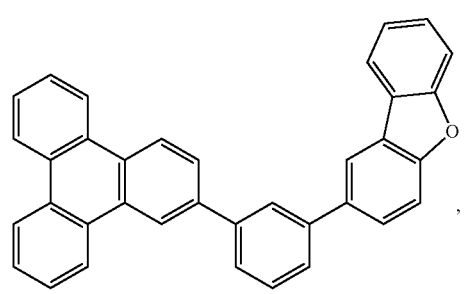
H19 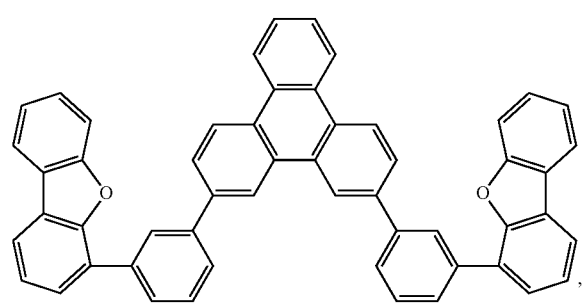
H24 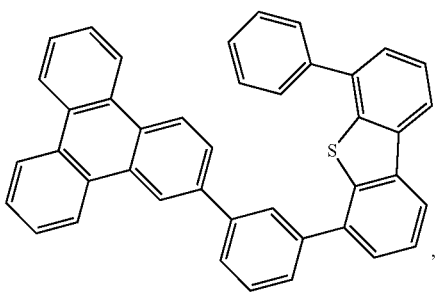
H26 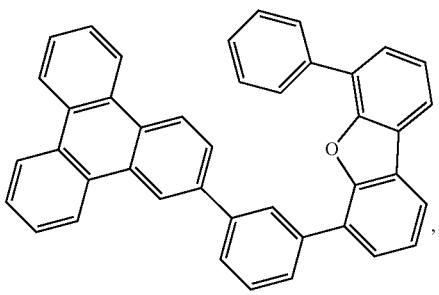
H27 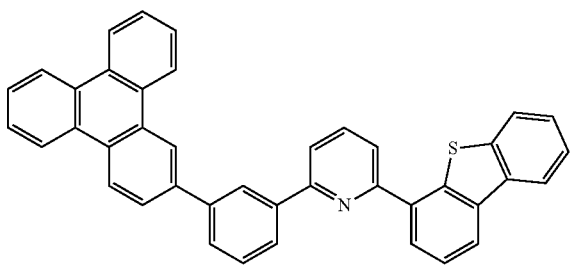
H28 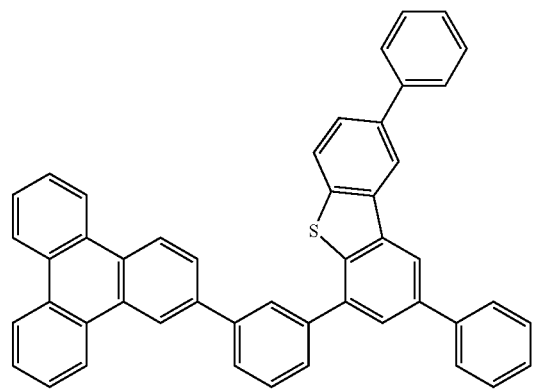
H29 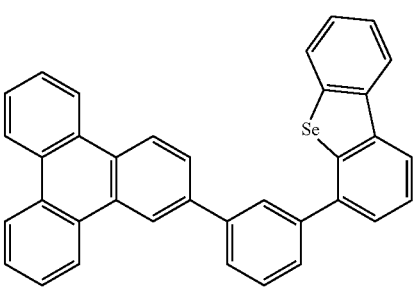
H31 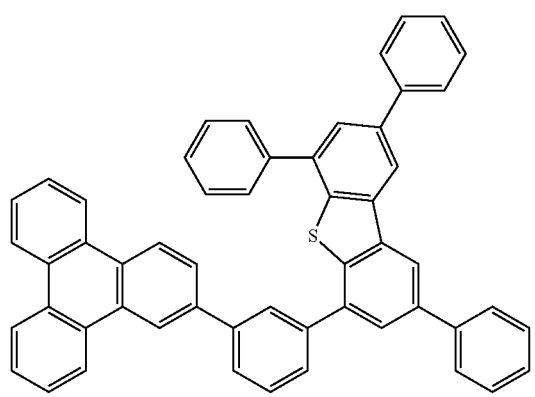

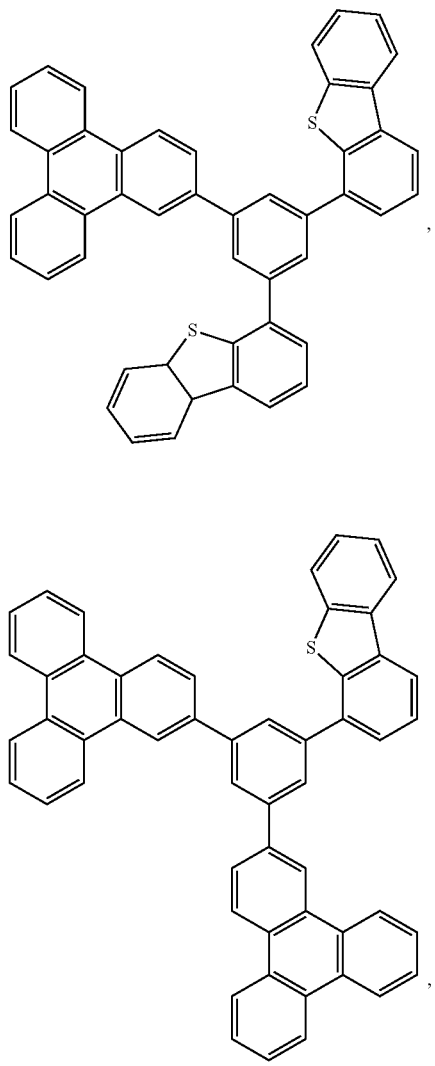
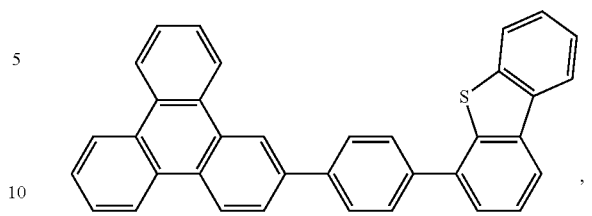
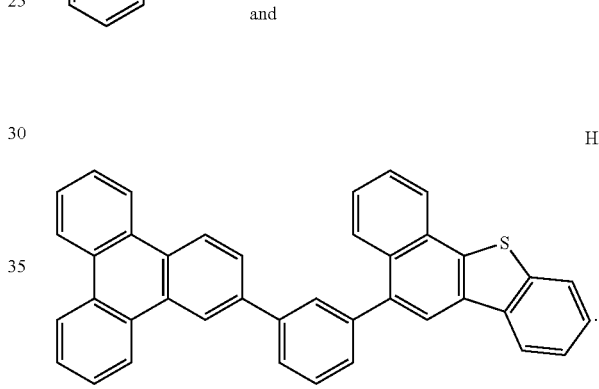
11. The first device of claim 10 wherein the second compound is selected from the group consisting of:
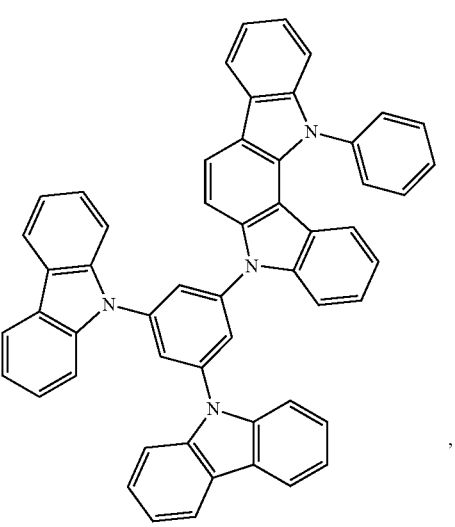
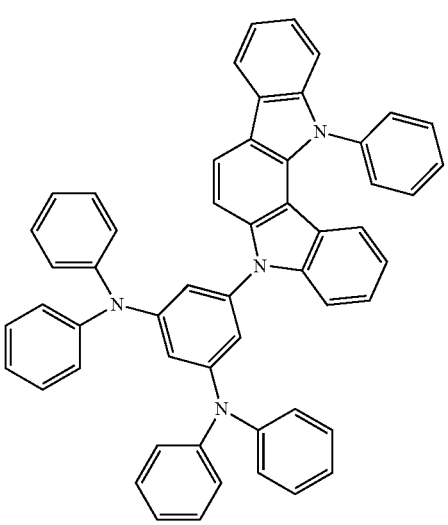

-continued
H203
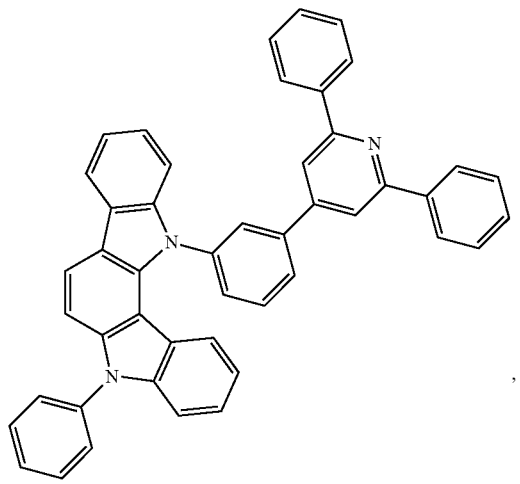
H204
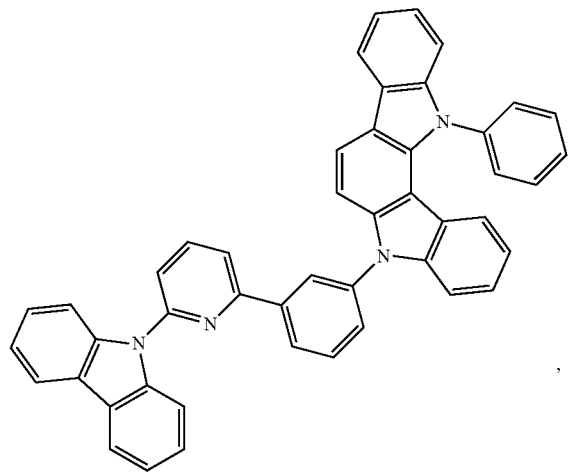
H205
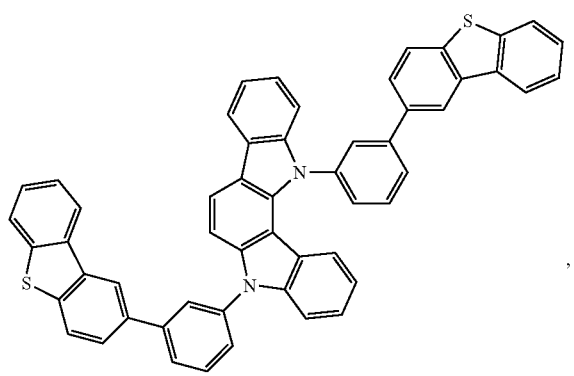
H206
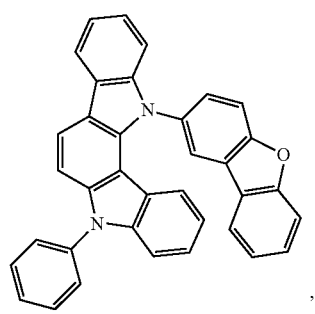
H207
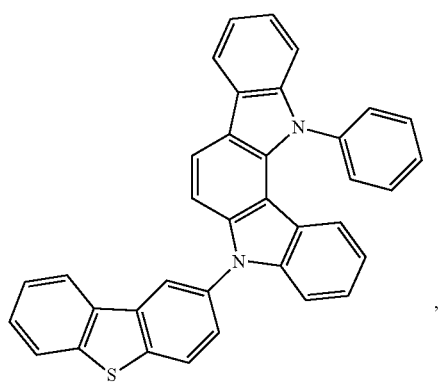
H208
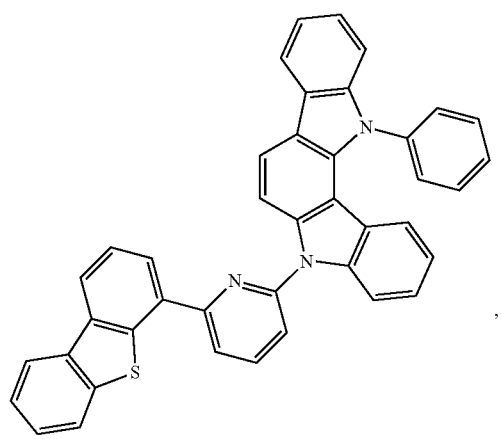

-continued
H209
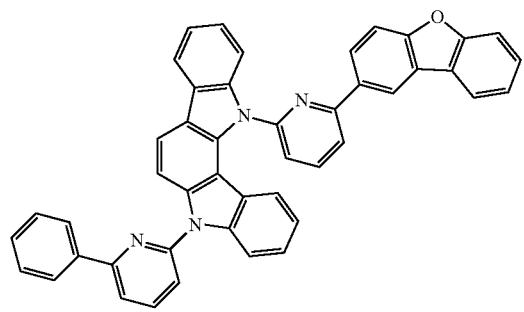
H210
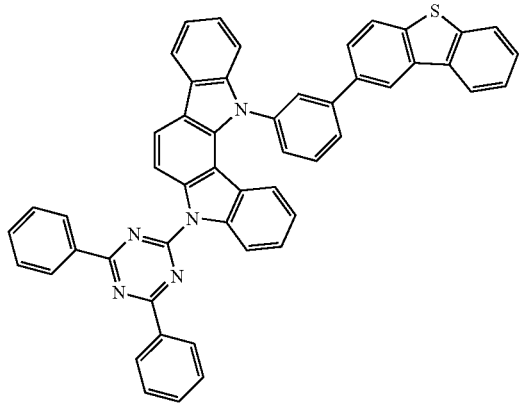
H211
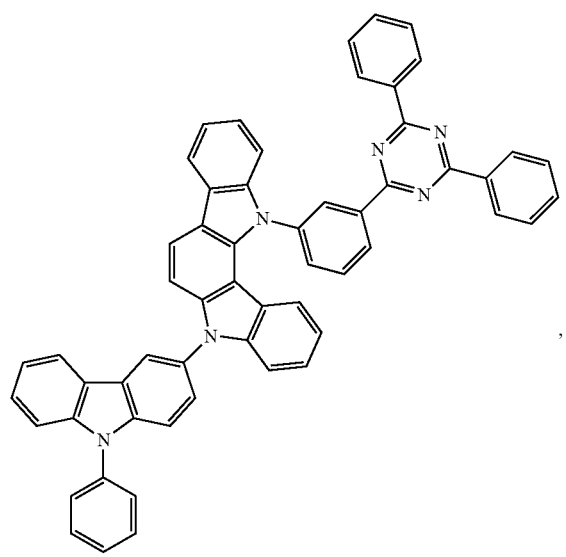
H212
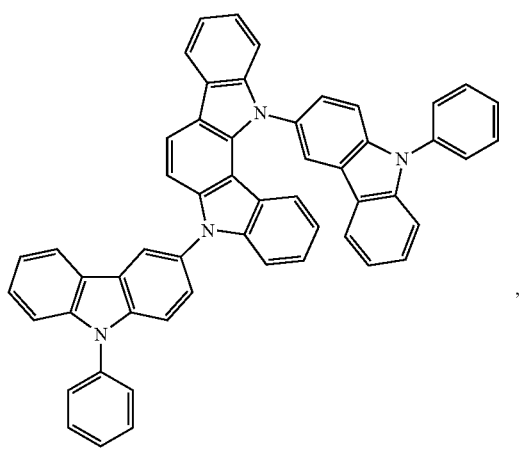
H213
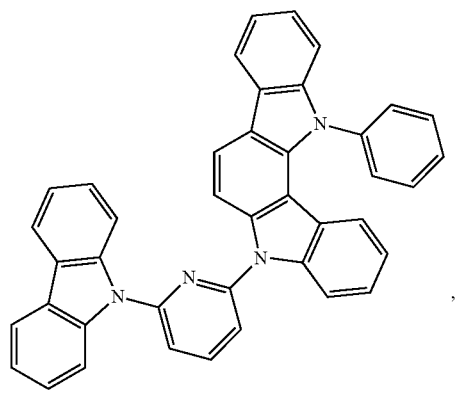
H214
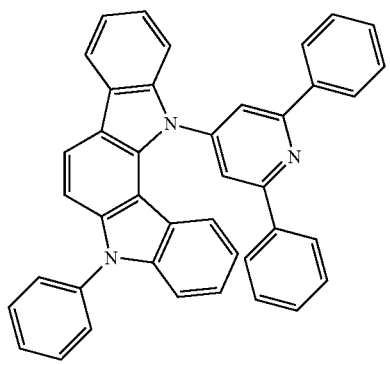

-continued
H215
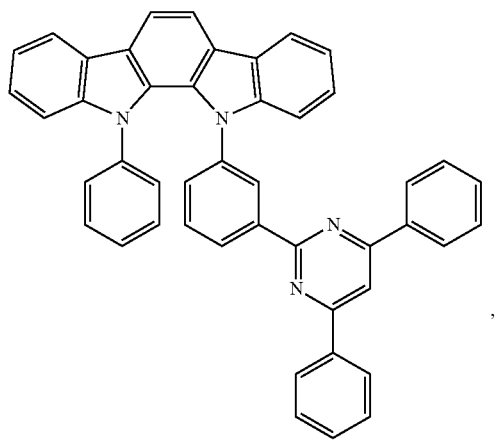
H216
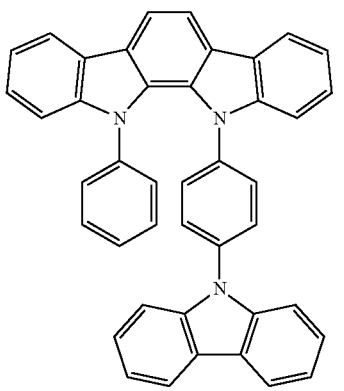
H217
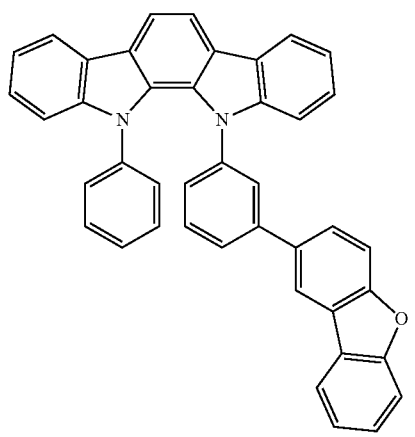
H218
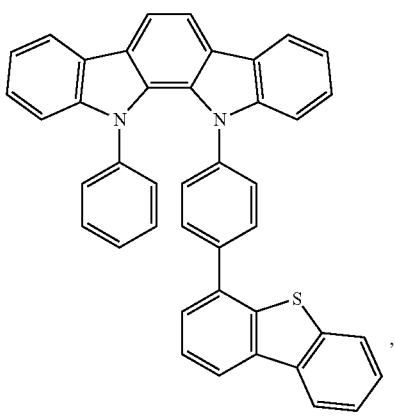
H219
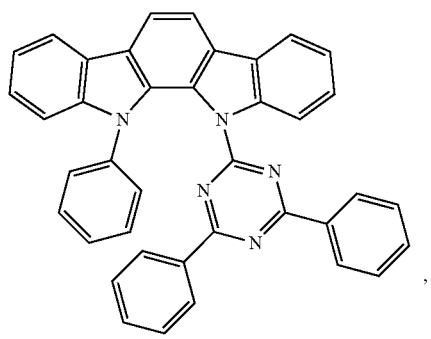
H220
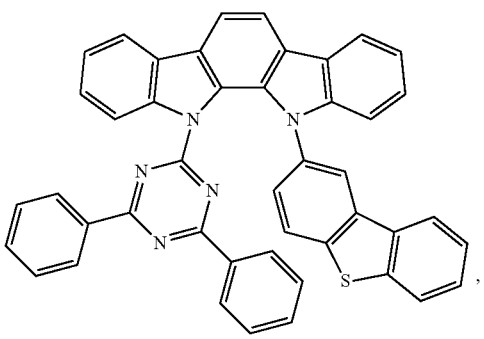
H221
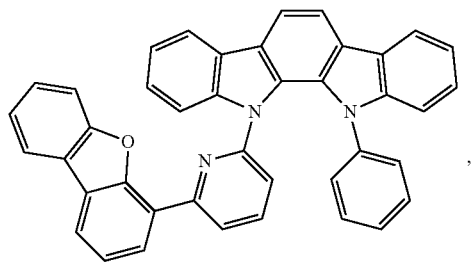
H222
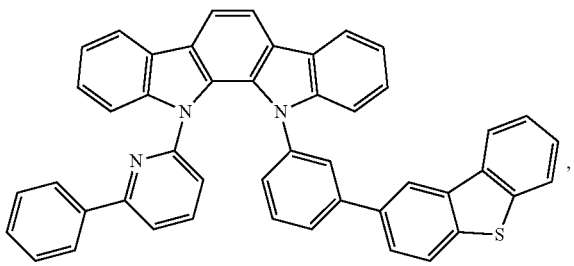

-continued
H223
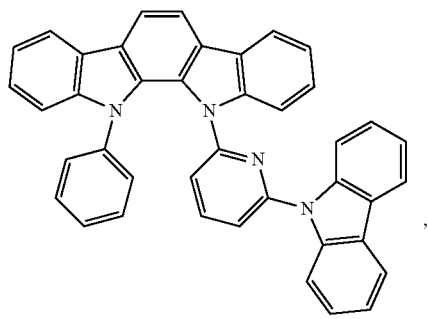
H224
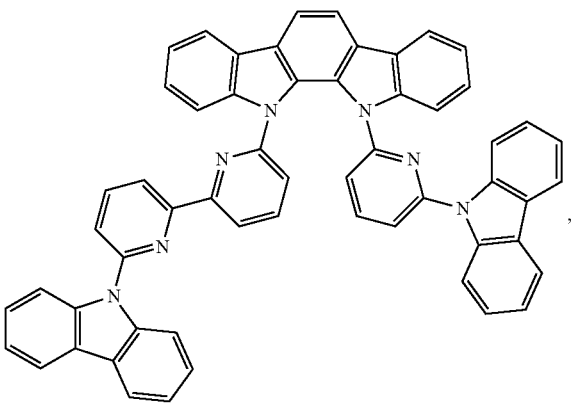
H225
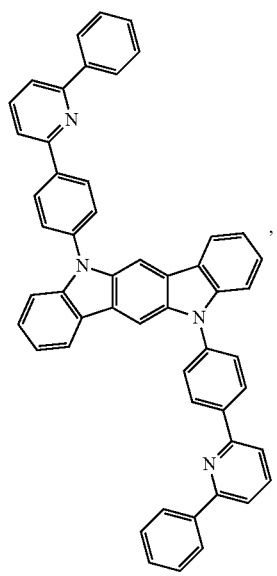
H226
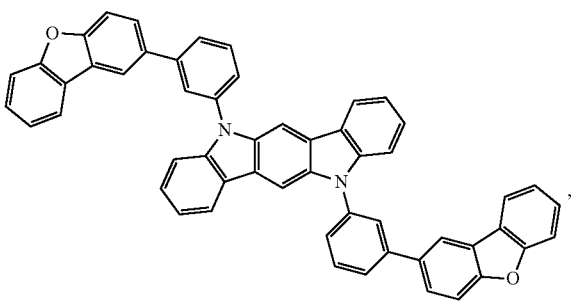
H227
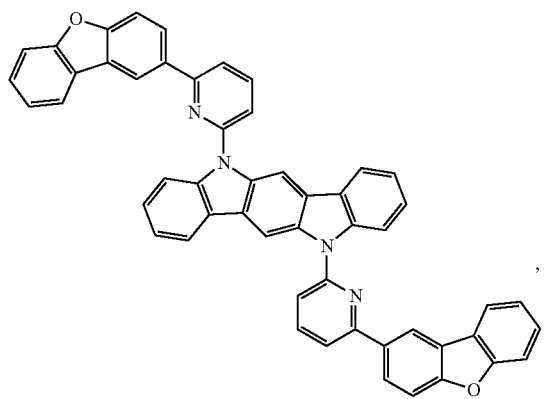
H228
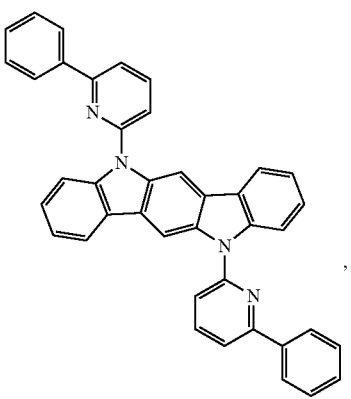

-continued
H229
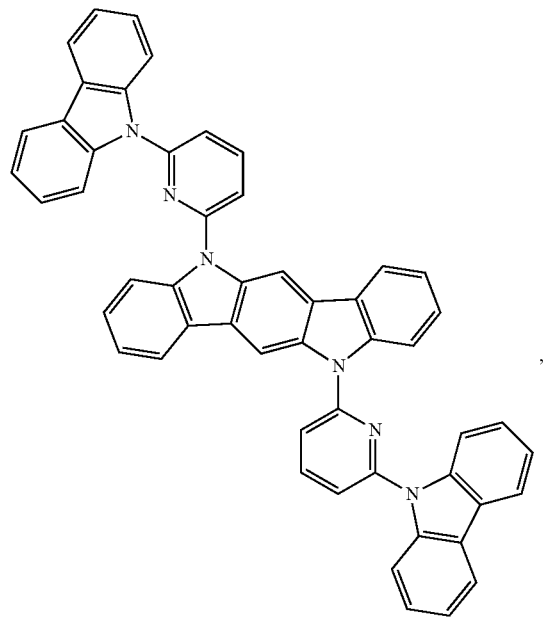
H230
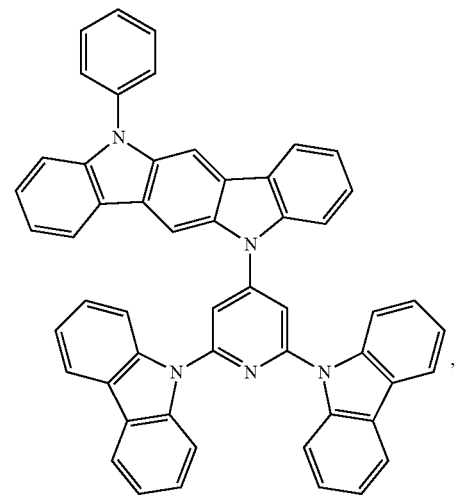
H231
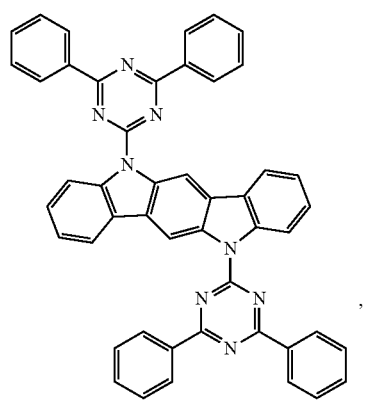
H232
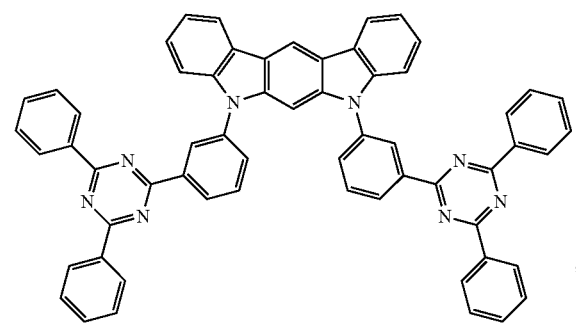
H233
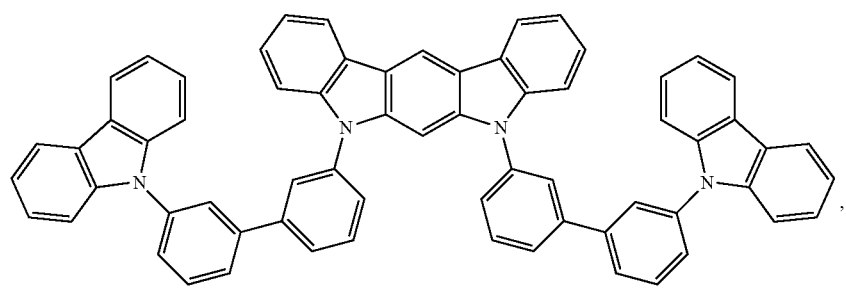

-continued
H234
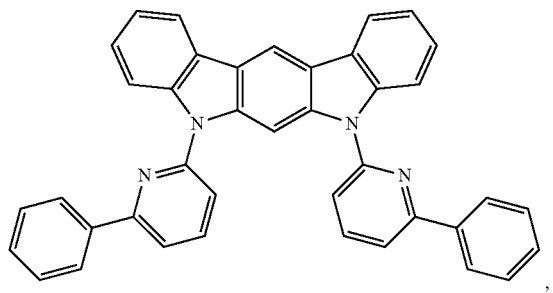
H235
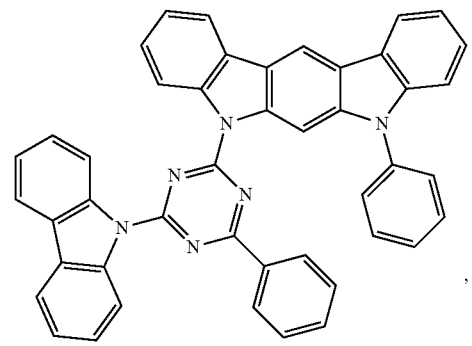
H236
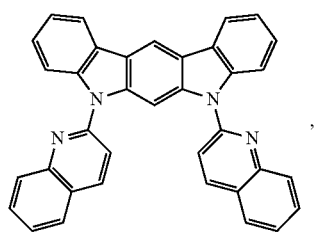
H237
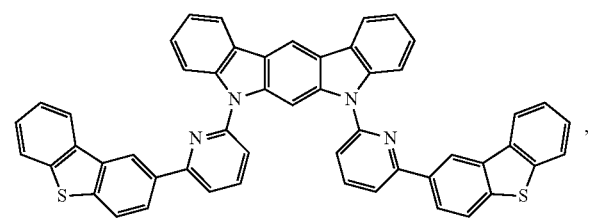
H238
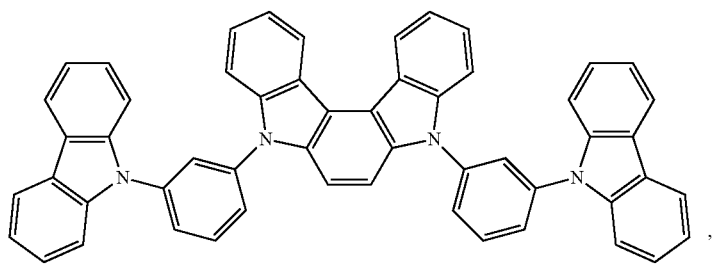
H239
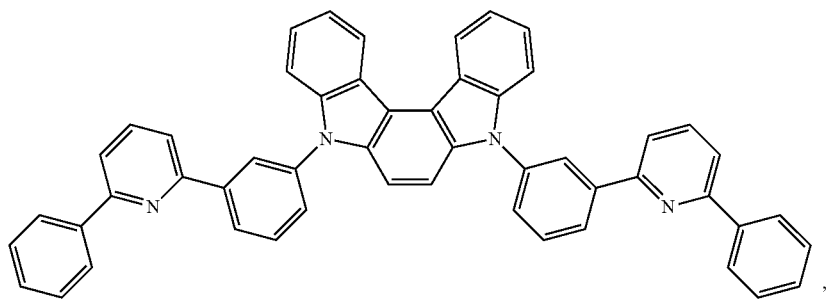
H240
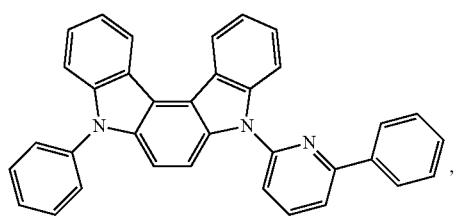
H241
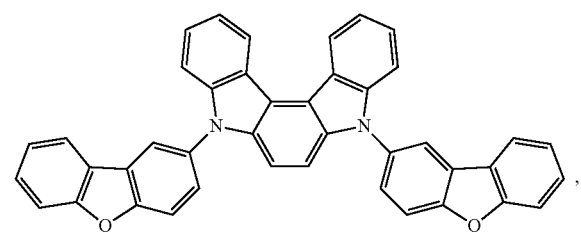

-continued
H242
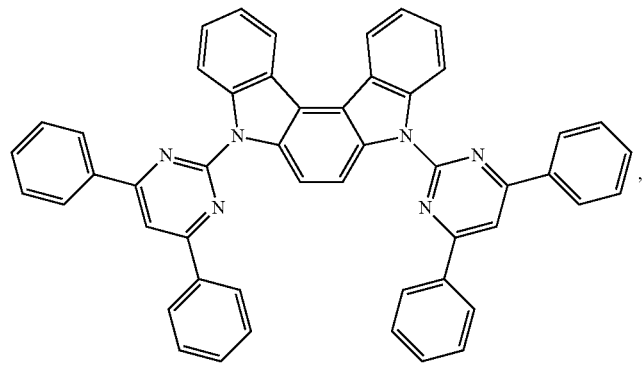
H243
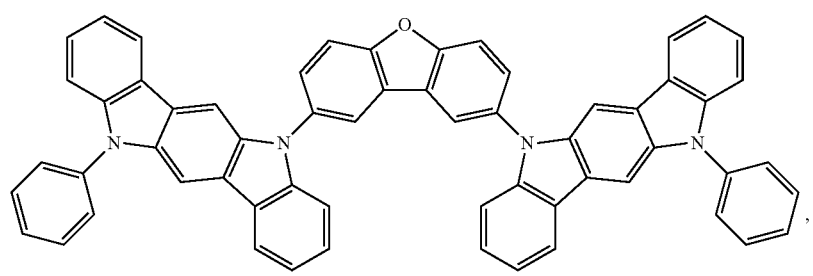
H244
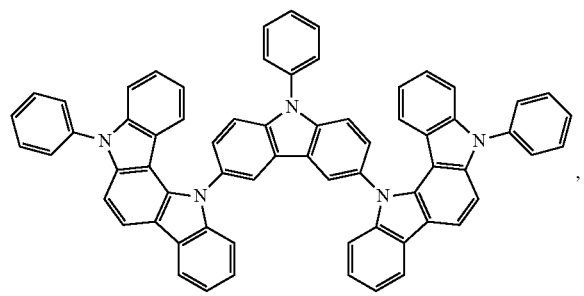
H245
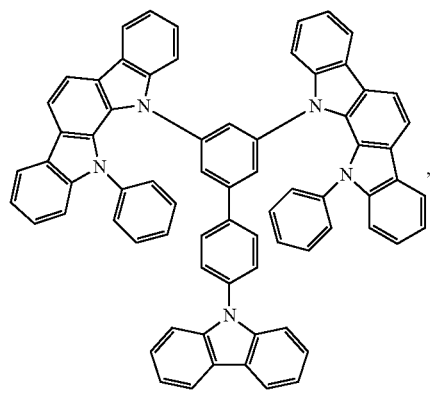
H246
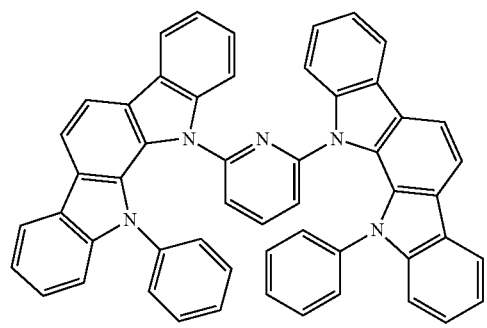
H247
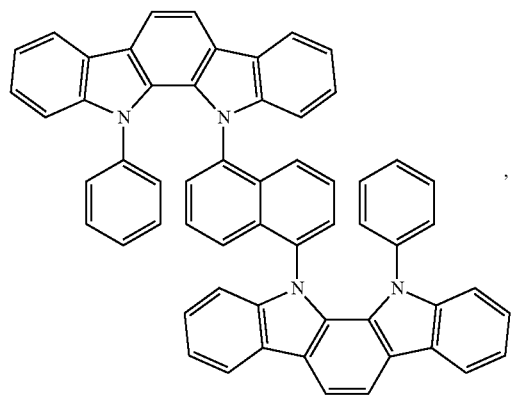

-continued
H248
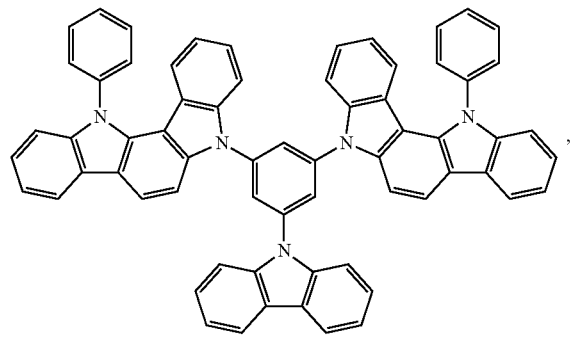
H249
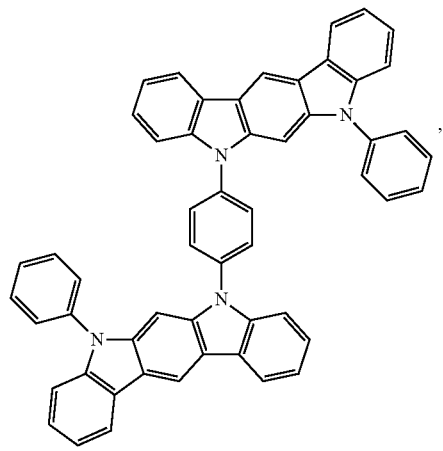
H250
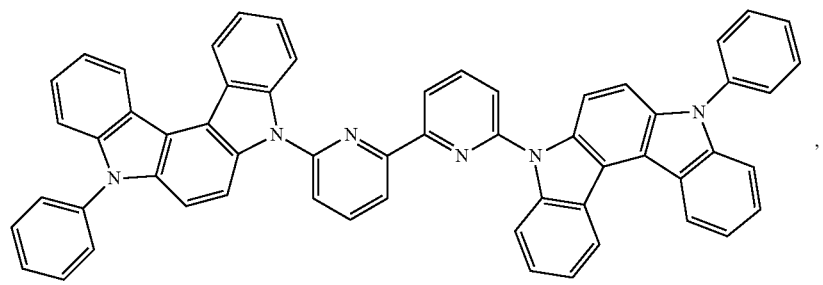
H251
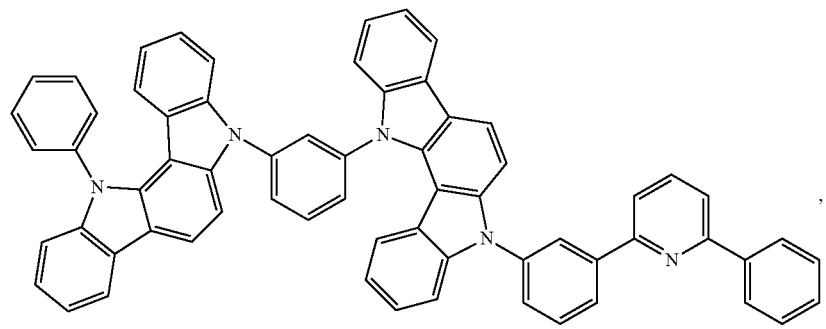
H252
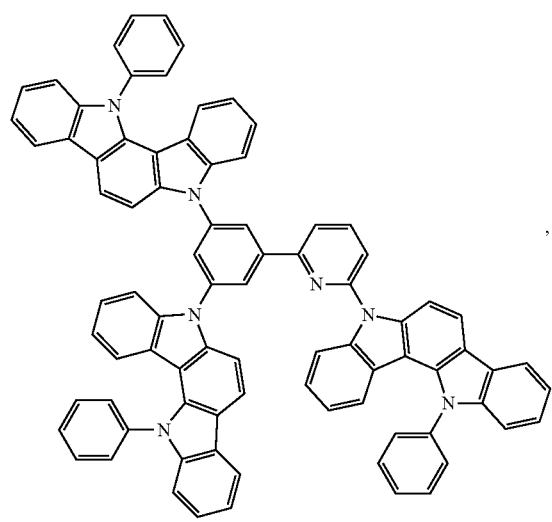
H253
and
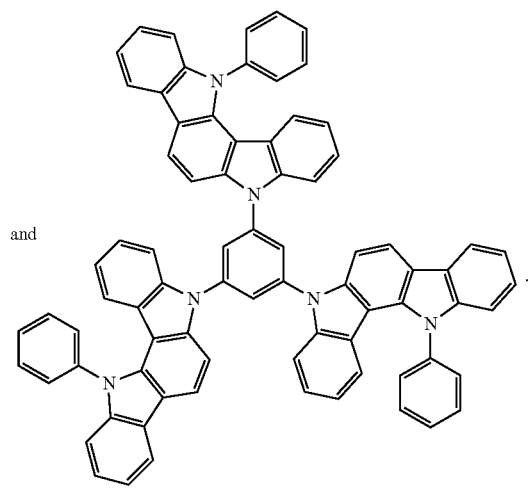

12. The first device of claim 1, wherein the first organic layer is an emissive layer and the first compound and the second compound are hosts, and wherein the emissive layer further comprises an emissive phosphorescent dopant.
13. The first device of claim 1, wherein the emissive phosphorescent dopant is selected from the group consisting of:
D1
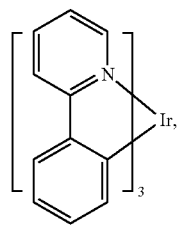
D2
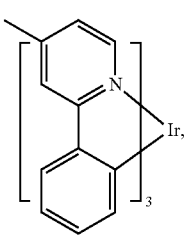
D3
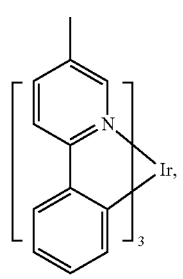
D4
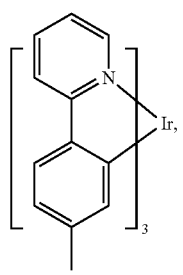
D5
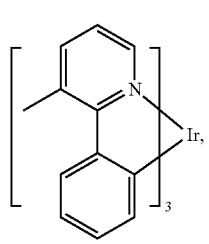
-continued
D6
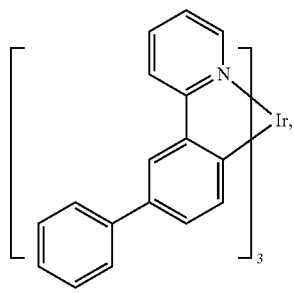
D7
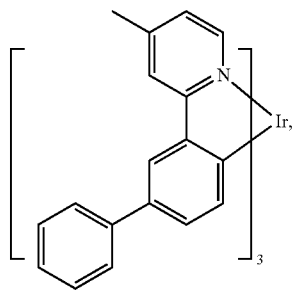
D8
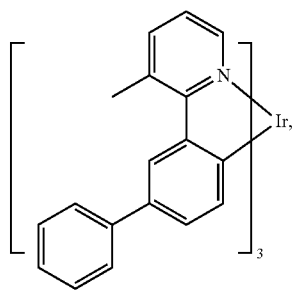
D9
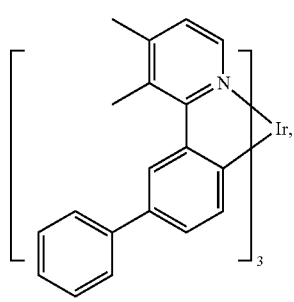
D10
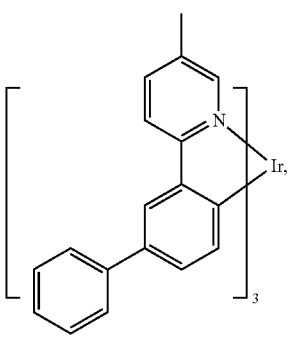

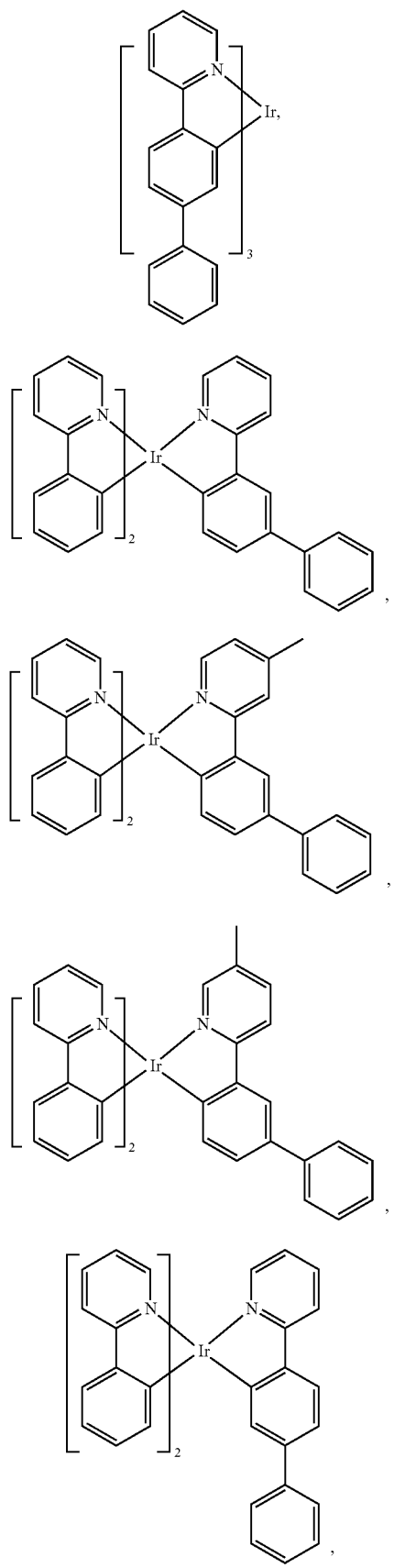

D20 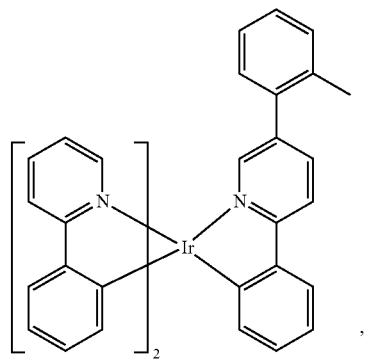
D21 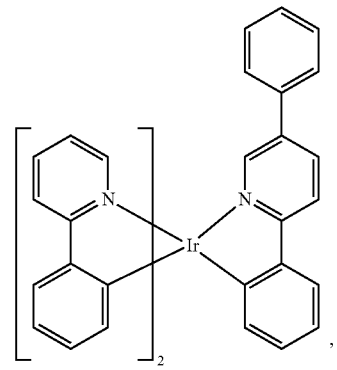
D22 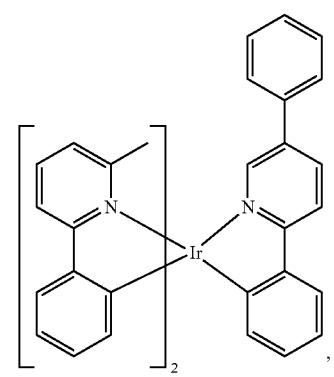
D23 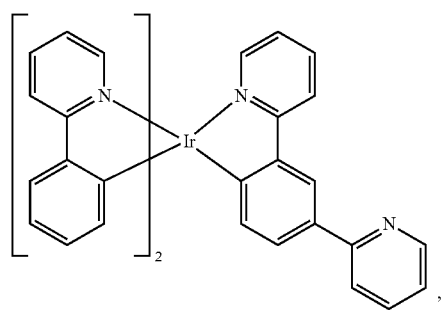
D24 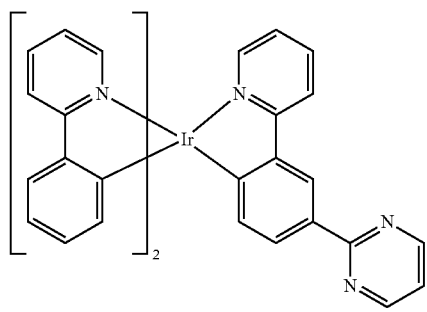
D25 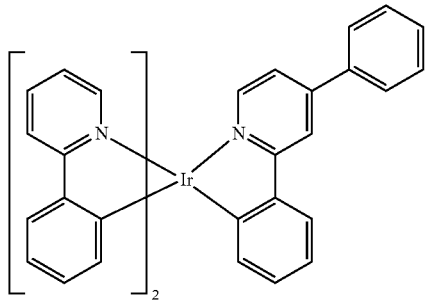
D26 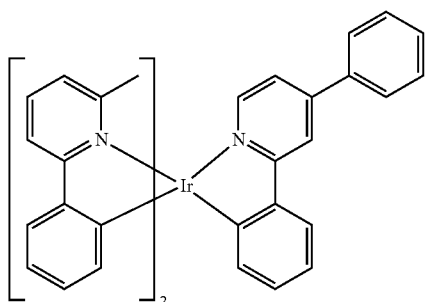
D27 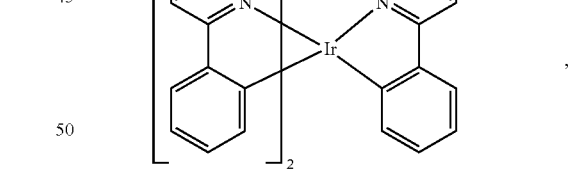
D28 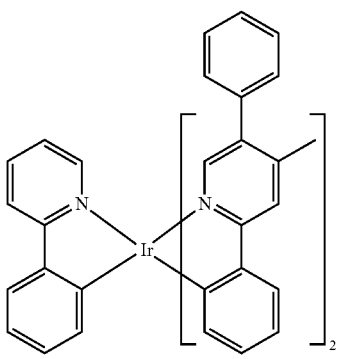

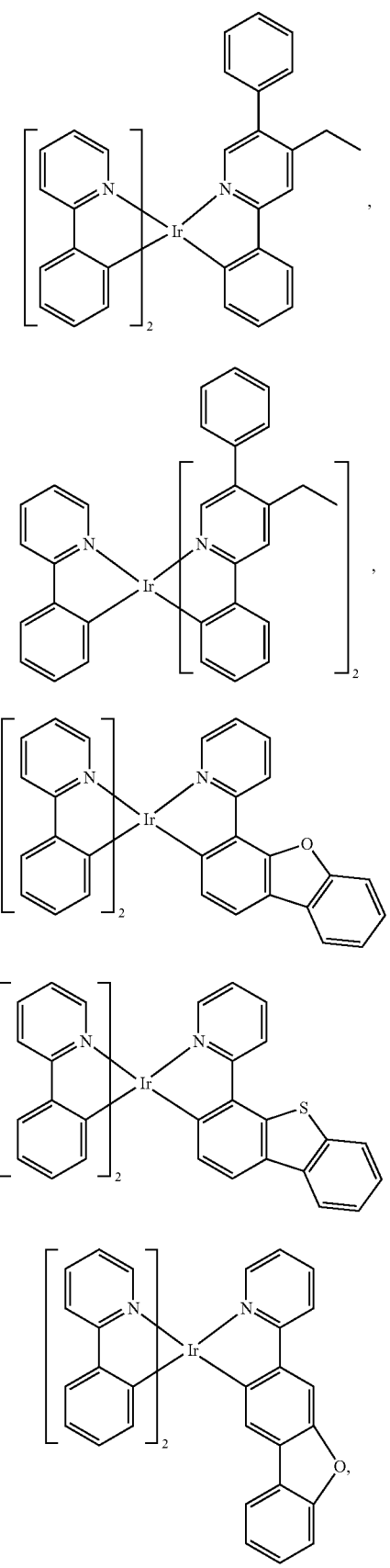

-continued

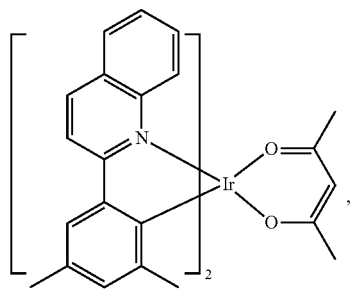
D40

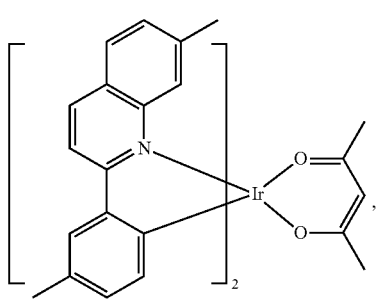
D41

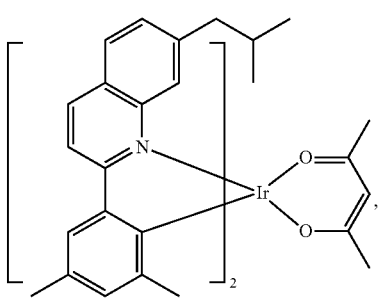
D42

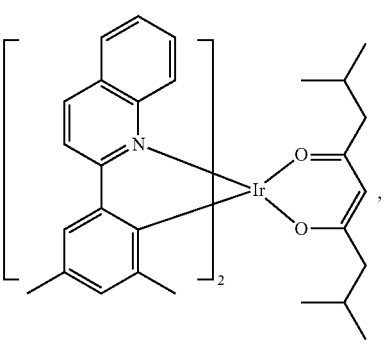
D43

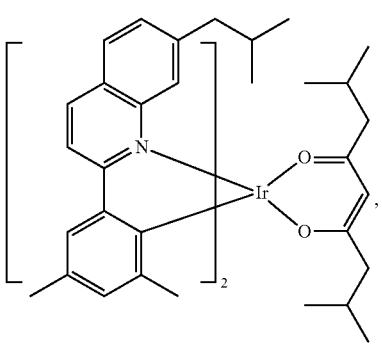
D44

-continued

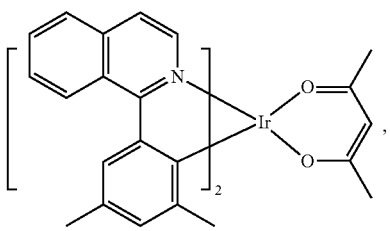
D45

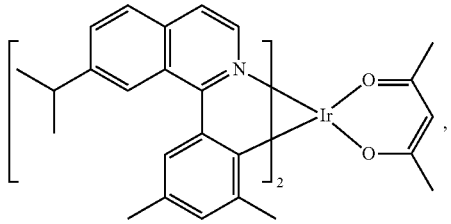
D46 and

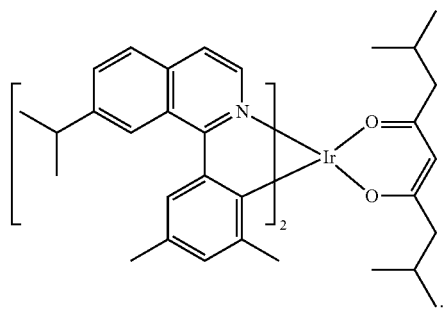
D47

14. The first device of claim 1, wherein the first electrode is an anode and the first organic layer is deposited over the anode.

15. The first device of claim 1, wherein the device further comprises a second organic layer different from the first organic layer, and the first organic layer is a non-emissive layer.

16. The first device of claim 15, wherein the first organic layer is a blocking layer.

17. The first device of claim 1, wherein the first compound has an evaporation temperature and the second compound has an evaporation temperature, wherein the evaporation temperature of the first compound is within 30° C. of the evaporation temperature of the second compound.

18. A method of fabricating an organic light emitting device comprising a first electrode, a second electrode, and a first organic layer disposed between the first electrode and the second electrode, wherein the first organic layer comprises an organic composition further comprising a first compound and a second compound, the method comprising:

providing a substrate having the first electrode disposed thereon;

depositing the organic composition over the first electrode; and depositing the second electrode over the first organic layer, wherein the first compound has the formula:

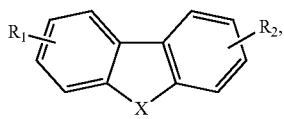

wherein X is S or O;
wherein $R_1$ and $R_2$ are substituents independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C\equiv CHC_nH_{2n+1}$, $Ar_1$, $Ar_1-Ar_2$, $C_nH_{2n}-Ar_1$, and no substitution;
wherein n is 1, 2, 3, 4, 5, 6, 7, 8, 9, or 10;
wherein $Ar_1$ and $Ar_2$ are independently selected from the group consisting of benzene, biphenyl, naphthalene, triphenylene, carbazole, and heteroaromatic analogs thereof; and
wherein at least one of $R_1$ and $R_2$ includes a triphenylene group; and
wherein the second compound has the formula (1)

 (1)

wherein
Y is an m-valent aromatic hydrocarbon group of 6 to 50 carbon atoms or an m-valent aromatic heterocyclic group of 3 to 50 carbon atoms excluding a group having more than 5 condensed rings;
m denotes an integer of 1 to 3, such that when m is greater than 2, each Z may be the same or different;
Z is represented by formula (1a):

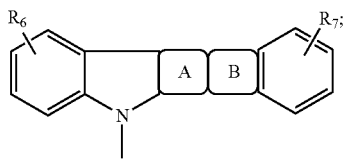 (1a)

wherein
ring A is an aromatic hydrocarbon ring represented by formula (1b)

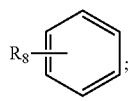 (1b)

ring B is a heterocyclic ring represented by formula (1c)

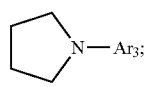 (1c)

ring A and ring B are respectively condensed with the adjacent rings;

$R_6$, $R_7$, and $R_8$ are each independently selected from the group consisting of hydrogen, an aliphatic hydrocarbon group of 1 to 10 carbon atoms, an aromatic hydrocarbon group of 6 to 18 carbon atoms, and an aromatic heterocyclic group of 3 to 17 carbon atoms; and,
$Ar_3$ is an aromatic hydrocarbon group of 6 to 50 carbon atoms, or an aromatic heterocyclic group of 3 to 50 carbon atoms excluding a group having more than 5 condensed rings.

19. A host composition comprising a mixture of a first compound and a second compound, wherein the first compound has the formula:

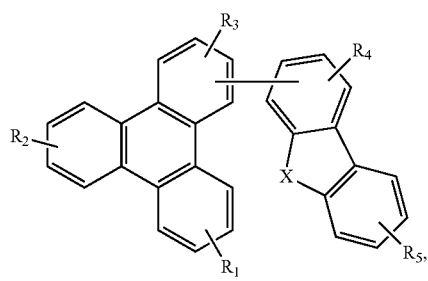

wherein X is S or O;
wherein each of $R_1$, $R_2$, $R_3$, $R_4$, and $R_5$ may represent mono, di, tri, or tetra substitutions;
wherein $R_1$, $R_2$, $R_3$, $R_4$, and $R_5$ are independently selected from the group consisting of hydrogen, halogen, alkyl, alkoxy, amino, alkenyl, alkynyl, aryl and heteroaryl; and
wherein the second compound has the formula (2):

 (2)

wherein
Y' is an m-valent aromatic hydrocarbon group of 6 to 40 carbon atoms or an m-valent aromatic heterocyclic group of 3 to 40 carbon atoms excluding a group having more than 5 condensed rings;
m denotes an integer of 1 or 2, and when m=2, each Z may be the same or different;
Z is represented by formula (2a):

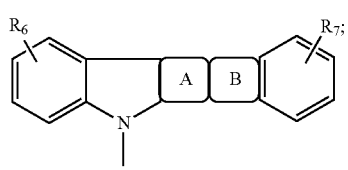 (2a)

wherein ring A is an aromatic hydrocarbon ring represented by formula (2b),

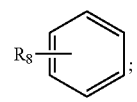 (2b)

ring B is a heterocyclic ring represented by formula (2c),

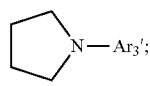
(2c)

ring A and ring B are respectively condensed with the adjacent rings;

$R_6$, $R_7$, and $R_8$ are independently selected from the group consisting of hydrogen, an aliphatic hydrocarbon group of 1 to 10 carbon atoms, an aromatic hydrocarbon group of 6 to 18 carbon atoms, and an aromatic heterocyclic group of 3 to 17 carbon atoms; and $Ar_a'$ is an aromatic hydrocarbon group of 6 to 40 carbon atoms, or an aromatic heterocyclic group of 3 to 40 carbon atoms excluding a group having more than 5 condensed rings.

20. A host composition comprising a mixture of a first compound and a second compound, wherein the first compound has the formula:

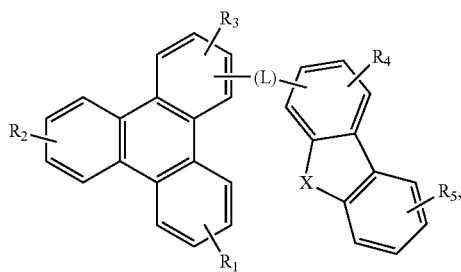

wherein X is S or O;

wherein each of $R_1$, $R_2$, $R_3$, $R_4$, and $R_5$ may represent mono, di, tri, or tetra substitutions;

wherein $R_1$, $R_2$, $R_3$, $R_4$, and $R_5$ are independently selected from the group consisting of hydrogen, halogen, alkyl, alkoxy, amino, alkenyl, alkynyl, aryl and heteroaryl;

wherein L is selected from the group consisting of benzene, biphenyl, naphthalene, triphenylene, carbazole, and heteroaromatic analogs thereof; and wherein the second compound has the formula:

$$(Z)_m\text{—}Y'; \quad (2)$$

wherein

Y' is an m-valent aromatic hydrocarbon group of 6 to 40 carbon atoms or an m-valent aromatic heterocyclic group of 3 to 40 carbon atoms excluding a group having more than 5 condensed rings;

m denotes an integer of 1 or 2, and when m=2, each Z may be the same or different;

Z is represented by formula (2a):

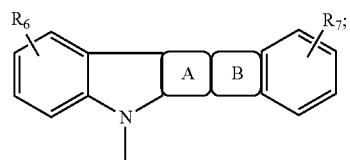
(2a)

wherein ring A is an aromatic hydrocarbon ring represented by formula (2b),

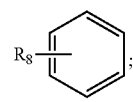
(2b)

ring B is an heterocyclic ring represented by formula (2c),

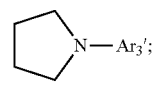
(2c)

ring A and ring B are respectively condensed with the adjacent rings;

$R_6$, $R_7$, and $R_8$ are independently selected from the group consisting of hydrogen, an aliphatic hydrocarbon group of 1 to 10 carbon atoms, an aromatic hydrocarbon group of 6 to 18 carbon atoms, and an aromatic heterocyclic group of 3 to 17 carbon atoms; and $Ar_a'$ is an aromatic hydrocarbon group of 6 to 40 carbon atoms, or an aromatic heterocyclic group of 3 to 40 carbon atoms excluding a group having more than 5 condensed rings.

* * * * *

UNITED STATES PATENT AND TRADEMARK OFFICE
CERTIFICATE OF CORRECTION

PATENT NO.        : 9,040,962 B2                                    Page 1 of 3
APPLICATION NO.   : 13/640000
DATED             : May 26, 2015
INVENTOR(S)       : Vadim Adamovich et al.

It is certified that error appears in the above-identified patent and that said Letters Patent is hereby corrected as shown below:

In the Specification:
In Column 3, line 66 delete "Ara" and insert -- $Ar_3$ --.

In the Claims:
In Column 119, line 57 delete "$Ar_a$'" and insert -- $Ar_3'$ --.

In Column 120, line 64 delete "$Ar_a$'" and insert -- $Ar_3''$ --.

In Column 138, delete " 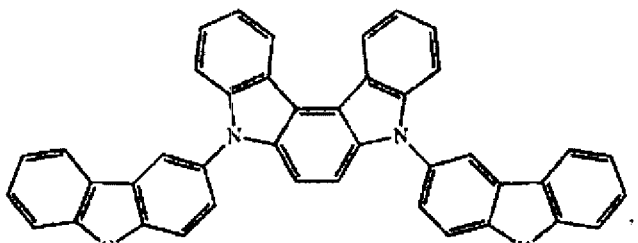 "

and insert -- 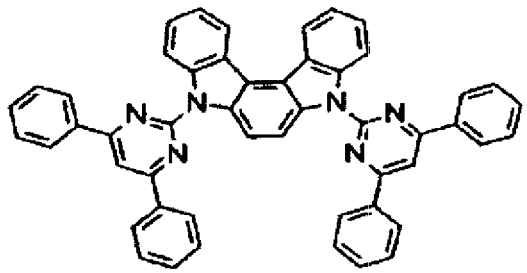 --.

Signed and Sealed this
Sixteenth Day of August, 2016

Michelle K. Lee
*Director of the United States Patent and Trademark Office*

CERTIFICATE OF CORRECTION (continued)
U.S. Pat. No. 9,040,962 B2

In the Claims:
In Columns 137 & 138, delete " 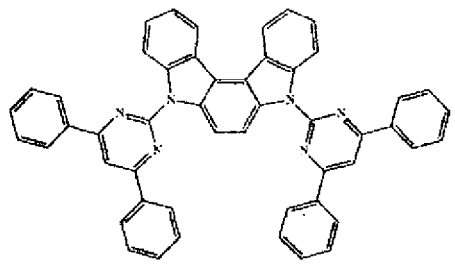 H242 and insert -- 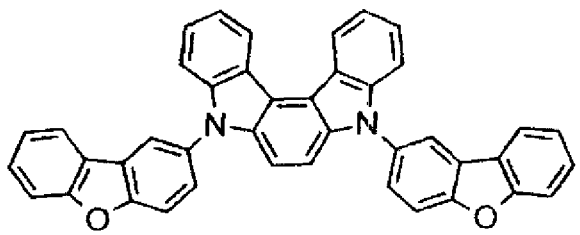 H242, --.

In Column 142, line 55 delete "Ar$_a$'" and insert -- Ar$_3$' --.

In Column 144, line 1 delete "Ar$_a$''" and insert -- Ar$_3$'' --.

In Column 160, delete " 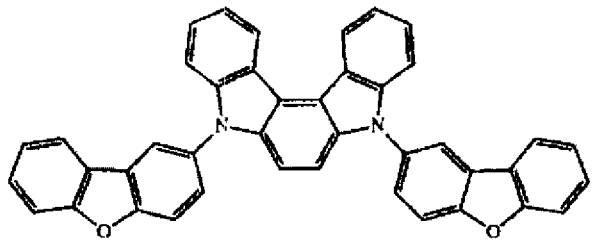 H241 "

and insert -- 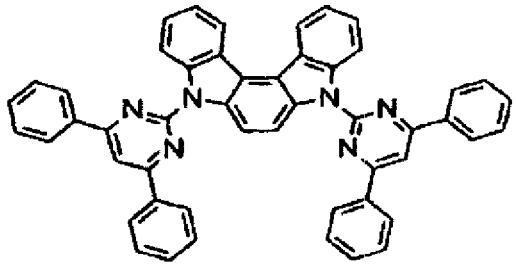 H241 --.

CERTIFICATE OF CORRECTION (continued)
U.S. Pat. No. 9,040,962 B2

In the Claims:
In Columns 161 & 162, delete " 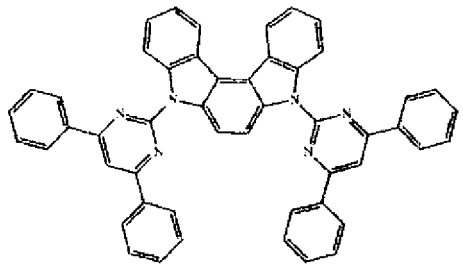 "

and insert -- 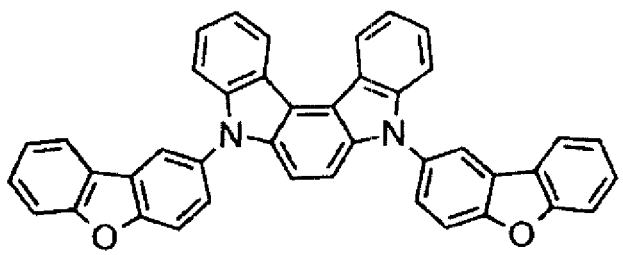 H242, --.

In Column 162, delete " 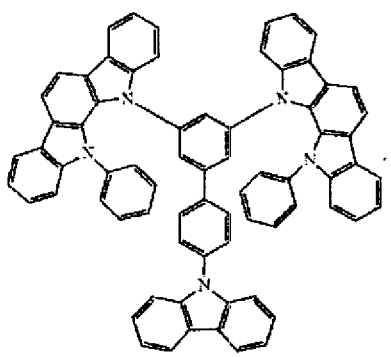 "

and insert -- 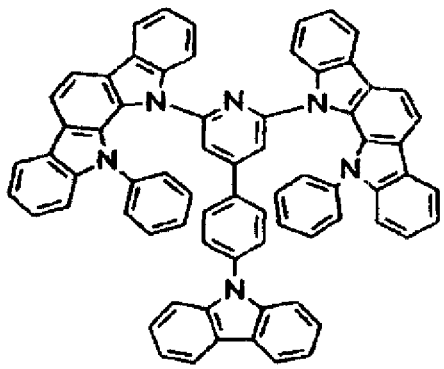 H245 --.

In Column 178, line 46 delete "$Ar_a'$" and insert -- $Ar_3'$ --.